(12) United States Patent
Papallo, Jr. et al.

(10) Patent No.: US 6,629,044 B1
(45) Date of Patent: Sep. 30, 2003

(54) ELECTRICAL DISTRIBUTION ANALYSIS METHOD AND APPARATUS

(75) Inventors: Thomas F. Papallo, Jr., Farmington, CT (US); Sriram Ramakrishnan, Clifton Park, NY (US); Ahmed Elasser, Latham, NY (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/528,140

(22) Filed: Mar. 17, 2000

(51) Int. Cl.[7] .............................................. G06F 19/00
(52) U.S. Cl. ........................ 702/60; 324/424; 703/18; 700/97
(58) Field of Search ............................. 702/57, 58, 59, 702/60, 79, 103; 703/3, 6, 10, 18; 324/424

(56) References Cited

U.S. PATENT DOCUMENTS

| | | | |
|---|---|---|---|
| 4,245,318 A | 1/1981 | Eckart et al. ................. 702/67 |
| 4,733,032 A | 3/1988 | Pardini ........................ 218/150 |
| 4,868,770 A | 9/1989 | Smith et al. ................... 703/14 |
| 4,885,706 A * | 12/1989 | Pate et al. ..................... 703/10 |
| 5,046,024 A | 9/1991 | Smith et al. ................... 345/440 |
| 5,092,780 A | 3/1992 | Vlach ........................ 434/433 |
| 5,168,261 A | 12/1992 | Weeks ........................ 340/515 |
| 5,199,103 A | 3/1993 | Smith et al. ................... 345/440 |
| 5,548,539 A | 8/1996 | Vlach et al. .................... 703/6 |
| 5,549,539 A | 8/1996 | Rautenberg ................. 493/402 |
| 5,619,433 A * | 4/1997 | Wang et al. ................... 703/18 |
| 5,619,435 A * | 4/1997 | Prakash et al. ................. 703/3 |
| 5,644,238 A * | 7/1997 | Seifert et al. ................ 324/424 |
| 5,872,722 A | 2/1999 | Oravetz et al. ............. 700/292 |
| 5,946,210 A * | 8/1999 | Montminy et al. ........... 700/97 |
| 5,946,474 A | 8/1999 | Skogby ........................ 703/13 |
| 5,960,188 A * | 9/1999 | Linke et al. ................... 703/14 |
| 5,963,724 A | 10/1999 | Mantooth et al. .............. 703/14 |
| 5,966,312 A * | 10/1999 | Chen ............................ 703/6 |
| 6,087,913 A | 7/2000 | Castonguay et al. .......... 335/16 |
| 6,114,641 A | 9/2000 | Castonguay et al. ........ 200/244 |
| 6,166,344 A | 12/2000 | Castonguay et al. ........ 200/401 |
| 6,172,584 B1 | 1/2001 | Castonguay et al. ........ 335/172 |
| 6,175,288 B1 | 1/2001 | Castonguay et al. .......... 335/16 |
| 6,211,757 B1 | 4/2001 | Castonguay et al. ........... 335/6 |
| 6,211,758 B1 | 4/2001 | Castonguay et al. ........ 335/202 |
| 6,320,274 B1 * | 11/2001 | Goetze et al. ................ 307/9.1 |
| 6,326,796 B1 * | 12/2001 | Koda et al. .................. 324/707 |
| 6,346,868 B1 | 2/2002 | Castonguay et al. ........ 335/172 |
| 6,366,438 B1 | 4/2002 | Bauer ......................... 361/115 |
| 6,385,565 B1 * | 5/2002 | Anderson et al. ............. 703/18 |
| 6,396,369 B1 | 5/2002 | Schlitz et al. ................. 335/16 |

OTHER PUBLICATIONS

Analogy® SaberScope™ Graphical Waveform Analyzer Brochure, printed from http://www.analogy.com/Products/DataSheets/sscope.pdf on May 10, 2000.

(List continued on next page.)

*Primary Examiner*—John Barlow
*Assistant Examiner*—John Le
(74) *Attorney, Agent, or Firm*—Cantor Colburn LLP

(57) ABSTRACT

An apparatus and method for analyzing an apparatus, typically an electrical distribution system is provided. The apparatus and method is particularly useful for analyzing selective electrical distribution systems. The apparatus is generally a software system including a solver system for generating an output from an input presented to the solver system. The input is a mathematical representation of at least a portion of the electrical distribution system. In one embodiment, the input is presented to a model within the solver system. The model represents at least a portion of the electrical distribution system. The software system is capable of interfacing output data from one or more models with additional models for analyzing generally how devices within an electrical distribution system behave under certain conditions.

47 Claims, 38 Drawing Sheets

Circuit Breaker Modeling Flowchart

OTHER PUBLICATIONS

Avant! Simulation Product Page, printed from http://www.analogy.com/Products/Simulation/simulation.htm on May 10, 2000.

Annis, Jeffrey R. and Bradley, Allen; Rockwell Automation; "Monte–Carlo Analysis and System Simulation of a Solid State Overload Relay to Evaluate Design Robustness"; Assure Meeting Paper, Mar. 12–14, 1997.

Morel, Robert; Cahier Technique No. 154, Merlin Gerin; Low Voltage Circuit–Breaker Breaking Techniques; Dec., 1994.

Boillot, Louis and Mignée, Jean; Cahier Technique No. 140, Merlin Gerin; "Simulation De Comportment En Court–Circuit Des Disjoncteurs Basse Tension Limiteurs"; Sep., 1987. (Translation not provided).

Schueller, Pierre; Cahier Technique No. 103, Merlin Gerin; "Coupure En BT Par Limitation Du Courant"; Oct., 1983. (Translation not provided).

Avant! Home Page, printed from http://www.analogy.com/home.htm on May 22, 2000.

Avant! Modeling Product Page, printed from http://www.analogy.com/Products/Modeling/modeling.htm—*Hardware Description Language* on May 10, 2000.

Avant! Modleing Tools, printed from http://www.analogy.com/Products/Modeling/modeling–Tools.htm on May 10, 2000.

Avant! Analysis Product Page, printed from http://www.analogy.com/Products/analysis/analysis.htm on May 10, 2000.

Analogy® SaberDesigner™ Product Brochure, printed from http://www.analogy.com/Products/DataSheets/prodbro.pdf on May 10, 2000.

Analogy® Saber® Solutions Saber–IC™ Pro Brochure, printed from http://www.analogy.com/Products/DataSheets/ss_saber_icpro.pdf on May 10, 2000.

U.S. patent application Ser. No. 09/602,321, filed on Jun. 20, 2000, "Arc Chute Assembly for Circuit Breaker Mechanisms", Attorney Docket Number RD–27514, 14 pages.

U.S. patent application Ser. No. 09/528,175, filed on Mar. 17, 2000, "Circuit Interruption Modeling Method and Apparatus", Attorney Docket Number RD–27595, 57 pages.

* cited by examiner

PRIOR ART

PRIOR ART

FIG. 13 Circuit Breaker Modeling Flowchart

FIG. 20

709
```
# Copyright © General Electric Company 1999
# Trip Unit Control Template
# Electrical connections
# Reset - connect to reset hardware
# iah - phase A current high
# ial - phase A current low
# ibh - phase B current high
# ibl - phase B current low
# ich - phase C current high
# icl - phase C current low
# tr - trip output
# vcc - micro power pin
# gnd - ground connection

# Parameters
# td - Time delay to controller monitoring (default
= 3msec)
# sf - Sampling frequency (default = 1800 Hz)
# hf - Half cycle frequency (default = 100Hz)
# pd - Phase delay between sf and hf (default =
5msec)- not used currently
# vccrated - Rated Vcc voltage to test for power-up
conditions (default=5V)
# ns - Number of samples skipped between checks for
instantaneous protection
# c - Long-time current setting in amps, user
adjustable (default=250a)
# tau - classification time constant (default=0.1s)
##############################################
###### template controller reset iah ibh ich ial ibl icl
tr vcc gnd = td, sf, hf,
pd, vccrated, ns, c, tau, part_type,part_class
electrical reset, iah, ibh, ich, ial, ibl, icl,
vcc, gnd
state nu tr
# defaults
number   td=3e-3,  # Time delay for algorithms to
```

FIG. 23A  1750

```
# Copyright © General Electric Company, 1999, All Rights Reserved

Template written by Ahmed Elasser for the Air Circuit Breaker

# Template for the Air Circuit Breaker Trip Unit
# This template models an electronic trip unit where a trip output is
generated when:
# the current reaches a min value and a max value.
# When the current reaches i_thresh, a delay td1 is clocked in (This
corresponds to the power up delay)
# When the current reaches a peak value, a second delay td2 is clocked in. The
output of the
# trip unit is a logic output that swings between 0 and 1.

# Template header
template trip_unit_acb p m trip_out=i_thresh, i_max, td1, td2

Template declarations electrical p, m              # The two input connections for the current
measurement
state logic_4 trip_out       # The output trip signal

Argument declaration number td1=0.001,            # First delay: Power up Delay
       td2=0.001             # Second Delay which corresponds to the
tripping on the max current
number i_thresh=0.1,
       i_max=0.1

# Template Body
( state logic_4 delay1=14_0,   # Delay 1 for power up
              delay2=14_0    # Delay 2 for Max Trip Current
state nu past=0, future=0    # State Variables with nu used for
the threshold function
var i i_ct                   # Primary current
val v vin                    # Voltage across the input pins

When Section when(dc_init)(               # During DC analysis
  schedule_event(time, trip_out, 14_0)  # Initialization of the logic output to
zero
)

when (threshold (abs(i_ct), i_thresh, past, future))(         #
Testing on the power up threshold current
  if (future~=1)(                                             #
Current is lower than the threshold
                                delay1=14_0                                   # Set
the delay1 to logic 0 state
  )
```

To Fig. 23B

FIG. 23B   From Fig. 23A   1750

```
else if (future==1){                                              #
Current is higher than the threshold
            delay1=14_0                                            # Reset
the delay1 to 14_0
            schedule_next_time(time)                               #
Schedule an analog time step: Force the simulator to take a time step
            schedule_next_time(time+td1)                           # Force
the simulator to take a time step at time+td1
            schedule_event (time+td1, delay1, 14_1)                #
Switching delay 1 from logic 0 state to logic 1 state
            )
)
when (threshold(abs(i_ct), i_max, past, future)){                  #
Testing on the max current threshold current
if (future~=1) (                                                   #
Current is lower than the threshold
            delay2=14_0                                            # Set
the delay2 to logic 0 state
            )
else if (future==1 & delay1==14_1){                                #
Current is higher than the threshold
            delay2=14_0                                            # Reset
the delay2 to 14_0
            schedule_next_time(time)                               #
Schedule an analog time step: Force the simulator to take a time step
            schedule_next_time(time+td2)                           # Force
the simulator to take a time step at time+td1
            schedule_event (time+td2, delay2, 14_1)                #
Switching delay 2 from logic 0 state to logic 1 state
            schedule_event (time+td2, trip_out, 14_1)              #
Schedule an event on trip_out (trip_out goes high
            )
)
Values Section values(
            # Define the input voltage and current
              vin=v(p)-v(m)                          # Across Variable
       )
Equation Section equations (
            i(p->m)+=i_ct                       # Through Variable
            i_ct:vin=0                          # This ensures that no voltage
drop is allowed across p and m: Short
)
)
```

FIG. 26
517

```
# Copyright © General Electric Company, 1999
# Template created on 3/2/99 by Ahmed Elasser for the
#Launcelot System
# Modeling.
# This is a rotor model to be used in conjunction with the
System Model.
# This rotor model has two rotational angle pins and models the torque
# generated by the rotor mechanism. The equation used here are generated
through basic mechanical laws template launcelot_rotor_model ang1 ang2= k,
delta0, slot_offset, link_1,
                                            link_b_x, link_b_y,
radius,
                                            part_type,
                                            part_class,
ratings, units rotational_ang ang1,         # Angular Connection 1
               ang2          # Angular Connection 2 string part_type="rotor_model",    # Type of the device
               part_class="Rotor"          # Class of the device struc {
               number max_gap=undef        # Maximum gap between Movable and
                                           # fixed contacts
        } ratings =( )

mech_def..units units=mks                  # Select "units" assumed for arguments

# Constants used in the model
        number k=7.75e3,                   # Spring Constant (N/m)
               delta0=17. 46e-3,           # Spring free length (m)
               slot_offset=2e-3,           # Slot x offset (m)
               link_1=6.75e-3,             # Link Length (m)
               link_b_x=3.46e-3,           # Link Base x Offset (m)
               link_b_y=4.9e-3,            # Link Base y Offset (m)
               radius=21e-3                # Rotor arm radius (m)
```

FIG. 27
<u>513</u>

```
# Copyright © General Electric Company- 1999
#Template for Constriction force created by Ahmed Elasser and #
Sriram Ramakrishnan, GE CRD, 1999
# VERSION 01
# DATED Fri March 24, 1999
# element template constriction_force p m ang1 ang2 pos1 pos2 =
b,h,cfdt,n,
#                 amin, radius, units, ratings,
part_type,part_class

#*****************************************************************
******

#*****************************************************************
******
# Template constriction_force.sin, is a current to force
converter   *
# with electrical and rotational inputs and
(translational)position   *
# connection outputs                                              *

*
# This model represents a electromagnetic force source. Its
behavior   *
# is such that a current flowing through the the electrical
connections   *
# p and m produces a (mechanical) force.This force is applied
    *
# Through the mechanical connections (pos1 and pos2), and is
directed   *
# so as to increase the displacement between these connections.
    *                                                             *

#         force =n*(u0/4*pi)*i^2*ln(b/a)
    *
#         a = sqrt(Fc/pi*h))                                      *
#                                                                 *
# The connections pos1 and pos2 are "translational" pins. That
is,   *
# they are mechanical connections, with translational position as
the   *
#across variable and force as the through variable, These
variables   *
# are specified in MKS units, where the position is in meters and
    *
# force is in Newtons. However, you can select other units for
    *
# parameter specifications and for viewing the variables in the
    *
# simulation results. This is described below.
    *
```

FIG. 28A
514

```
# Template for Loop force created by GE CRD
# Copyright © General Electric Company-1999
# VERSION 01
# DATED Fri March 19, 1999
# element template loop_force p m pos1 pos2 = a, h, b, l,n units,ratings,
part_type,part_class mks_values      Newtons          meters
cgs_values      dynes            centimeters
#    fps_values      pounds           feet
ios_caiues      ounces           inches element template loop_force p m pos1 pos2 = a, h, b, l,n, units
ratings, part_type,part_class
electrical    p,                  # Electrical connection 1.
              m                   # Electrical connection 2.
translational_pos    pos1,        # Position connection 1.
                     pos2         # Position connection 2.
number    a,                      # a - gap between parallel straps
          h,                      # h - Strap thickness
          b,                      # b - Strap width
          l,                      # l - Reverse loop length
          n                       # n - number of contacts
mech_def..units units = mks       # Select "units" assumed for arguments.
string part_type="Loop Force"     # Type of the device
       part_class="Launcelot"     # Class of the device
struc {
       number forc_max=undef # Maximum force rating
       } ratings=( )
export val frc_N      force_mks        # electromagnetic force, N.
external number include_stress
{
<consts.sin                       # Include constants
<units.sin                        # Include Units
number a_eff,           # Effective (mks) equivalent of a.
       h_eff,           # Effective (mks) equivalent of h.
       b_eff,           # Effective (mks) equivalent of b.
       l_eff            # Effective (mks) equivalent of l.
val pos_m    a_dyn      # Dynamic position of contact arm
val pos_m    posn_mks   # Differential position (meters).
val pos_c    posn_cgs   # Differential position (cm).
val pos_f    posn_fps   # Differential position (ft).
val pos_i    posn_ios   # Differential position (in).
val frc_d    force_cgs  # Blow-open force, dyne.
val frc_p    force_fps  # Blow-open force, lb.
val frc_o    force_ios  # Blow-open force, oz.
```

From Fig. 28A                           514

```
val   v   vin                  # Voltage across input pins
var   i   iloop                # Loop current i(p->m)
group {force_mks, posn_mks} mks_values
group {force_cgs, posn_cgs} cgs_values
group {force_fps, posn_fps} fps_values
group {force_ios, posn_ios} ios_values
number xforc_max               # Final value of max force rating
#####....New parameter checks
       number xa,xh,xb,xl,xn
#Constant
       number u0       #permeability of free space
parameters {
       u0 - 4*math_pi*10**-7
       xa = argbp("none","undef_w","inf_w",a,"a",0,0)
       xh = argbp("none","undef_w","inf_w",h,"h",0,0)
       xb = argbp("none","undef_w","inf_w",b,"b",0,0)
       xl = argbp("none","undef_w","inf_w", l,"l",0,0)
       xn = argbp("none","undef_w","inf_w",n,"n",0,0)
       if (units == mks) {
              a_eff = xa              # No conversion necessary.
              h_eff = xh              # No conversion necessary.
              b_eff = xb              # No conversion necessary.
              l_eff = xl              # No conversion necessary.
       }
       else if (units ==cgs) {
              a_eff = xa * 1e-2       # Convert cm to m.
              h_eff = xh * 1e-2       # Convert cm to m.
              b_eff = xb * 1e-2       # Convert cm to m.
              l_eff = xl * 1e-2       # Convert cm to m.
       }
       else if (units == fps) {
              a_eff = xa * 0.3048     # Convert ft to m.
              h_eff = xh * 0.3048     # Convert ft to m.
              b_eff = xb * 0.3048     # Convert ft to m.
              l_eff = xl * 0.3048     # Convert ft to m.
```

Copyright © General Electric 1999

Template updated on 6/22/99 by Ahmed Elasser/Sriram Ramakrishnan for the Launcelot System Model.
This is an arc model to be used in conjunction with the System Model.

Template for the Launcelot arc model: This template model the arc in a
Circuit breaker using the following relations:
The voltage across the arc is equal to:
E= 2*(ac+s*Ef)  where:
E: Arc Voltage
ac: Anode-Cathode voltage drop
s: Displacemnt of circuit breaker arm
Ef: Electric field gradient. This term is used rather than a dielectric
constant, because the plasma is conductive.
Ef is dependent on the pressure. We are using here a simple relation ship
between the electric field and the pressure.
Ef=c*(Ei)^n  where:
c and n are solved for experimentally and are obtained from the fitting
experimental results
E is again the arc voltage and i is the arc current
The arc voltage equation is there fore solved for in the following:
E=2*(ac+s*c*(Ei)^n)

The different phases of arc behavior

*********************************************************************
*******

Mode 1:

When the contacts are still closed: e=0 (Arc voltage is zero)
Here the breaker rb and lb are used to compute breaker voltage drop

*********************************************************************
*******

Mode 2:

when the arc is located between the contacts, ea is:

e=2*(ac+ra*s*ia+s*c* (abs(ea*ia)^n))*sign(ia)

ra is the arc per unit resistance

FIG. 32

```
# Copyright © General Electric Company- 1999
#Template for Mechanism created by Sriram Ramakrishnan,
GE CRD
# VERSION 01
# DATED Sun April 18, 1999
# element template eframe_mechanism pos1 pos2 ang1 ang2
= td,stroke, units,
#                        offset, ratings,
part_type, part_class

#*******************************************************************
*****************
# Template eframe_mechanism.sin, is a mechanism model
that acts as
# a translational/rotational converter, with
mechanical rotation angle    *
# and translational position connections.This model
emulates the       *
# torque produced by the mechanism on the rotor. The
torque applied is *
# a function of the rotor angular position and is
generated through a   *
# look-up table.The mechanism is activated after a
time-delay 'td' sec    *
# after flux-actuator input reaches a threshold stroke
length 'stroke'    *
# where offset is the compressed length of spring. The
mechanism is       *
# activated after position(pos1-pos2)>=(stroke +offset)
                                                       *
#                                                      *
# The connections ang1 and ang2 are "rotational_ang"
pins. It is a       *
# mechanical connection, with rotation angle as the
across variable and    *
# torque as the through variable. The connection pos1
and pos2 are       *
# "translational_pos" pins. It is also a mechanical
connection, with    *
# position as the across variable and force as the
through variable.    *
# These variables are specified in MKS units, where the
position is       *
# in meters, angle is in radians, force is in Newtons
and torque is in    *
#  Newton*meters.
              *
# However, you can select other units for parameter
specifications     *
# and for viewing the variables in the simulation
results. This is    *
# described below.
         *
```

US 6,629,044 B1

ELECTRICAL DISTRIBUTION ANALYSIS METHOD AND APPARATUS

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

The present invention is directed to an electrical distribution selectivity analysis method and apparatus.

Power distribution devices are well known in the art. In typical power distribution systems, selectivity is desired generally to minimize nuisance tripping. FIG. 1 generally shows a two tier selective system 40. Selective system 40 comprises a source 41, an upstream protection device 42, a downstream protection device 44 coupled to a load 45, and a downstream protection device 46 coupled to a load 47. Any number of additional downstream protection devices 44 with corresponding loads 47 may be included in system 40. Generally, each protection device 42, 44 or 46 is a circuit interrupter (e.g., in a single phase power system) or a multiple pole circuit breaker (e.g., in a multiple phase power system). These circuit breakers can be any type, including but not limited to low voltage, medium voltage, high voltage, air, or vacuum breakers for residential, commercial or industrial uses. Source 41 is any power source or combination of power sources including but not limited to outside power feeds, generators, transformers, or uninterruptible power supplies. Loads 45, 47 can be any load or combination of loads including but not limited to motors, lamps, ballasts.

A conventional circuit breaker includes a pair of contacts which allows circuit current to pass from one contact member to another contact member. An objective of these devices is to carry nominal rated current at very low loss and have momentary circuit current withstand levels, commonly referred to as "popping levels". A withstand level is generally the level of circuit current that may pass through the circuit breaker before a fault condition is realized causing the contacts to open to prevent circuit current from passing through the contacts. When the contacts open, circuit current is prevented from flowing from one contact member to the other and therefore, circuit current is prevented from flowing to a load which is connected to the device. By having these momentary circuit current withstand levels, operation under high inrush loads, common with motors and transformers, is permitted. Accordingly, these devices need to have momentary circuit current withstand levels so that they may be properly used with such high inrush loads to protect the loads and the overall electrical system.

Downstream device 44 is rated to meet the demands of load 45, e.g., 20×(twenty times) rated circuit current maximum. When load 45 exceeds this rating, which is likely only when a fault occurs, device 44 would then rapidly transition to a current limiting position. In the current limiting position, downstream device 44 has a reduced circuit current let-thru which in turn reduces stresses on the entire system 40. By reducing these stresses on system 40, the devices of load 45 are also protected and this is of particular interest if load 45 has a motor starter in the circuit thereof.

FIG. 2 is a plot of peak let-thru current versus prospective current of downstream device 44 and upstream device 42 in a current limiting position in accordance with the present invention. Downstream device 44 is in a current limiting position when device 44 is under fault conditions which are circuit current conditions substantially above the withstand level. In this position, downstream device 44 keeps the let-thru circuit current below the withstand level of the upstream device 42, as shown in FIG. 2. Because upstream device 42 can be of the same design as downstream device 44 and have a high withstand, it does not trip and the remainder of the system 40 remains in service. If upstream device 42 did not have a sufficiently high withstand level, then upstream device 42 would be prone to tripping and such tripping would cause the remainder of the system 40 to be out of service. By reducing the circuit current let-thru, downstream device 44 reduces the stresses on the entire system 40 and thereby protects the devices of load 47 as well. The plots represented on FIG. 2 represent ideal system behavior. Even if the ideal behavior is not attained, selectivity is still possible generally as long as the let-through of downstream device 44 remains below the trip response of upstream device 42. However, in non-ideal systems, the behavior cannot be analyzed with conventional techniques because the current through downstream device 46 will also be effected by the voltage generated by the upstream device.

Turning now to FIGS. 3 and 4, an exemplary multi-pole circuit breaker 50 that can be an upstream protection device 42, a downstream protection device 44, and/or a downstream protection device 44 are shown. Circuit breaker 50 generally includes a molded case including a top cover 52, a mid cover 54 and a base 56. A plurality of cassettes 58, 60 and 62 are disposed within base 56. An operating mechanism 64 is disposed atop cassette 60. Cassettes 58, 60 and 62 are commonly operated via a set of cross bars 66, 68. The crossbar 66 is disposed through an opening 70 in a portion of operating mechanism 64.

A line side contact strap 72 and a load side contact strap 74 extends from each cassette 58, 60 and 62 for connection with a power source and a protected circuit and/or load, respectively. A current transformer 76 is arranged relative to each line side contact strap 72. Current transformer 76 is coupled (not shown) to a trip unit 78 positioned within mid cover 54. Optionally, a rating plug (not shown) can be interfaced with trip unit 78 to change the settings of circuit breaker 50.

Trip unit 78 includes an actuator 80. Actuator 80 can be, for example, a flux actuator that operates substantially as described in U.S. Pat. No. 6,211,758 entitled "Circuit Breaker Accessory Gap Control Mechanism", U.S. Pat. No. 6,172,584 entitled "Circuit Breaker Accessory Reset System", and in U.S. Pat. No. 6,211,757 entitled "Flux Actuator".

Operating mechanism 64 includes a toggle handle 82 extends through openings within top cover 52 and mid cover 54. Toggle handle 82 provides external operation of operating mechanism 64. Operating mechanism 64 operates substantially as described in U.S. Pat. No. 6,346,868 entitled "Circuit Interrupter Operating Mechanism" and in U.S. Pat. No. 6,087,913 entitled "Circuit Breaker Mechanism for a Rotary Contact Assembly".

Cassettes 58, 60, 62 are typically formed of high strength plastic material and each include opposing sidewalls 84, 86. Sidewalls 84, 86 have a pair of arcuate slots 88, 90 positioned and configured to receive and allow the motion of cross bars 66, 68 by operating mechanism 64. Examples of a rotary contact structures that may be operated by operating mechanism 64 are described in more detail in U.S. Pat. No.

6,114,641 entitled "Rotary Contact Assembly For High-Ampere Rated Circuit Breakers" and U.S. Pat. No. 6,396,369, entitled "Laterally Moving Line Strap", U.S. Pat. No. 6,175,288 entitled "Magnetic Supplemental Trip For A Rotary Circuit Breaker", and U.S. Pat. No. 6,366,438 entitled "Rotary Contact Arm".

Referring now to FIG. 5, a partial view of the inside of a cassette similar to cassettes 58, 60, 62 is shown. Each cassette 58, 60, 62 includes a rotary contact assembly 92. Rotary contact assembly 92 is disposed intermediate to line side contact strap 72 and load side contact strap 74. Line side contact strap 72 and load side contact strap 74 are configured as U-shaped reverse loop conductor straps. Line side contact strap 72 includes a stationary contacts 94 and load side contact strap 74 includes a stationary contacts 96. Rotary contact assembly 92 further includes a movable contact arm 100 having a set of contacts 102 and 104 that mate with stationary contacts 94 and 96, respectively. Furthermore, a quantity of ablative material (not shown) is provided adjacent to stationary contacts 94, 96. The ablative material can be, for example, a nonelectrically conducting material such as a glass melamine or a glass polyester resin, or a cotton base fiber on the surface of a suitable resin such as a phenolic.

A pair of arc handling portions 106, 108 are disposed proximate to line side contact strap 72 and load side contact strap 74, respectively. Arc handling portions 106, 108 typically contain an arc chute configured to divert a gas flow of the ablative material (described further herein) out of cassette 58, 60, 62, substantially as described in U.S. Pat. No. 4,733,032 entitled "Electric Circuit Breaker Arc Chute Composition" and in U.S. patent application Ser. No. 09/602321 entitled "Arc Chute Assembly for Circuit Breaker Mechanisms".

Contact arm 100 is mounted within a rotor 110. A pair of openings 112, 114 are disposed proximate to the outer perimeter of rotor 110. Openings 112, 114 are configured to accept crossbar is 66, 68.

Rotor 110 includes a pair of opposing faces 116 (one of which is shown in FIG. 3) and is configured to have a set of slots 118 disposed centrally across each face 116. A contact spring 120 is disposed in each slot 118. Each contact spring 120 is arranged on a pair of spring pins 122, 124.

Referring now to FIG. 6, a side view of rotary contact assembly 92 is shown intermediate to line side contact strap 72 and load side contact strap 74. Spring pins 122, 124 are disposed on top of and at the bottom of, respectively, contact arm 100 via a pair of pivotal links 126 at the top and links 128 to the at the bottom. Spring pins 122, 124 are positioned within pin retainer slots 130, 132 formed in rotor 110 (intermediate to each face 116). Pivotal links 126,128 pivot upon pivot pins 134, 136, respectively.

Contact arm 100 and rotor 110 pivot about a common center 138. Center 138 typically is a cylindrical feature protruding from a central portion of contact arm 100 and is captured within rotor 110 to allow contact arm 100 to rotate separately from rotor 110.

Spring pins 122, 124 are positioned in line (co-linear) with center 138 so that the spring force, indicated by arrows H, exerted between spring pins 122, 124 is directed to intersect the axis of rotation of movable contact arm 100. The force H is transferred to movable contact arm 100 via spring pins 122, 124, links 126,128, and pivot pins 134,136. Pivot pins 134,136 are offset from the line created by spring pins 122, 124 and center 138. This offset allows the force H to rotate movable contact arm 100. The rotation of movable contact arm 100 urges movable contacts 102, 104 toward fixed contacts 94, 96, generating a contact pressure between movable contacts 102, 104 and fixed contacts 94, 96. Because the force H is centered through the rotational axis of movable contact arm 100, the force of movable contact 102 onto fixed contacts 64 is substantially equal to the force of movable contact 104 onto fixed contact 96.

During quiescent operation, contacts 102 and 104 are mated with stationary contacts 94 and 96 and contact arm 100 is in the "closed" position. That is, current flows from line side contact strap 72 to load side contact strap 74, through contact arm 100.

Reverse loop forces are created at the interface of fixed and movable contacts 94, 96, 102, 104, generally by current through the U-shaped line side contact strap 72 and/or load side contact strap 74. Furthermore, due to the non-uniform current flow through movable contact arm 100, constriction forces are created through contact arm 100 and at the interface of fixed and movable contact 94, 96, 102, 104. This causes movable contacts 102, 104 to be urged apart from fixed contacts 94, 96. The force caused by magnetic repulsion acts against the contact pressure created by the contact springs 120, which, in the absence of such magnetic repulsion, tend to maintain the fixed and movable contacts 94, 96, 102, 104 in a "closed" position.

Referring now to FIG. 7, fixed and movable contacts 94, 96, 102, 104 are in an "open" position. The condition represented in FIG. 5 occurs, when, for example, the loop forces and/or constriction forces exceeds the contact pressure exerted by rotor structure 92, including springs 120, whereby contact arm 100 is urged in the clockwise direction about center 138, while rotor 110 remains stationary. The rotation of contact arm 100 moves pins 134 and 136 around center 138 and toward the line of force H created by springs 120. The motion of pins 134 and 136 is translated to spring pins 122 and 124 via links 126 and 128, causing spring pins 122 and 124 to translate within slots 130 and 132 towards the outer perimeter of rotor 110. The translation of spring pins 122 and 124 acts against the force of springs 120.

When pins 134, 136 and center 138 are aligned with the force H, the "overcenter" position is achieved. At this position, if the loop and constriction forces continue to overcome the force from spring 120, contact arm 100 will continue clockwise rotation about center 138 and remain "open", as shown in FIG. 5, At certain conditions e.g., "popping levels" or "withstand levels" (not shown), the loop and constrictive forces are high enough to overcome the contact pressure to separate the fixed and movable contacts 94, 96, 102, 104, but not high enough to bypass the "overcenter" position.

Referring now to FIG. 8, the interface between actuator 80 and operating mechanism 64 is shown. Operation of actuator 80 allows fixed and movable contacts 94, 96, 102, 104 to be separated even when the contact pressure exerted generally by contact springs 120 are not overcome by constriction forces and/or loop forces.

Actuator 80 includes a magnetic plunger assembly 140 that is coupled to, for example, circuitry within trip unit 78. Magnetic plunger assembly 140 includes a plunger 142 that moves from a retracted position to an extended position. An actuator linkage assembly 144 having an actuator trip tab 146 is positioned proximate to plunger 142.

Operating mechanism 64 includes a latch assembly 148, described in more detail herein. Latch assembly 148 includes a secondary latch trip tab 150 extending generally outwardly from operating mechanism 64 and positioned proximate to actuator trip tab 146 when circuit breaker 50 is assembled. Toggle handle 82 is interconnected with a mechanism linkage assembly 152, further described herein, which generally interfaces crossbar 66 through opening 70.

During quiescent operation, plunger 142 within actuator 80 is retracted. The fixed and movable contacts 94, 96, 102, 104 are closed such that current flows from line side contact strap 72 to load side contact strap 74.

Upon occurrence of a trip event (e.g., a short circuit, an overcurrent, or a ground fault), actuator 80 receives a trip signal generally outputted from circuitry within trip unit 78. The trip signal causes a magnetic flux within magnetic plunger assembly 140 to allow plunger motion from the retracted position to the extended position. When moved to the extended position, plunger 142 contacts a portion of actuator linkage assembly 144, which, in turn, causes displacement of actuator trip tab 146. The displacement of actuator trip tab 146 contacts secondary latch trip tab 150, which releases latch assembly 148 and causes mechanism linkage assembly 152 to translate crossbar 66. The translation of crossbar 66, in turn, causes rotary contact assembly 92, including contact arm 100, to rotate such that movable and fixed contacts 94, 96, 102, 104 become separated such that current is prevented from flowing from line side contact strap 72 to load side contact strap 74.

Referring now to FIGS. 9 and 10, certain components of operating mechanism 64 will now be detailed. Operating mechanism 64 has operating mechanism side frames 154 configured and positioned to straddle cassette 60.

Toggle handle 82 (not shown in FIGS. 9 and 10) is rigidly interconnected with a handle yoke 156. Handle yoke 156 includes U-shaped portions 158 that are rotatably positioned on a pair of pins 160 protruding outwardly from side frames 154. Handle-yoke 156 includes a roller pin 162 disposed intermediate to the sides of handle-yoke 156.

Handle yoke 156 is connected to a set of mechanism springs 164 by a spring anchor 166 generally supported within a pair of openings 168 in handle yoke 156 and arranged through a complementary set of openings 170 on the top portion of mechanism springs 164.

A pair of cradles 172 are disposed adjacent to side frames 154 and pivot on a pin 174 disposed through an opening 176 approximately at the end of each cradle 172. An opening 204 and an arcuate slot 180 are generally centrally disposed on cradles 172. Each cradle 172 is positioned generally under roller pin 162 and supported in an arcuate slot 182 on each side frame 154 by a rivet 184. Each cradle 172 includes an arm 186 that depends downwardly and a latch surface 188 generally disposed above arm 186.

Latch assembly 148 includes a primary latch 190 and a secondary latch 192. Primary latch 190 includes a pair of side portions 194 interconnected by a central portion 196. Central portion 196 includes a pair of extension portions 198 extending beyond side portions 194. Each side portions 194 includes an upper side portion 200 and a bent leg 201 at the lower portion thereof. Each upper side portion 200 includes a latch surface 202. An opening 204 is positioned on each side portion 194 so that primary latch 190 is rotatably disposed on a pin 206. Pin 206 has opposing ends secured to each side frame 154.

Secondary latch 192 is positioned to straddle side frames 154. Secondary latch 192 is pivotally mounted upon frames 154 via a set of pins 208 that are disposed in a complementary pair of notches 210 on each side frame 154. A spring 212 is disposed between an opening 214 on secondary latch 192 and a frame cross bar 216 disposed between frames 154.

Secondary latch 192 includes a pair of latch surfaces 218, generally positioned proximate to latch surfaces 202 when primary latch 190 and secondary latch 192 are engaged, as described herein. Additionally, secondary latch 192 includes secondary latch trip tabs 150 that extend perpendicularly from operating mechanism 64.

Mechanism linkage assembly 152 includes a pair of upper links 220 and lower links 222. A bottom portion 224 of each upper link 220, generally U-shaped, and an opening 226 on each lower links 222, are commonly pivotable about an outer surface of a side tube 228. A side tube 228 is disposed on each side frame 154.

A pin 208 is disposed through a pair of openings 169 at the lower end of each mechanism spring 164, a central tube 232, and into each side tube 228. Therefore, each side tube 228 is a common pivot point for upper link 220, lower link 222 and mechanism springs 164.

Upper links 220 are interconnected with cradles 172 via a first rivet pin 234 disposed through opening 204 and a second rivet pin 236 disposed through arcuate slot 180. First and second rivet pins 234, 236 attached to a connector 238 at an opposing face of each cradle 172.

Lower link 222 is interconnected with a crank 240 via a pivotal rivet 242 disposed through an opening 244 in lower link 222 and an opening 246 in crank 240. Crank 240 is positioned on a crank center 248 and has an opening 250 where crossbar 66 passes through into arcuate slot 88 of cassette 58, 60 and 62 and a complementary set of arcuate slots 252 on each side frame 154.

A weld block lever 254 is also disposed on each side frame 154. Weld block lever 254 interacts with a blocking projection 256 of handle yoke 156, and with a cam port on 258 of crank 240 when a particular rotary contact assembly is fixed or welded in the closed position. The operation of weld block lever 254 is described in more detail in U.S. Pat. No. 6,166,344 entitled "Circuit Breaker Handle Block".

When latch assembly 148 is set, by urging handle yoke 156 in the counterclockwise direction as oriented in FIG. 7, primary latch surfaces 202 rests against secondary latch surfaces 218 and primary latch extension portions 198 rest against cradle latch surfaces 188. Crossbars 66, 68 assist in holding rotor 110 in the "closed" position, as seen in FIG. 4, because crank 240 is not caused to rotate by mechanism linkage assembly 152.

Also, urging handle yoke 156 in the counterclockwise direction translate a forced to mechanism springs 164, which drives pin 208 to the right so that a portion of upper link 220 and lower link 222 are in line. This causes crank 240 to rotate clockwise about crank center 248 thereby driving cross pin 66 to the upper end of arcuate slots 252 and rotating rotor 110 (including contact arm 100) clockwise about center 138 such that fixed and movable contacts 94, 96, 102, 104 are mated and current is allowed to flow through contact arm 100.

When latch assembly 148 is tripped, i.e. by actuator trip tab 146 contacting secondary latch trip tab 150, primary latch 190 is driven by mechanism springs 164 via the clockwise motion transmitted to cradles 172. Mechanism springs 164 also transmit a force via pin 208 to lower link 222, which causes crank 240 to rotate in the counter clockwise direction, thereby driving cross bar 66 and rotating rotors 110 within cassette 58, 60 and 62 so that contacts 102, 104 upon contact arm 100 are rapidly separated from stationary contacts 94, 96.

Automatic circuit protection against overload circuit conditions is provided by means of trip unit 78 located within mid cover 54. In certain circuit protection devices, trip unit 78 is an electronic trip unit. It is well known that trip unit 78 can be eliminated, or may comprise, e.g., a thermo magnetic trip unit. A rating plug can be included to allow the circuit interruption rating to be set by accessing the electronic trip unit without disassembling top cover 52 from mid cover 54. Electronic trip unit 78 generally receives an input from current transformer 76 and provides output to actuator 80 (i.e., a second type of interruption).

A block diagram of an exemplary electronic trip unit 78, including the input from each current transformer 76, is provided in FIG. 11. Current transformers 76 (one associated with each phase of current in a multi-phase system) provide inputs (in the form of a current) to trip unit 78 (indicated in FIG. 9 with dashed lines). In the example shown, trip unit 78 includes a signal conditioner 260, a power supply 262, a micro controller 264, a firing circuit 266, and an actuator 80.

The currents from current transformers 76 are coupled in parallel to power supply 262 and signal conditioner 260. Power supply 262 energizes signal conditioner 260, micro controller 264, and firing circuit 266. Signal conditioner 260 conditions current signal and feeds the current signal to micro controller 264. Generally, the signals fed to signal conditioner 260 are in analog form. These analog signals can be converted to digital signals with an analog-to-digital converter within signal processor 260, with an analog-to-digital converter within micro controller 264, or a combination of an analog-to-digital converter within signal processor 260 and an analog-to-digital converter within micro controller 264. Firing circuit 266 can be, for example, a low voltage power MOSFET. Control signals are sent from micro controller 264 to firing circuit 266. Upon a determination of a predetermined event, for example, an overcurrent condition, micro controller 264 provides a signal to firing circuit 266, which is energized by power supply 262 and outputs a trip signal to actuator 80. The trip signal to actuator 80 causes magnetic plunger assembly 140 to allow plunger motion from the retracted position to the extended position, which in turn causes plunger 142 to contact a portion of actuator linkage assembly 144 and displaces actuator trip tab 146. The displacement of actuator trip tab 146 contacts secondary latch trip tab 150, which releases latch assembly 148 and causes mechanism linkage assembly 152 to translate crossbars 66, 68 and separate movable and fixed contacts 94, 96, 102, 104 as described above.

To understand the behavior of these devices at both the system level and the component level, circuit breakers are positioned between a power source and a load, and various fault conditions are generated. The conditions of the breaker immediately before the breaker starts to opens, and during opening, are generally studied with current and voltage curves for each phase.

However, this approach can be time consuming, as the desired circuit breaker must be constructed and installed. Furthermore, the fault condition must be experimentally generated, which is also costly and time consuming.

An accurate model of a circuit breaker that will describe the conditions of the circuit breaker under various fault conditions is, therefore, desirable. Such a model will allow a user to build a virtual circuit interrupter or breaker and perform various studies and simulations regarding the behavior of the device.

SUMMARY OF THE INVENTION

An apparatus and method for analyzing an apparatus, typically an electrical distribution system is provided. In one embodiment, the apparatus and method is employed for analyzing selective electrical distribution systems. The apparatus is generally a software system including a solver system for generating an output from an input presented to the solver system. The input is a mathematical representation of at least a portion of the electrical distribution system. In certain embodiments, the input is presented to a model within the solver system. The model represents at least a portion of the electrical distribution system. The software system is capable of interfacing output data from one or more models with additional models for analyzing generally how devices within an electrical distribution system behave under certain conditions.

The software system may analyze several models simultaneously. For example, a first model and a second model each being mathematical representations of at least a portion of one or more circuit interruption devices within the electrical system can be provided. The input can be fed through the first model, and the output of the first model used as input for the second model. Alternatively, the input and the output of the first model can be fed as input for the second model. Numerous variations are possible.

Inputs to the system can be presented by an interface with a user. Additionally, inputs can be presented by an interface with a simulator system. For electrical systems, the input generally comprises a simulated power feed. When fault behavior is to be analyzed, the input further comprises a simulated fault is said simulated power feed. The simulator system generates the simulated power feed and fault at user defined parameters, including, but not limited to, closing angle, power factor, peak voltage and maximum current.

BRIEF DESCRIPTION OF THE DRAWINGS

FIG. 20 is a snippet of code representing a micro controller model employed within an embodiment of a trip unit model;

FIG. 23 is another alternative trip unit model for use within a circuit breaker model within an embodiment of the present invention;

FIG. 26 is a snippet of code representing a mechanical rotor model of rotor model for use within a cassette model within an embodiment of the present invention;

FIG. 27 is a snippet of code representing a constriction force model for use within a cassette model within an embodiment of the present invention;

FIG. 28 is a snippet of code representing a constriction force model for use within a cassette model within an embodiment of the present invention;

FIG. 29 is a snippet of code representing an arc model for use within a cassette model within an embodiment of the present invention;

FIG. 32 is a snippet of code representing a mechanism model for use within a cassette model within an embodiment of the present invention;

For a better understanding of the present invention, together with other and further objects, advantages and capabilities thereof, reference is made to the following disclosure and appended claims in connection with the above-described drawings.

DETAILED DESCRIPTION OF THE INVENTION

Figure 1:
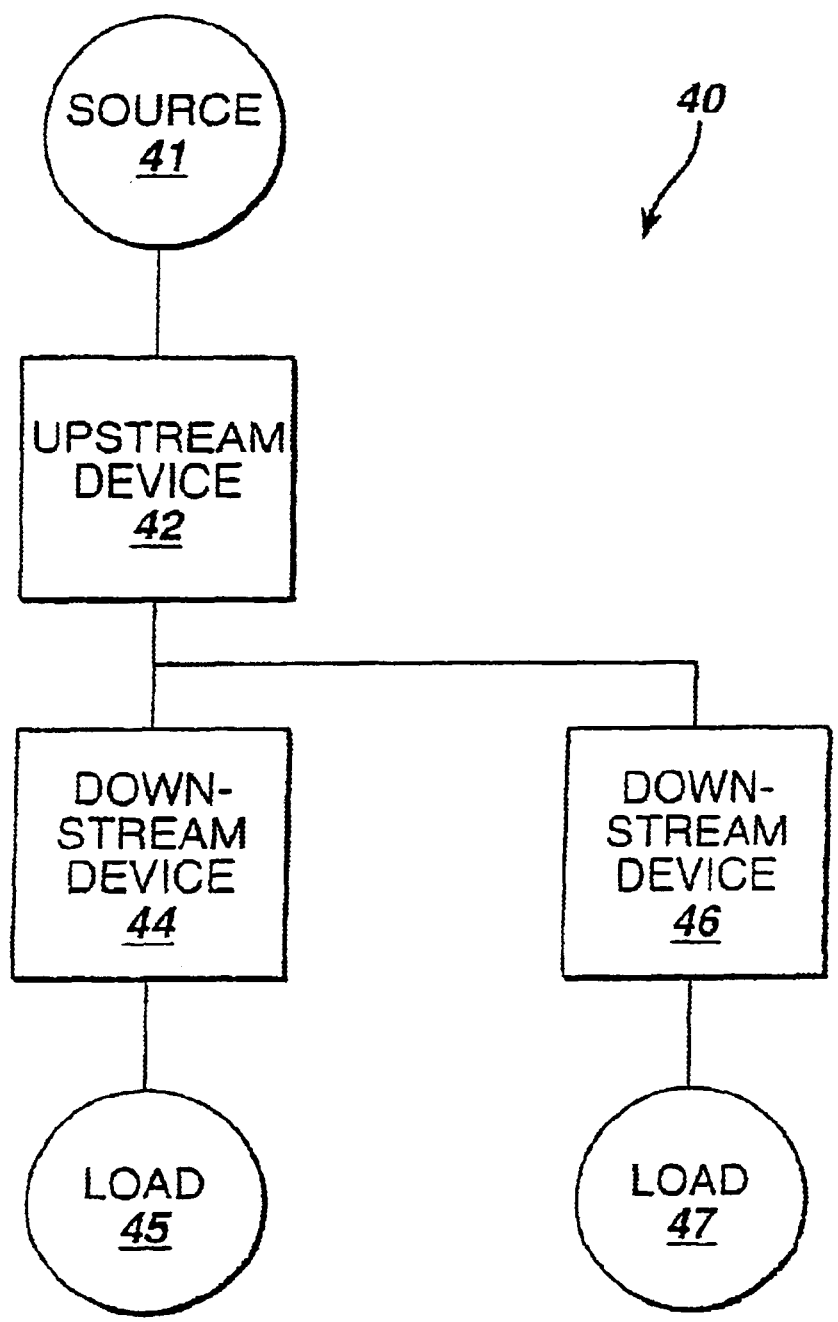
FIG. 1 is a block diagram of a two tier selective system.
Figure 2:
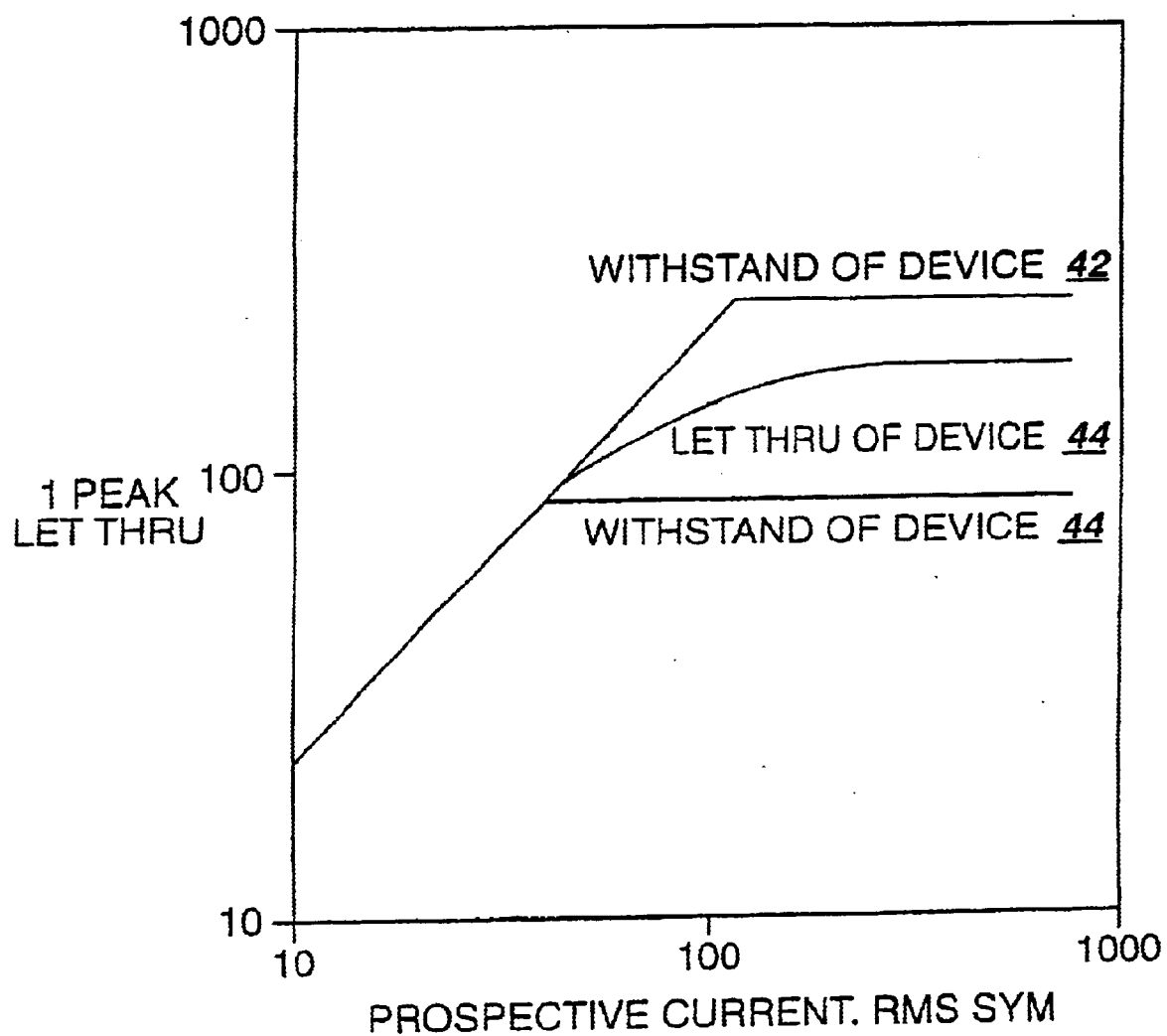
FIG. 2 is a plot of peak let-through current verses prospective current in a two tier selective system.
Figure 3:
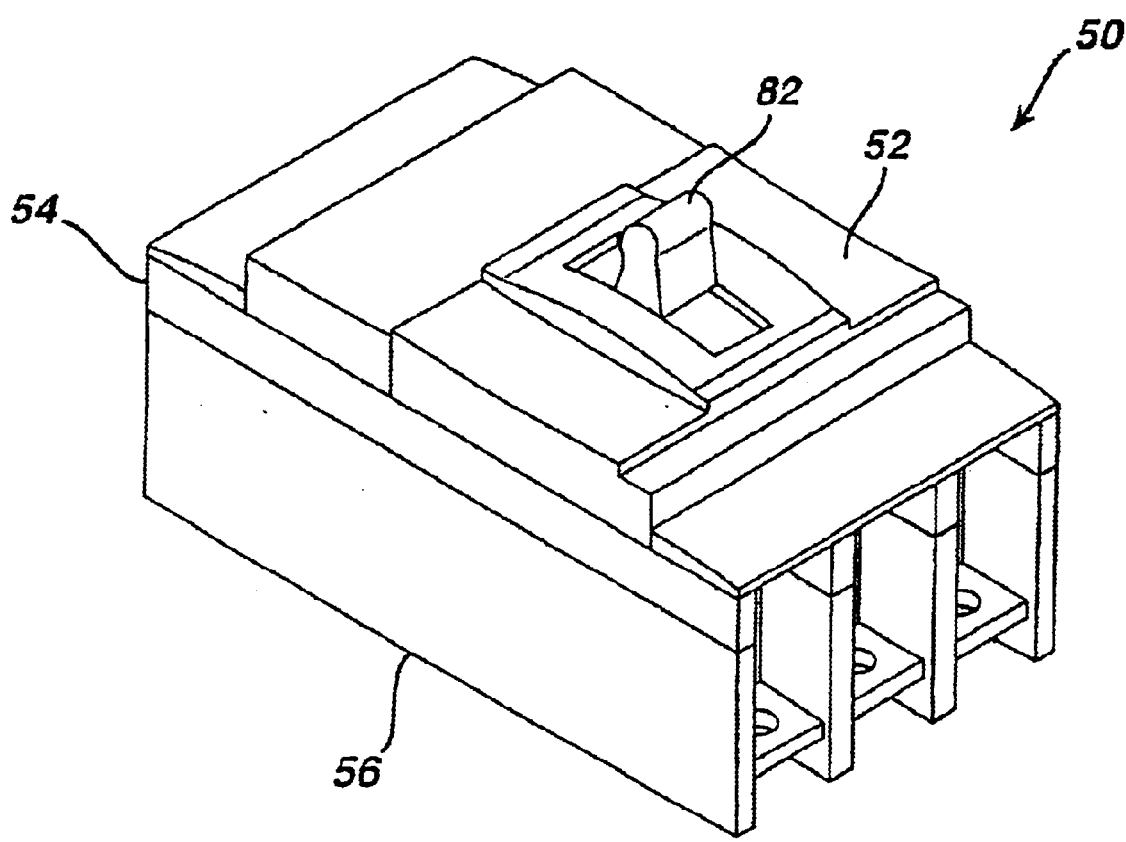
FIG. 3 is an isometric view of a molded case circuit breaker.
Figure 4:
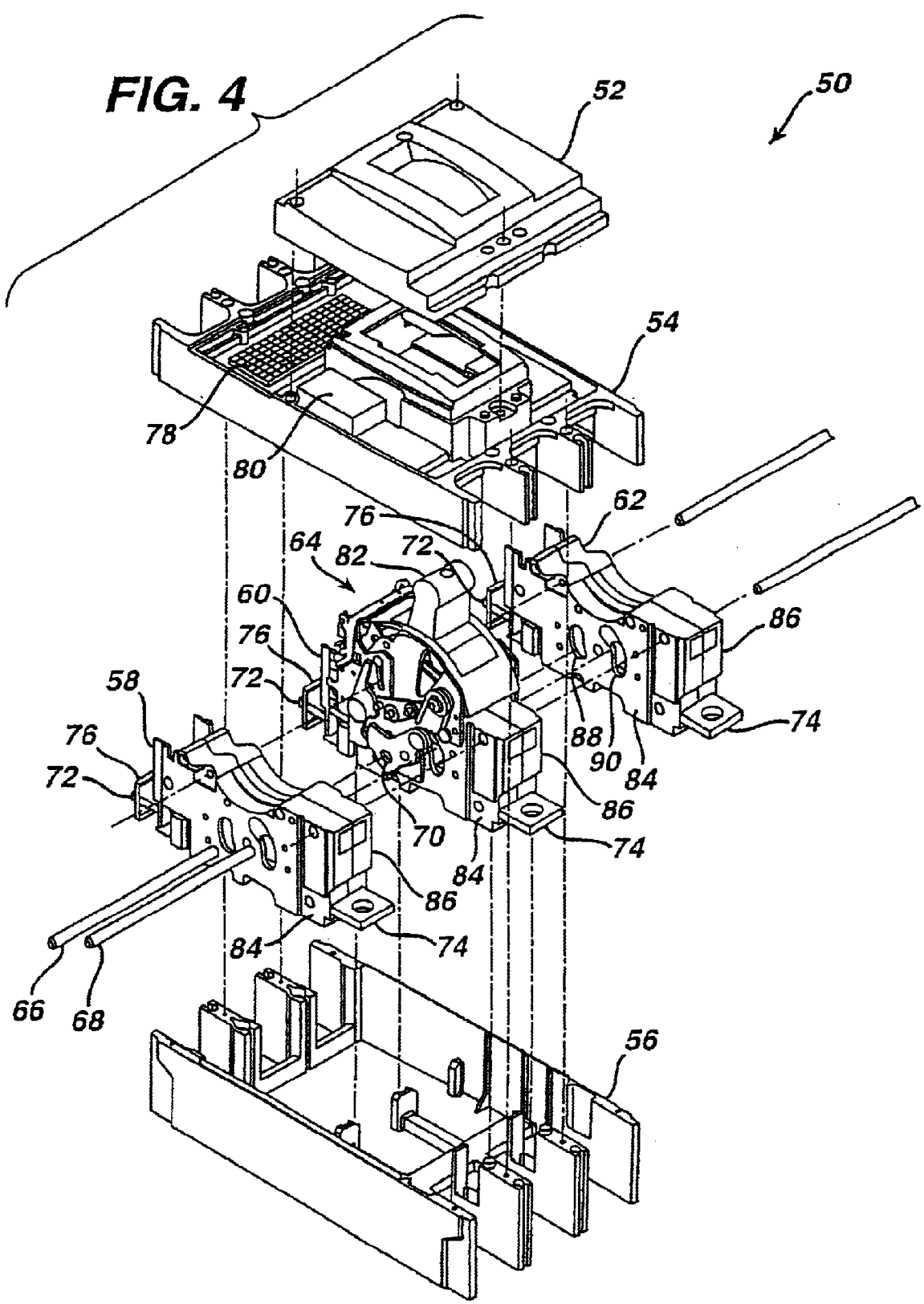
FIG. 4 is an exploded view of the circuit breaker of FIG. 1.
Figure 5:
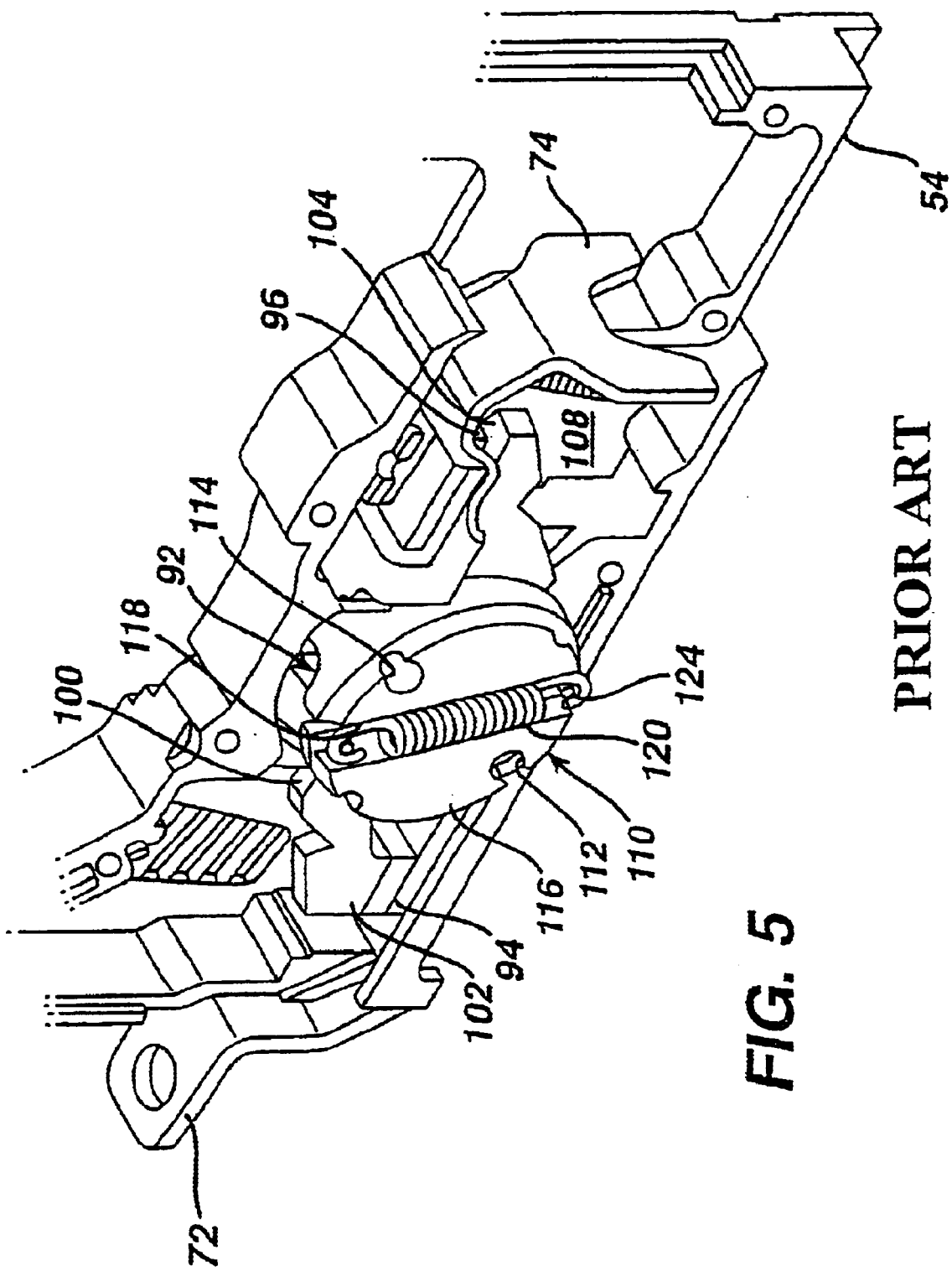
FIG. 5 is a partial sectional view of a rotary contact structure and operating mechanism.
Figure 6:
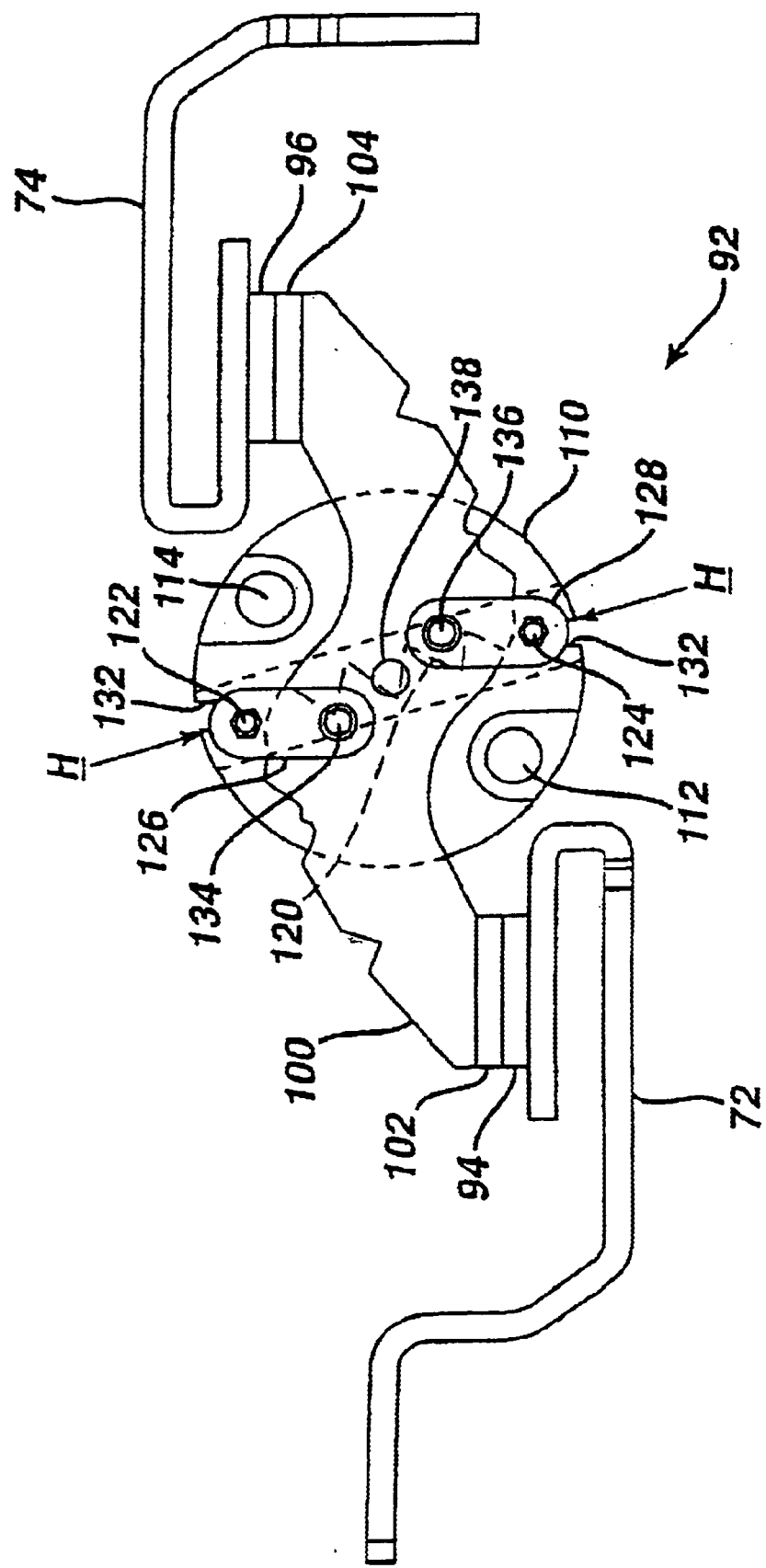
FIG. 6 is an enlarged side view of a rotary contact structure in the "closed": position.
Figure 7:
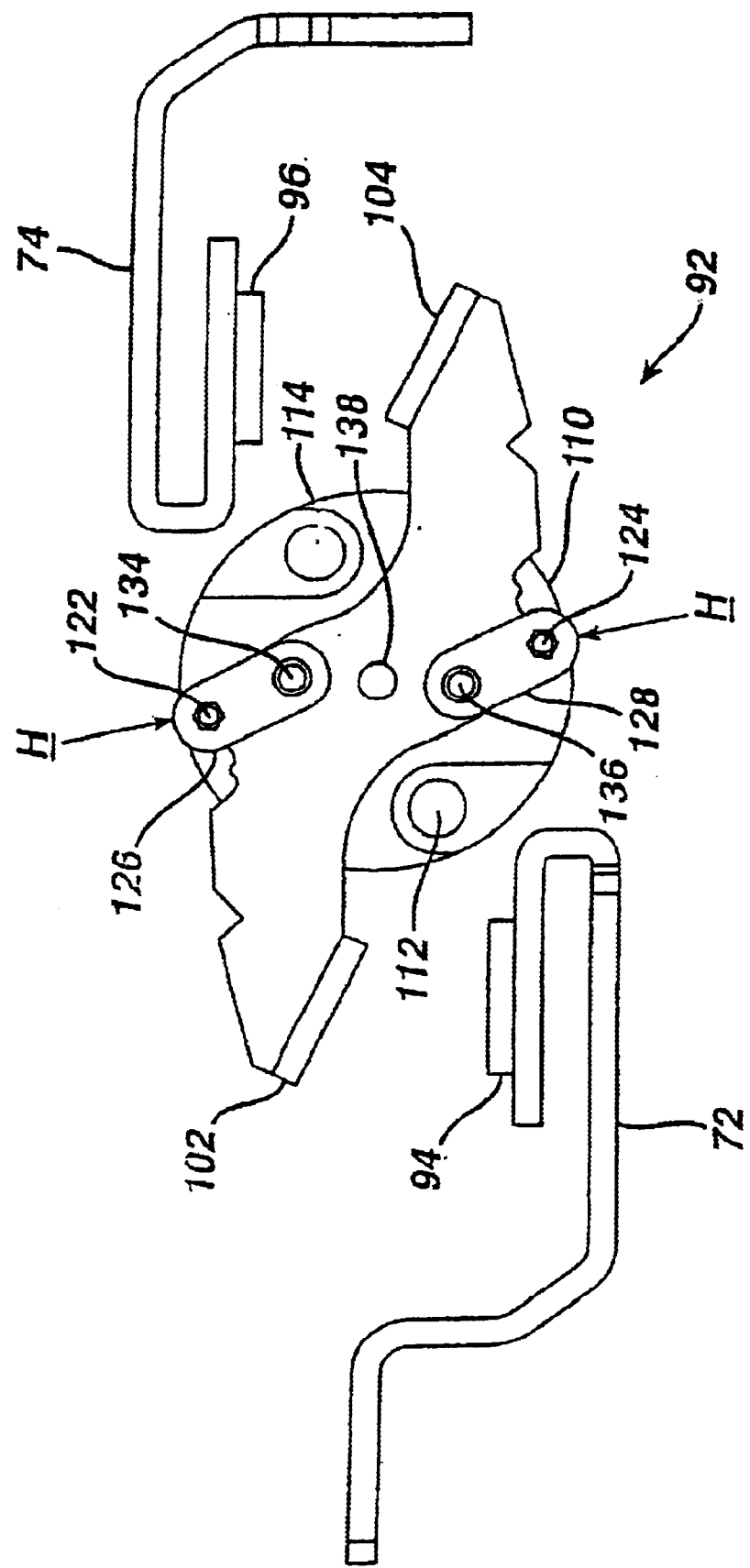
FIG. 7 is an enlarged side view of a rotary contact structure in the "open" position.
Figure 8:
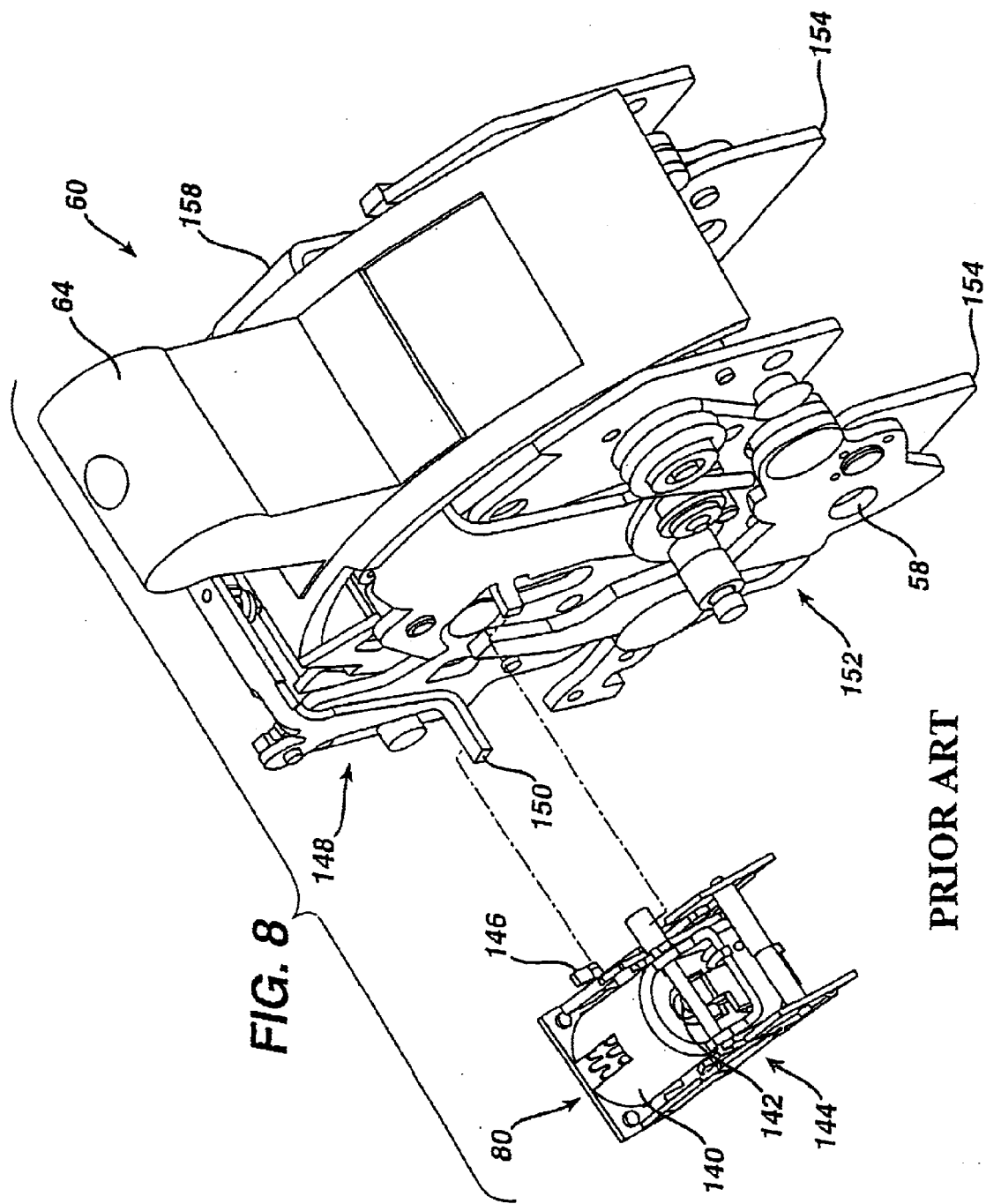
FIG. 8 is an isometric view of an operating mechanism and an actuator employed within the molded case circuit breaker of FIGS. 3 and 4.
Figure 9:
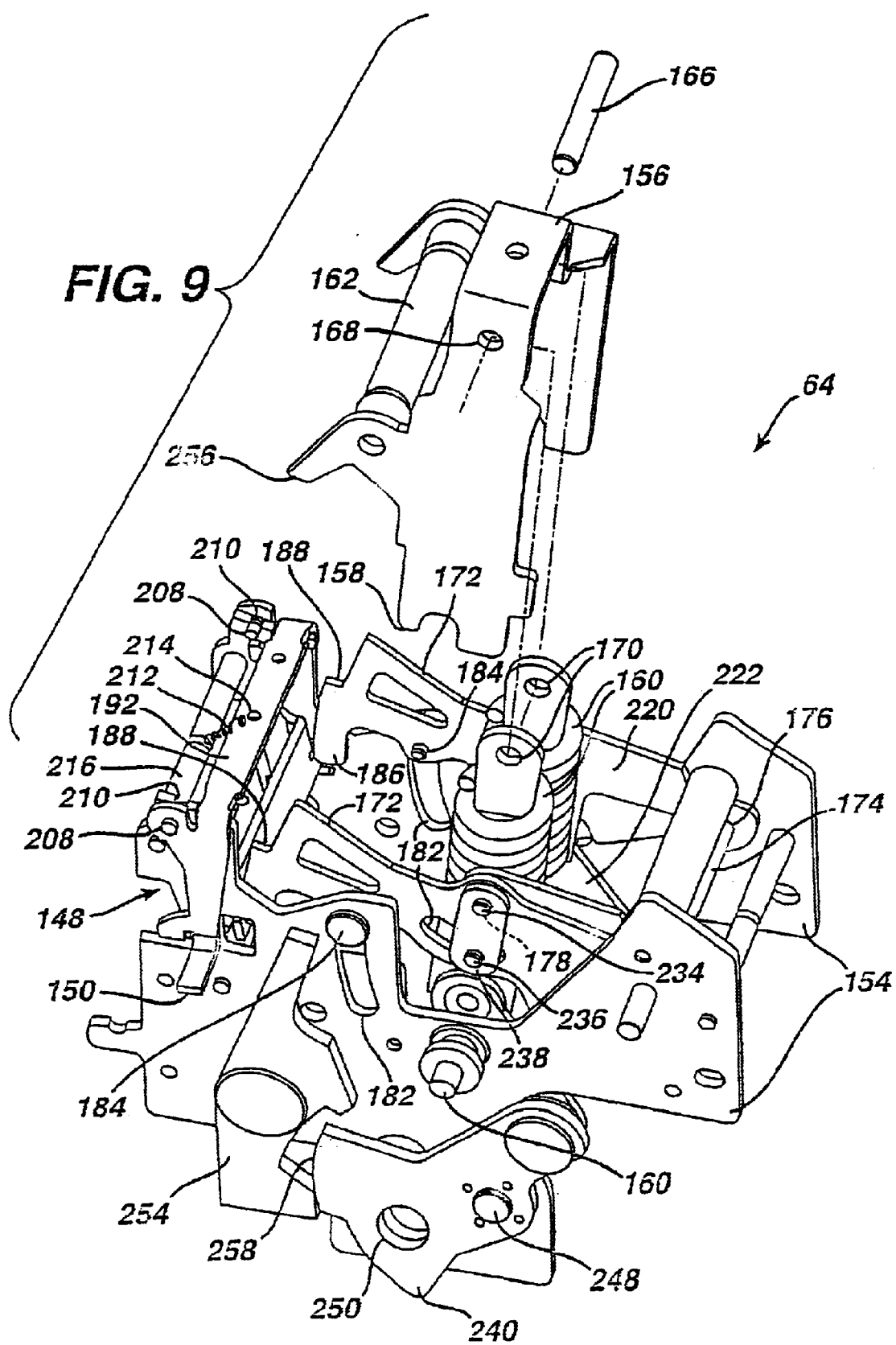
FIG. 9 is a partially exploded isometric view of the operating mechanism of FIG. 8.
Figure 12:
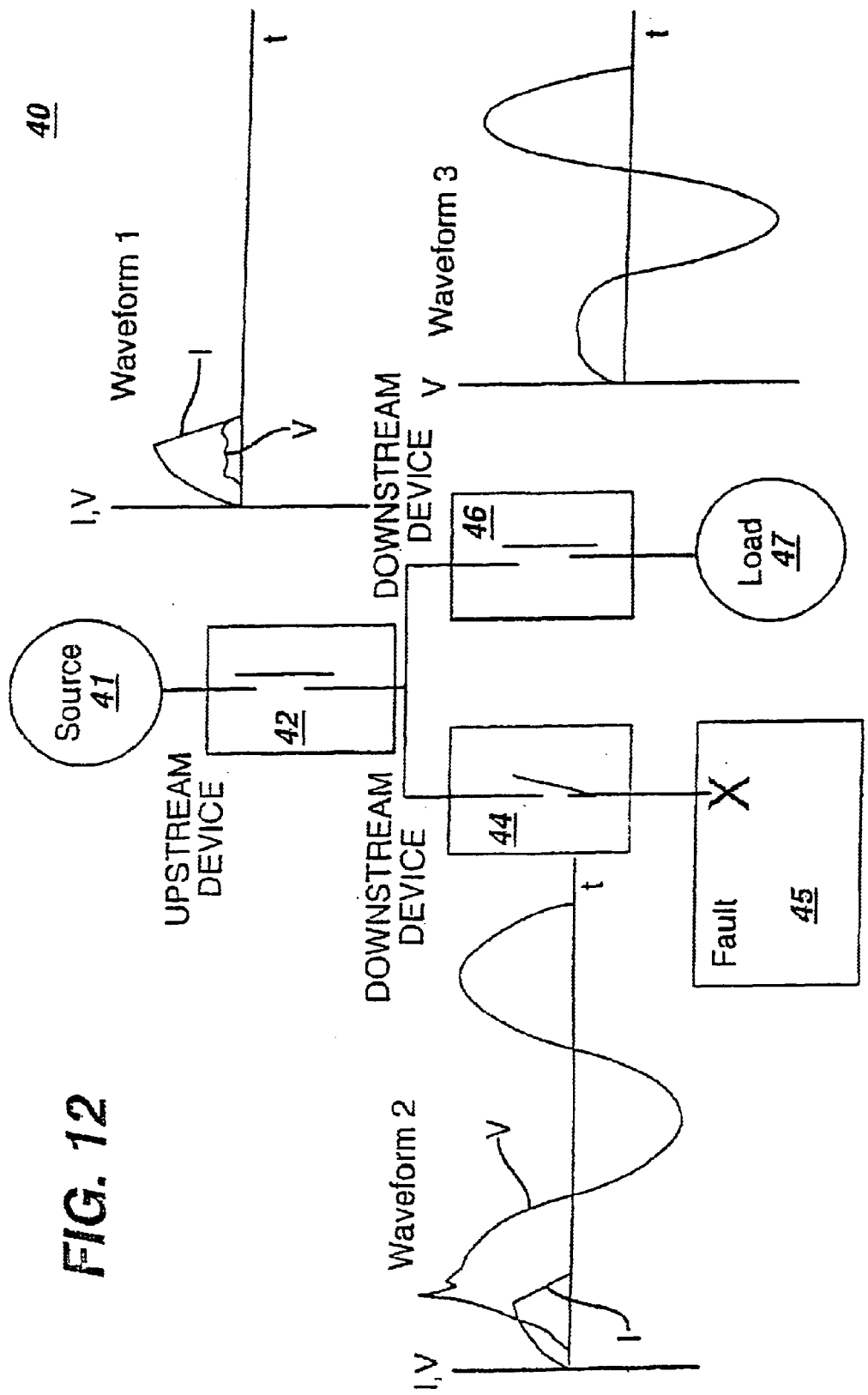
FIG. 12 is a fault scenario for the two tier electrical distribution system shown above with respect to FIG. 1.

A method and apparatus that is capable of performing analysis on electrical distribution selective systems is provided herein. The analysis takes into account overall system variations due to faults in downstream devices. Referring now to FIG. 12, a fault scenario is shown for the two tier electrical distribution system shown above with respect to FIG. 1.

A fault occurs at load 45. This fault (e.g., a short-circuit in the magnitude of 10 times I (nominal) to 150 times I (nominal) in the system operating at approximately 200 amperes I (nominal) quiescent) causes downstream devices 44 to open. A waveform 2 represents a current (I) through device 44 and a voltage (V) across device 44 at the time during the fault event (e.g., approximately five milliseconds) and the time after the fault event. While downstream device 44 opens and protects load 45, upstream device 42 remains closed. This ensures selectivity within system 40 and continuity of power to load 47 through downstream device 46. The current and voltage through upstream device 42 is represented in a waveform 1 (note that the scale of waveform one is such that the nominal current that continues to service load 47 is not visible because of the magnitude of the short-circuit condition as compared to the magnitude of quiescent current flow). The short circuit current at downstream device 44 is reflected in waveform 1. This accounts for the increased conduction voltage drop across device 42. This voltage drop is generally due to the popping action of upstream device 42, wherein the increased current causes the contact arm to begin to separate, and the separation increases the resistance of device 42, and accordingly the voltage increases. Due to this voltage drop, there is a voltage sag at load 47 as shown in waveform 3, which represents the system voltage to load 47. The voltage sag at load 47 is due to the change in the ratio of the system and device resistance. That is, during quiescent operation, the loads (e.g., load 47) account for most of the resistance whereas the source (e.g., source 41 and upstream device 42) account for little of the resistance. Upon occurrence of a short circuit, the source accounts for most or all of the resistance and the load accounts for little or none of the resistance.

To perform the analysis, data is required regarding the dynamic response of devices 42, 44 and 46. However, since the devices act or are effected simultaneously, studies are complex. To facilitate the selectivity analysis, a model of the devices (i.e., the circuit breakers) is generated. The model can be created, for example, as described herein and in U.S. patent application Ser. No. 09/528,175 entitled "Circuit Interruption Modeling Method and Apparatus" (General Electric Docket No. RD-27,595). Of course, it is understood that each circuit breakers can be represented with a transfer functions representing the input and output to each devices. Conventionally, these transfer functions are derived by performing fault simulated experiments for various fault conditions and generating one or more look up tables with results. With either technique, the output of upstream device 42 is used in the calculations for the dynamic response of downstream devices 44 and 46; the output of downstream device 44 is used in the calculations for the dynamic response of downstream devices 46 and upstream device 42; and, the output of downstream device 46 is used in the calculations for the dynamic response of downstream devices 44 and upstream device 42. This is reflected in FIG. 12.

Figure 13:
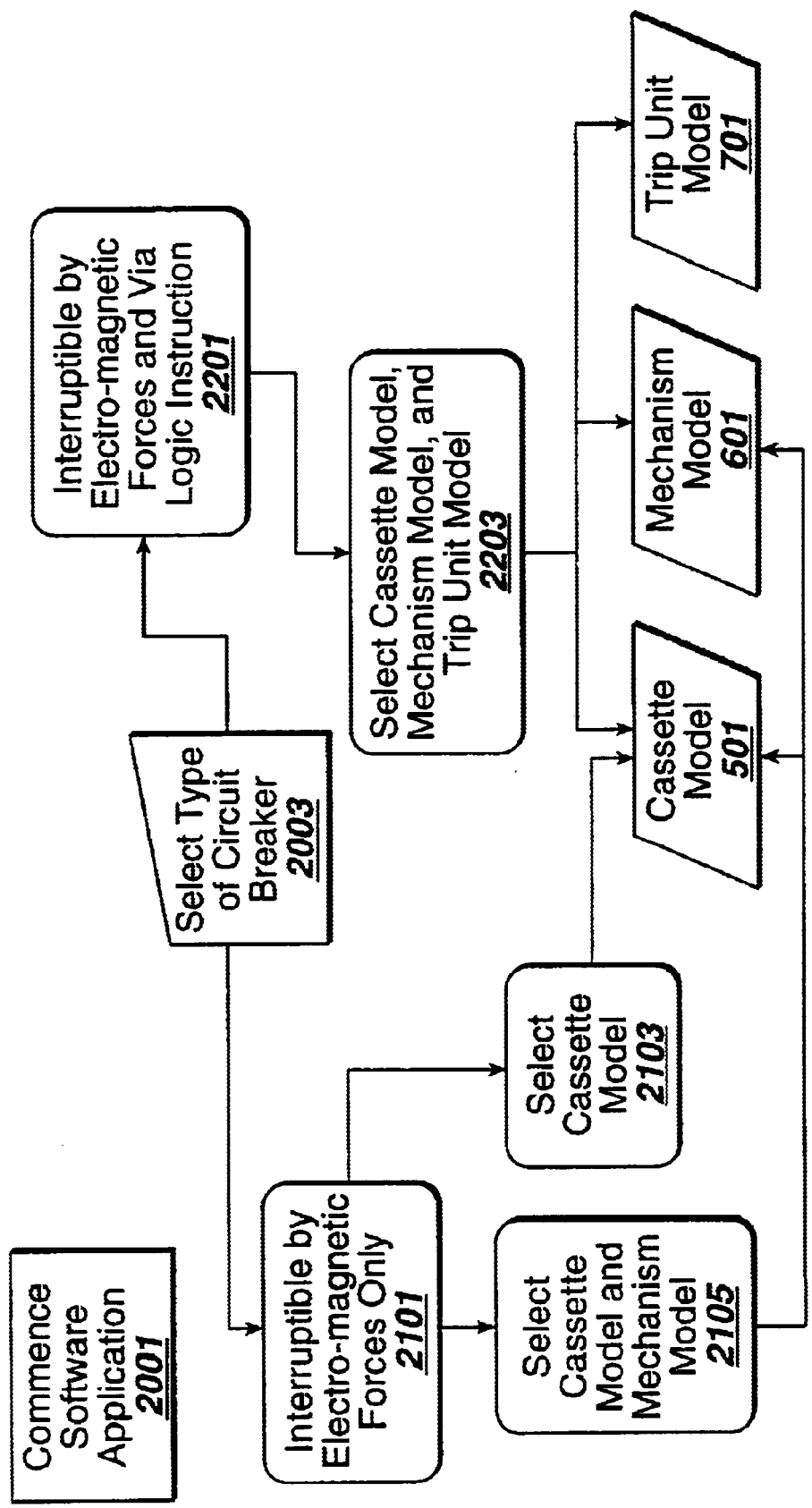
FIG. 13 is a flow diagram representing an embodiment of the modeling method and apparatus of the present invention.

Referring now to FIG. 13, a flowchart outlining steps of modeling a circuit breaker is provided. The circuit breaker modeling described herein employs a software application capable of capturing behavioral and structural characteristics of circuit interrupters and circuit breakers. This is accomplished generally by providing an editor for inputting desired system properties. When certain groupings of properties (e.g., component level models, sub-assembly level models, interrupter models, load models, source models, distribution models, system models) are generated, they can be used, for example, with a simulator as described herein. Furthermore, the certain groupings can be stored in a database as models, which can subsequently be used.

In one embodiment, the resultant model is capable of merging with a system performance simulator. The simulator is capable of providing inputs to the model and generating the outputs, and, in certain embodiments, outputs of certain models are linked to other models. Additionally, parameters can be set representing system properties (e.g., maximum short circuit current, peak voltages, closing angle, power factor, line frequency). This is accomplished generally by incorporating a solver system within the software application. A model can be embedded within the software application and fed the inputs and linked to the solver, or can be embedded within the solver system. A model embedded in the software application can be within a database, or can be generated with an assembler or assembler system. The input can be presented from a direct user interface, or can be provided from a source such as a database, or model of a device (or output of a model of a device) that would typically provide input to the model (e.g., a source, load, distribution device of other protection device).

The particular software application employed for the modeling described herein is Saber®, including SaberDesigner®. It is, of course, understood that other suitable software applications capable of designing and integrating multiple engineering attributes (e.g., electrical, electronic, digital, logical, electromagnetic, magnetic, mechanical, thermal, fluid, and/or hydraulic) can be employed.

At block 2001, the software application is launched by the user. This can be achieved by opening the core software application, wherein the user subsequently selects a previously generated circuit breaker application, for example, from a schematic file. Alternatively, the circuit breaker application can be selected directly, wherein the core software application opens directly to the circuit breaker application.

As described in the Background of the Invention, the various components of the circuit breaker have different structural and behavioral aspects, including electrical, electronic, digital, logical, electromagnetic, magnetic, mechanical, thermal, fluid, and/or hydraulic. The aspects that must be modeled depend on the particular type of circuit breaker. Therefore, at block 2003, the user selects generally the type of circuit breaker to be modeled.

If, for example, only overcurrent conditions generating high loop and constriction forces at the contacts are to be protected, the user would so indicate and be directed to a block 2101. At block 2101, the user selects a circuit interrupter model including a cassette model at block 2103, or a cassette model and a mechanism model at block 2105. Where a cassette model alone is sufficient to model the breaker, a selection of a cassette model 501 is effectuated at block 2103. Where a cassette model and mechanism model are used to model the breaker, for example, if resetting action is to be modeled, or in the case of air breakers where the mechanism is a mass elastic unit, a selection of a cassette model 501 and a mechanism model 601 is effectuated at block 2105. The user selections for cassette model 501 or mechanism model 601, or for one or more components cassette model 501 or mechanism model 601, are made from a library or group of libraries of components as described herein.

When additional and/or supplemental circuit interrupter protection is modeled, the decision would be made at block 2003 to choose the circuit breaker interruptible by electromagnetic forces and upon occurrence of one or more predefined trip events, indicated at block 2201. Here, the user would select a cassette model, a trip unit model, and a mechanism model, indicated at block 2203. The cassette model employed is represented at block 501 (i.e., the same or different cassette model as selected according to blocks 2103 or 2105); the mechanism model employed is represented at block 601 (i.e., the same or different cassette model as selected according to block 2105); and, the trip unit model employed is represented at block 701.

Figure 14:
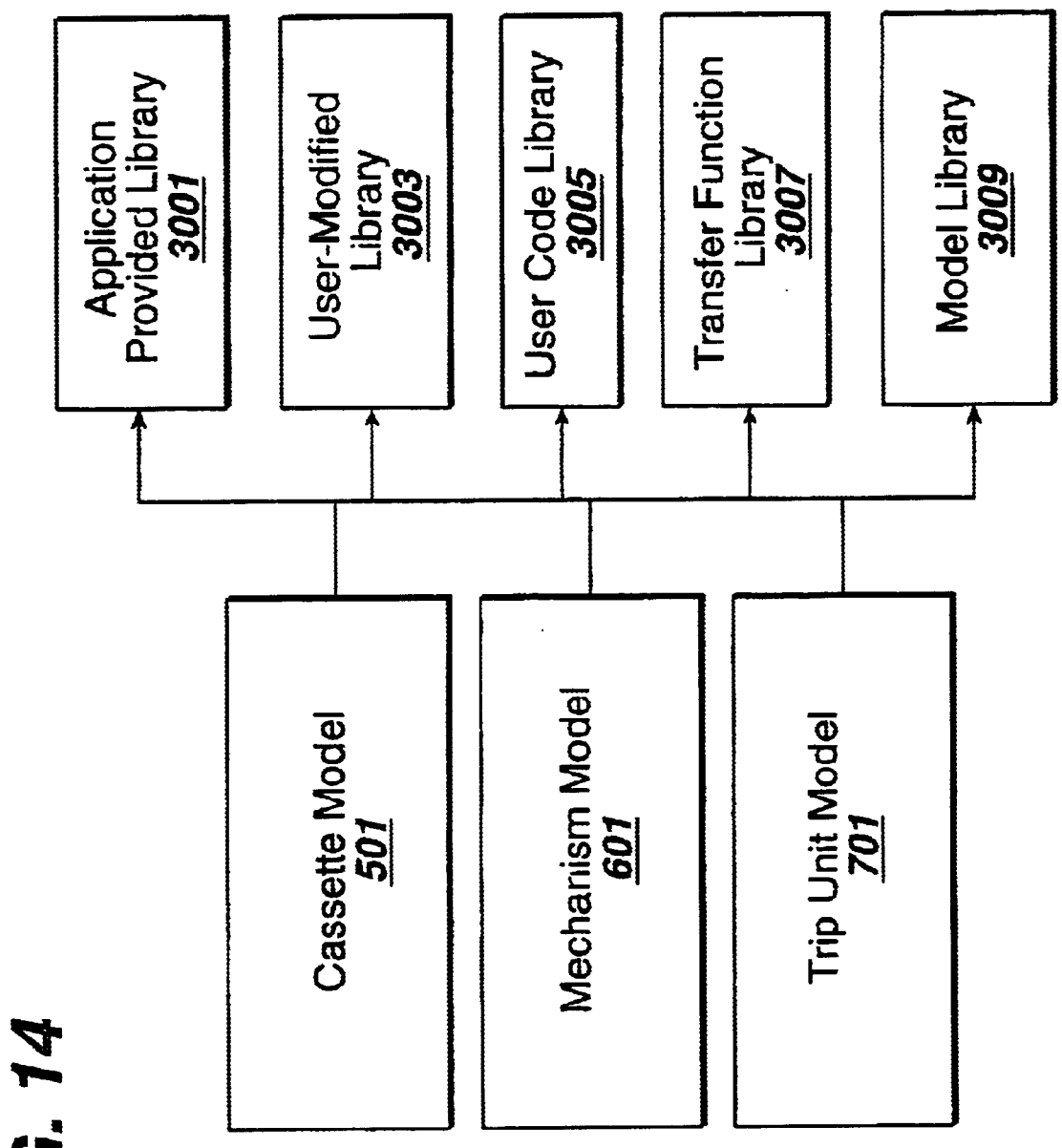
FIG. 14 is a flow diagram representing an embodiment of sub-assembly model selection.

Referring now to FIG. 14, the selection of cassette models 501, mechanism models 601, or trip unit model 701 from various libraries is generally shown. The user can select models wholly from a model library 3009. Alternatively, the user can select various component or part models and assemble a model from those component or part models. These various component models are user generated, for example, with an editor provided by the application; selected from one or more libraries such as an application provided library (3001), a user-modified library (3003), a user code library (3005), a transfer function library (3007), or a model library (3009); or, both user generated and selected from one or more libraries. When a model has been created, that model can be saved in an appropriate library for future use.

As described herein, the models typically are mathematical representations. These mathematical representations are generally fed certain input variables and produce certain output variables. The variables can reflect tolerances, for example, by being in the format of a probabilistic distribution.

As described herein, the various models that can be generated include system models (e.g., of one or more circuit breakers associated with particular loads and power sources); circuit interrupter models; sub-assembly models (e.g., cassette models 501, mechanism models 601, and trip unit models 701); and, component models (i.e., the models used to generate the sub-assembly models or other component models). Any of the libraries 3001, 3003, 3005, 3007 or 3009 can include circuit interrupter models, sub-assembly models, and component models. In an embodiment described herein, library 3001 generally includes component models; libraries 3003, 3005 and 3007 generally includes sub-assembly models and component models; and library 3009 generally includes system models, circuit interrupter models, sub-assembly models and component models.

The application provided library 3001 represents a group of component models packaged with software application. For example, modeling software such as Saber® includes models of electronic devices (including transistors, MOSFETS, diodes and IGBTs), mechanical devices (including mechanical stops, mechanical frictions, gears, cam followers, and springs), magnetic devices (including linear and non-linear cores, windings, and transformers), electro-mechanical devices (including relays, solenoids, and motors), and hydraulic devices (including valves and reservoirs).

The user modified library 3003 represents a library of sub-assembly models or component models selected from the application provided library 3001 (or a similar such library) and user modified to suit particular design or simulation needs. With Saber® modeling software, for example, a code language is provided (e.g., MAST® Hardware Description Language). Thus, the user can edit code (e.g., with an appropriate editor) for a particular library component model and the modified component model can be stored in the user modified library 3003. Alternatively, a component model selected from a library such as library 3001 can be graphically represented on the screen wherein certain behavioral and/or structural parameter variables are user inputted. Once a set of parameters has been entered, the tailored component model can be stored in the user modified library 3003.

User code library 3005 can include sub-assembly models and component models wherein the user has generated code for a sub-assembly model or a component model. Parts modeled and stored in user code library 3005 can be generated by, e.g., MAST® Hardware Description Language, VHDL (Verilog Hardware Description Language), VHSIC HDL (Very High Speed IC Hardware Description Language), Fortran, C, C++, Java, ASIC, or any appropriate code language that can be translated to be compatible with the software application employed. This user code library adds much flexibility to the types of parts or components that can be modeled. The user code library 3005 is particularly useful for storing models of digital implementations or algorithmic implementations within circuit interrupters, such as trip unit codes and other controller codes.

Transfer function library 3007 can include sub-assembly models and component models represented as transfer function. Generally, a transfer function is the relationship between the input and the output of a system or subsystem. The transfer function can be a code script and embedded as a separate model, it can be tied within other code, or it can be presented separately in the software application to tie various components together, or co-simulated by a separate solution software package linked to the primary solver. Models within transfer function library 3007 can include, for example, mathematical relationships or look up tables corresponding with data generated by FEA (finite element analysis) or CFD (computational fluid dynamics).

Model library 3009 can include stored system models, circuit interrupter models, sub-assembly models, or component models. When an individual sub-assembly model, circuit interrupter model, or system model is generated, that model may be stored in model library 3009 and later reused. The models stored within model library 3009 can be generated by code alone or in combination with one or more model parts from any library 3001, 3003, 3005 or 3007. Furthermore, a model within model library 3009 can be generated from another model within model library 3009.

Cassette model 501 can be selected as a sub-assembly model directly from one of libraries 3003, 3005, 3007 or 3009. Alternatively, cassette model 501 can be built using component models from one or more libraries 3001, 3003, 3005, 3007 or 3009. Mechanism model 601 and trip unit model 701 can likewise be subassembly models or built from component models.

In the case where a system model is desired, for example, to analyze a selective system, one or more circuit interrupter models can be selected directly from model library 3009.

Once a particular system model, circuit interrupter model, subassembly model, or component model has been generated, that model can be included within the appropriate library. One or more component models selected from one or more libraries can generate a sub-assembly model. The generated sub-assembly model can then be stored in model library 3009. A circuit interrupter model can also be generated by one or more sub-assembly models selected from one or more libraries and the generated model can then be stored in model library 3009. Additionally, a system model can also be generated by one or more circuit interrupter models selected generally from model library 3009 and the generated system model can then be stored in model library 3009.

Furthermore, individual component models can be stored in the model library 3009. For example, as described above, a library element from library 3001 can be modified or set and stored in user modified library 3003. This element can also be stored in library 3009 if appropriate. Storage in library 3009 may be desirable to streamline the user selection process by storing frequently used elements therein. Likewise, user generated code can be stored in user code library 3005 or model library 3009, and transfer functions can be stored in transfer functions library 3007 or model library 3009.

Figure 15:
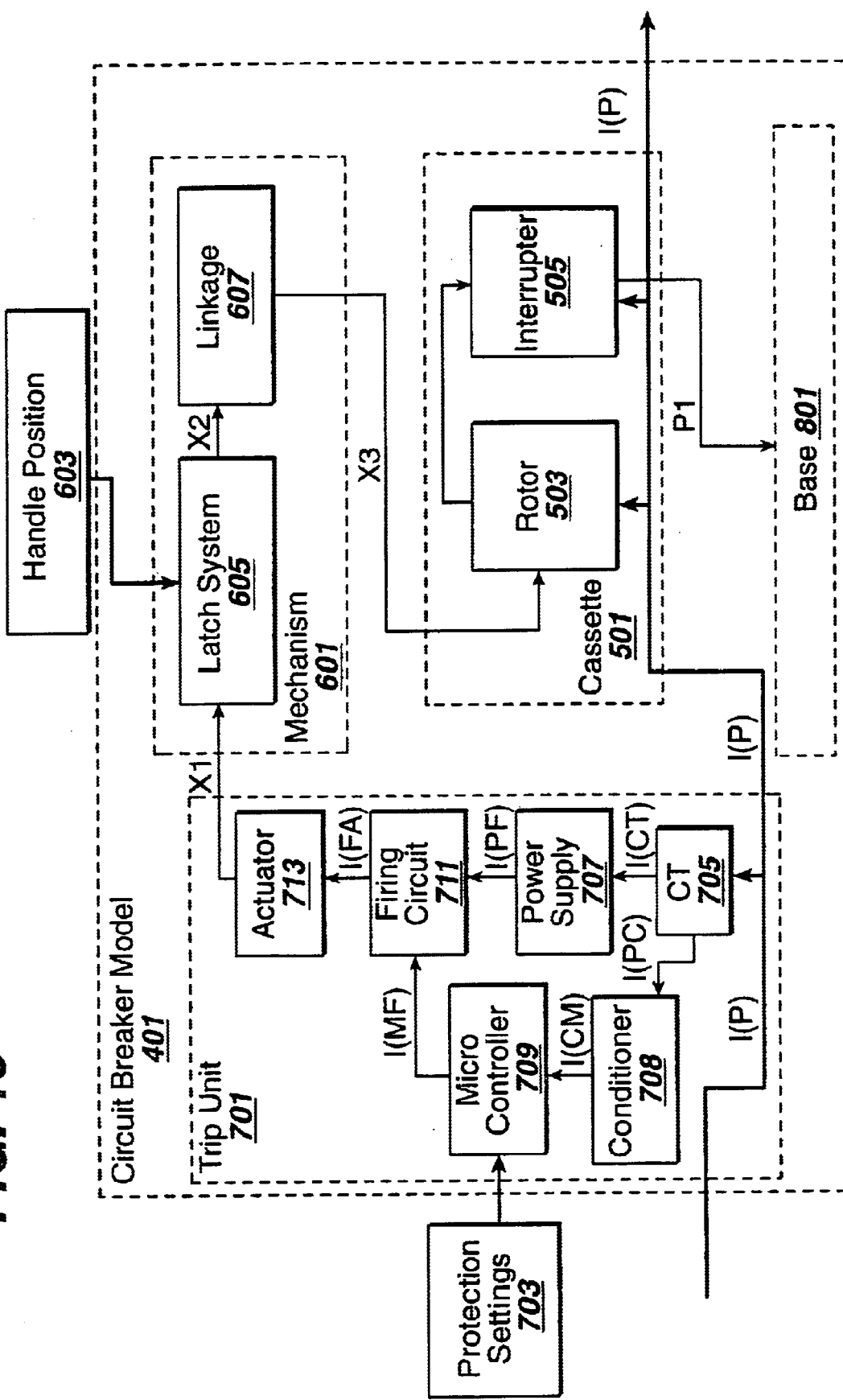
FIG. 15 is a component flow diagram of a circuit breaker model generally showing the sub-assembly models and respective component models.

A component block diagram of a circuit breaker is shown in FIG. 15. This block diagram will be used to describe an embodiment of a circuit breaker model 401. Major components are represented by cassette model 501, mechanism model 601, and trip unit model 701. Also represented is a base block 801 which represents the physical geometries of the circuit breaker housing and cassette housing in certain embodiments. The component models that comprise trip unit model 701 include a current transformer model 705, a power supply model 707, a conditioning model 708, a micro controller model 709, a firing circuit model 711, and an actuator model 713. Also, a protection settings block 703 is coupled to micro controller model 709 serving to provide, for example, external settings. The component models that comprise mechanism model 601 include a latch assembly model 605 and a linkage model 607. The component models that comprise cassette model 501 comprise a rotor model 503 and an interrupter model 505.

The modeling approach described herein captures various aspects of the circuit breaker. The trip unit model 701 captures the electrical, electronic, and electro-mechanical aspects, including, for example, current transformer 76, electronic trip unit 78 and actuator 80 described above. The cassette model 501 captures the electrical, electro-magnetic, thermal, gas, and electro-dynamic aspects of, for example, cassettes 58, 60 and 62 and their components. The mechanism model 601 captures the mechanical dynamics of, for example, operating mechanism 64. The base block 801 captures the structural aspects, of for example, base 56 and mid cover 54. While certain components and subcomponents of a circuit breaker are shown, the modeling described and implemented herein functions effectively with the implementation of fewer, additional or different components or subcomponents.

Figure 10:
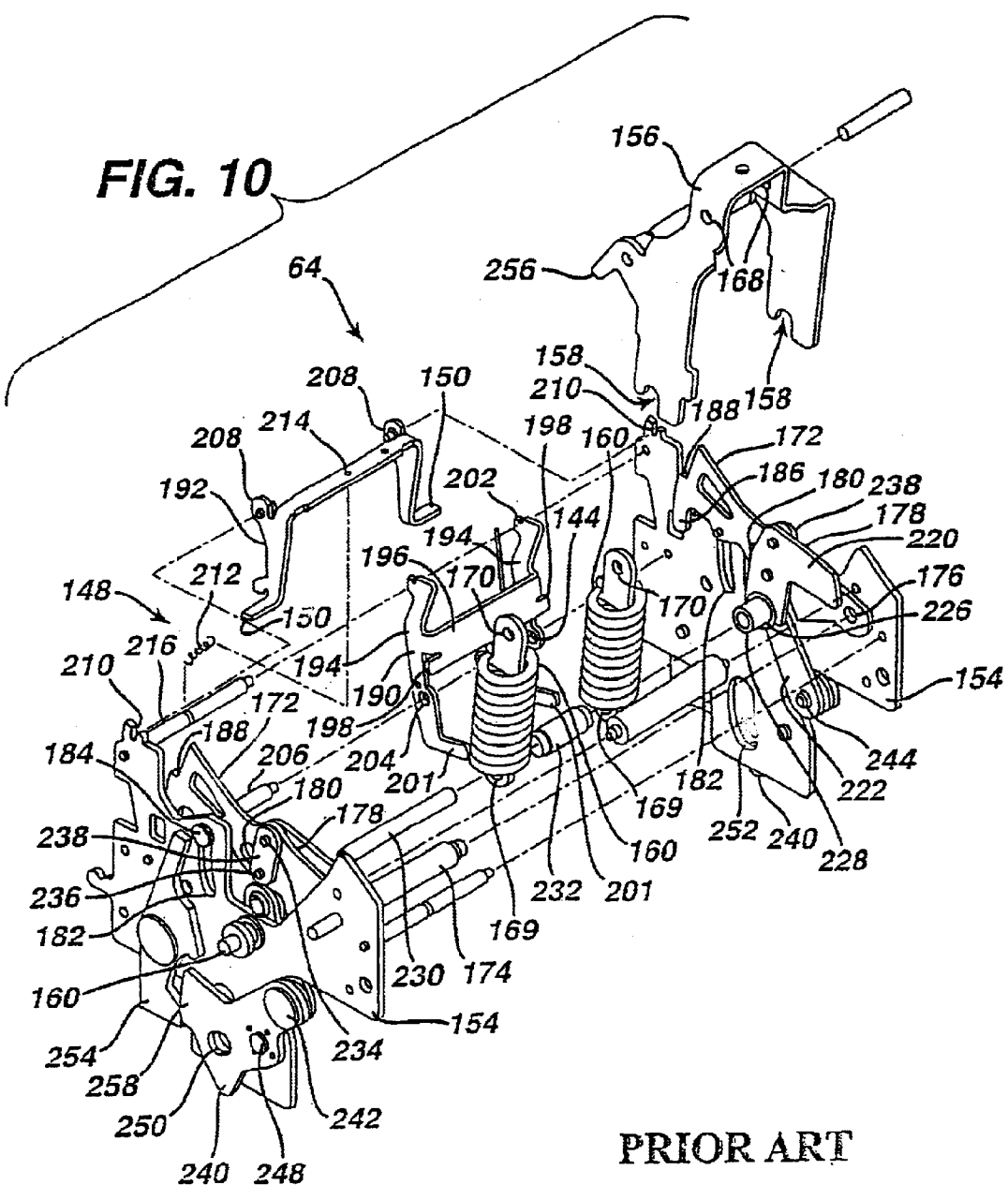
FIG. 10 is an exploded isometric view of the operating mechanism of FIG. 8.
Figure 11:
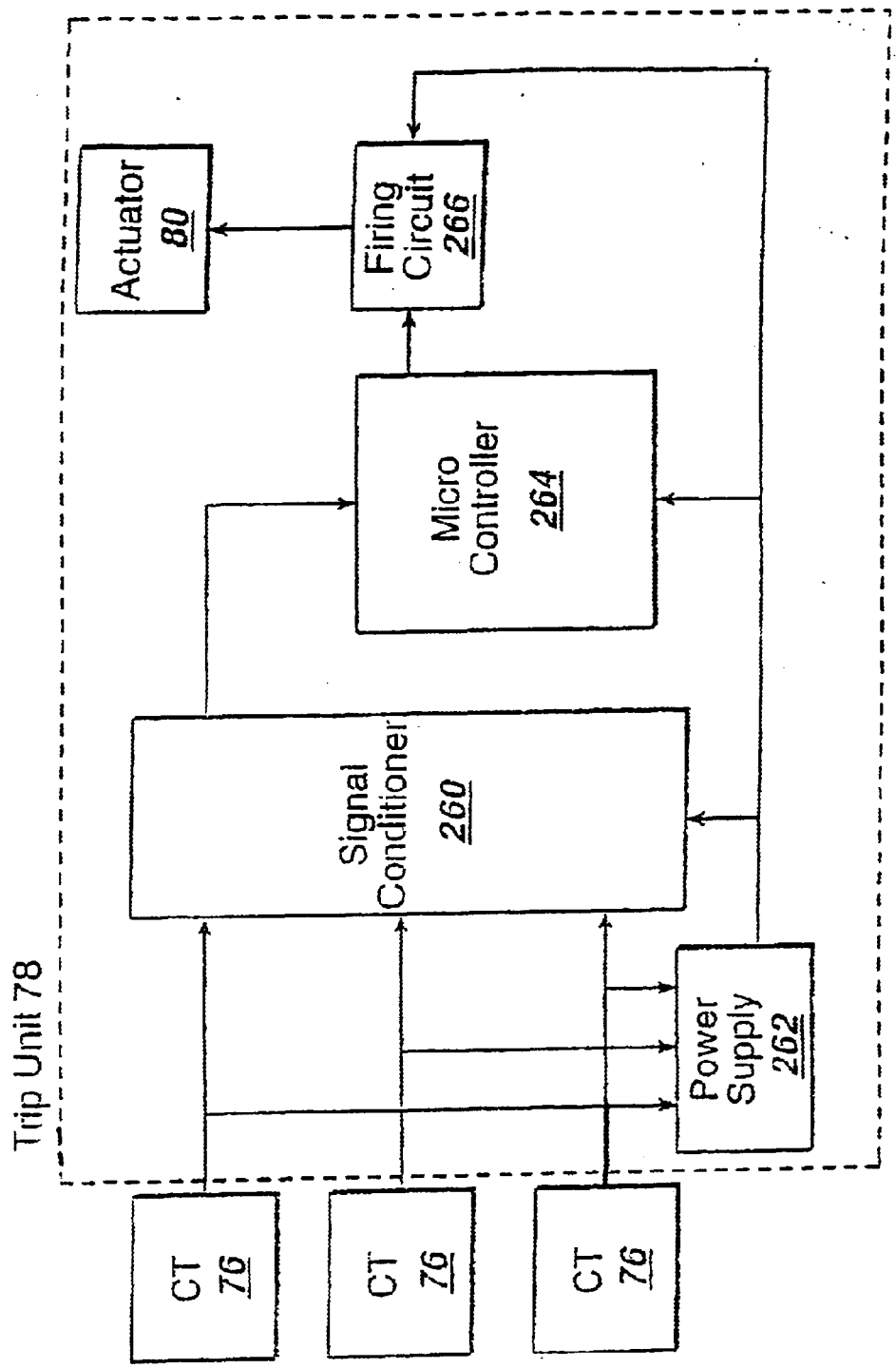
FIG. 11 is a block diagram of an exemplary electronic trip unit employed within the molded case circuit breaker of FIG. 3.

Circuit interrupter models have been implemented wherein the trip unit model 701 was eliminated or substituted. Where the electronic trip unit model 701 was eliminated, the model is of a circuit interrupter whereby current flow through movable contact arm 100 is interrupted by way of electro-magnetic forces that blow open the contacts (i.e., loop forces and constriction forces strong enough to overcome the contact pressure generally exerted by contact springs 120). This modeling selection is generally shown in FIG. 10 at blocks 2101, 2103 and 2105. Alternatively, current transformer 76 and electronic trip unit 78 and can be substituted with another sensing and tripping means, such as a thermal-magnetic unit. A thermal-magnetic unit employs a thermal element such as a bimetal to sense the current and trip in the case of an overload current and a magnetic element to provide a force to trip the circuit interrupter in the case of a short circuit condition.

In one embodiment, trip unit model 701 represents an electronic trip unit such as trip unit 78 described in the Background of the Invention. A variable I(P) representative of a primary current is fed through trip unit model 701 and cassette model 501. Each component model is linked together generally with pertinent variables.

Trip unit model 701 is linked to mechanism model 601 by a displacement variable X1 (e.g., transmitting a force from actuator trip tab 146 to secondary latch trip tab 150). The mechanism model 601 is linked to the cassette model 501 by a displacement variable X3 (e.g., transmitting a force via crossbars 66, 68 to rotor 110). The cassette model 501 is linked to the base model 801 by a pressure variable P1 (e.g., the pressure exerted by the fluid flow from the arc handling portions 106, 108).

Parameter settings for the electronic trip unit model 701 are also indicated and are controllable at protection setting block 703. Protection setting block 703 can represent, for example, setting provided by a rating plug, switch, or internal setting within micro controller 264 of trip unit 78. Additionally, a handle position block 603 is shown relative to the mechanism model 601, which represents the state of the mechanism, for example, the position of toggle handle 82.

Each sub-assembly model is generated with one or more components selected from one or more libraries 3001, 3003, 3005, 3007 and 3009, as described above and indicated at FIG. 14. The modeling choice for each individual element depends on a variety of factors including, but not limited to, desired modeling accuracy level, complexity of the selected element, or availability of modeling choices for a particular element. Component models comprise either a single component model; a combination of similar types of component models; or, a combination of different types of component models.

Upon modeling of an individual sub-assembly (e.g., the cassette, the electronic trip unit, or the mechanism), that sub-assembly model may be stored in, e.g., model library 3009 and reused to rebuild a model of a similar circuit breaker, or to build a model of a different circuit breaker using that sub-assembly model, or variation of that sub-assembly model.

In the circuit interrupter model illustrated, the trip unit model 701 is the control block within a circuit breaker. The simulated current I(P) is fed to trip unit model 701 via current transformer model 705. Current transformer model 705 accounts for aspects including electrical and magnetic aspects of current transformers. A variable I(CT) is a simulated current from current transformer model 705 to power supply model 707, representing a current value provided from one or more current transformers (such as current transformers 76 described in the Background of the Invention) to a power supply (such as power supply 262 described in the Background of the Invention).

Power supply model 707 models a power supply within the electronic trip unit, e.g., power supply 262 within trip unit 78, and accounts for aspects including electrical aspects of power supplies. Power supply model 707 generally receives the simulated current value I(CT) from current transformer model 705 and produces a simulated current value as a variable I(PF), for example, representing the energizing power lead from power supply 262 to firing circuit 266 as described in the Background of the Invention. Additionally, a variable I(PC) is a simulated current from power supply model 707 to conditioner model 708, representing current value provided from a power supply to a signal conditioner (such as signal conditioner 260 described in the Background of the Invention).

Conditioner model 708 generally represents a signal conditioner (e.g., signal conditioner 260), and accounts for aspects including electrical aspects of signal conditioners. A variable I(CM) is a simulated current value from conditioner model 708 to micro controller model 709, representing a conditioned current signal fed from a signal conditioner to a micro controller (such as the signal conditioner 260 feeding a signal to micro controller 264 described in the Background of the Invention).

Micro controller model 709 generally represents a micro controller (e.g., micro controller 266) and associated electronics (e.g., signal conditioner 260 and A/D converter 264). Micro controller model 709 accounts for aspects including electronic aspects of a trip unit (such as trip unit 78). Micro controller model 709 simulates the processing of I(CM) fed from current transformer model 705.

A simulated signal current, for example, representing a signal current from micro controller 264 to firing circuit 266 as described in the Background of the Invention, is outputted as a variable I(MF) by micro controller model 709 to firing circuit model 711 generally under attainment of modeled protection settings represented in block 703. Firing circuit model 711, which accounts for aspects including electrical aspects of a trip unit (such as trip unit 78), outputs a variable I(FA) to actuator model 713. Actuator model 713 represents an actuator (e.g., actuator 80) and accounts for aspects including electro-mechanical aspects of a trip unit (such as trip unit 78).

Displacement variable X1 is outputted from actuator model 713 generally to mechanism model 601. Specifically, X1 is coupled to a latch system model 605 (e.g., representing latch assembly 148 described in the Background of the Invention) within mechanism model 601. Latch model 605 outputs another displacement variable X2 to a linkage model 607 (e.g., representing the various linkages within operating mechanism 64 described in the Background of the Invention) within mechanism model 601. Displacement variable X3 is outputted from linkage model 607 generally to cassette model 501, and specifically to rotor model 503. It should be noted that the representation of displacement variable X2 can be eliminated, for example, when mechanism model is simplified and does not include a separate latch model 605 and linkage model 607.

Figure 16:
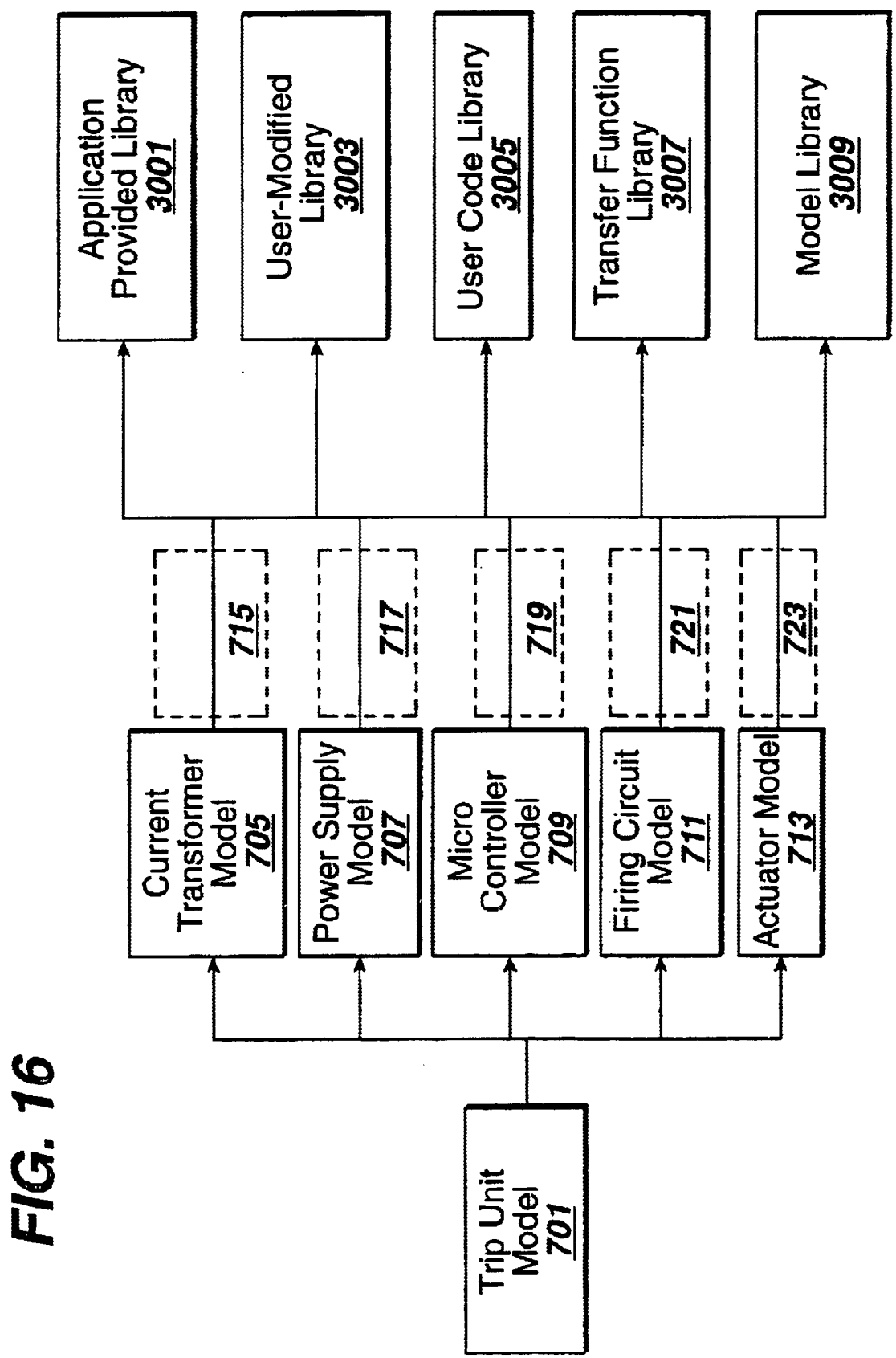
FIG. 16 is a flow diagram representing an embodiment of component selection within a trip unit model.

Referring now to FIG. 16, the various component models within trip unit model 701 will be described in greater detail. As mentioned above, each component model can be generated from one or more other component models selected from one or more libraries 3001, 3003, 3005, 3007 and 3009. This is represented generally by dashed blocks 715, 717, 719, 721 and 723. Alternatively, each component model 705, 707, 709, 711, and 713 can be selected wholly from one or more libraries 3001, 3003, 3005, 3007 and 3009. Specifically, current transformer model 705 can be selected directly from one or more libraries 3001, 3003, 3005, 3007 or 3009, or, alternatively, current transformer model 705 can be built (e.g., as represented in block 715) from component models selected from one or more libraries 3001, 3003, 3005, 3007 or 3009. Power supply model 707 can be selected directly from one or more libraries 3001, 3003, 3005, 3007 or 3009, or, alternatively, power supply model 707 can be built (e.g., as represented in block 717) from component models selected from one or more libraries 3001, 3003, 3005, 3007 or 3009. Conditioner model 708 can be selected directly from one or more libraries 3001, 3003,

3005, 3007 or 3009, or, alternatively, conditioner model 708 can be built (e.g., as represented in block 717) from component models selected from one or more libraries 3001, 3003, 3005, 3007 or 3009. Micro controller model 709 can be selected directly from one or more libraries 3001, 3003, 3005, 3007 or 3009, or, alternatively, Micro controller model 709 can be built (e.g., as represented in block 719) from component models selected from one or more libraries 3001, 3003, 3005, 3007 or 3009. Firing circuit model 711 can be selected directly from one or more libraries 3001, 3003, 3005, 3007 or 3009, or, alternatively, firing circuit model 711 can be built (e.g., as represented in block 721) from component models selected from one or more libraries 3001, 3003, 3005, 3007 or 3009. Actuator model 713 can be selected directly from one or more libraries 3001, 3003, 3005, 3007 or 3009, or, alternatively, actuator model 713 can be built (e.g., as represented in block 723) from component models selected from one or more libraries 3001, 3003, 3005, 3007 or 3009. In another embodiment, micro controller model 709 is represented using the MAST Hardware Description Language. In this case, the model is implemented using the digital modeling aspect of Saber. The model is behavioral and captures the micro-controller logic. Another level of modeling of the micro-controller is the VHDL modeling, whereas the micro-controller is modeled in much more detail. A much more detailed model of the micro-controller would implement the transistor level details of the micro-controller.

Figure 17:
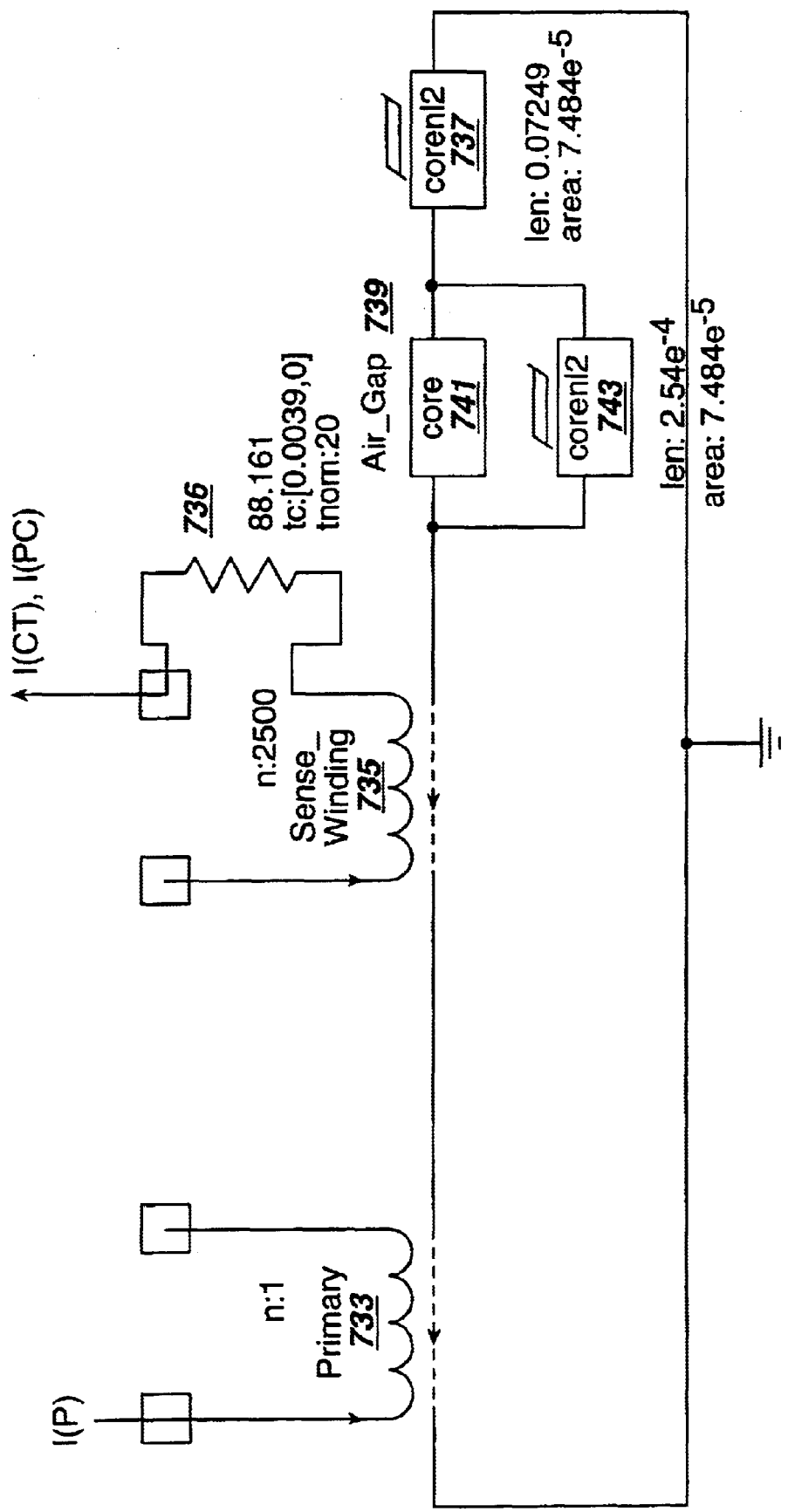
FIG. 17 is a schematic of a current transformer model employed within an embodiment of a trip unit model.

A specific embodiment of trip unit model 701 will now be detailed. A current transformer model 705 is originally generated from a plurality of component models selected from application provided library 3001 and user-modified library 3003, and is schematically represented in FIG. 17. Of course, once generated, current transformer model 705 can be stored in, for example, model library 3009. Referring also to FIG. 15, I(P) is fed into current transformer model 705 and I(CT) is outputted from current transformer model 705.

Current transformer model 705 is based on the magnetic equivalent circuit of the current transformer. Parameters of current transformer model 705 include the number of primary windings 733 and sense windings 735.

As the conducting strap is providing the primary current I(P), primary winding 733 is represented with a single turn (represented in FIG. 17 by the notation "n:1"). Sense winding 735 is represented as an ideal winding having multiple (i.e., 2500) turns (represented in FIG. 17 by the notation "n:2500"). Certain parameters are provided within the application to provide the properties of current transformer model 705. The secondary winding internal resistance 736 is provided as 88.161 ohms. The thermal expansion coefficient (represented in FIG. 17 by the notation "tc") is represented as 0.0039 for the linear term (i.e., Delta T ($\Delta$T))) and at 0 for the square term (i.e., Delta $T^2$). The nominal temperature (represented in FIG. 17 by the notation "tnom") is also provided as 20° C.

To take into account saturation effects of the core material, a non-linear core model 737 is added to current transformer model 705. Model 737 is selected from library 3001 or 3003. Parameters of non-linear core model 737 include the length (represented in FIG. 17 by the notation "len"), which is set at 0.07249 meters and the area, which is set at 7.484e-5 $m^2$. Non-linear core model 737 is based on the Preisach model, which is characterized to fit the non-linear B-H curve.

Furthermore, the current transformer model 705 accounts for the partial air gap in the core by representing an air gap model 739 including a linear core model 741 and a non-linear core model 743. Parameters of non-linear core model 743 include the length (represented in FIG. 17 by the notation "len"), which is set at 2.54e-4 meters, and the area, which is set at 7.484e-5 $m^2$. Non-linear core model 743 is based on the Preisach model characterized to fit the non-linear B-H curve.

Figure 18:
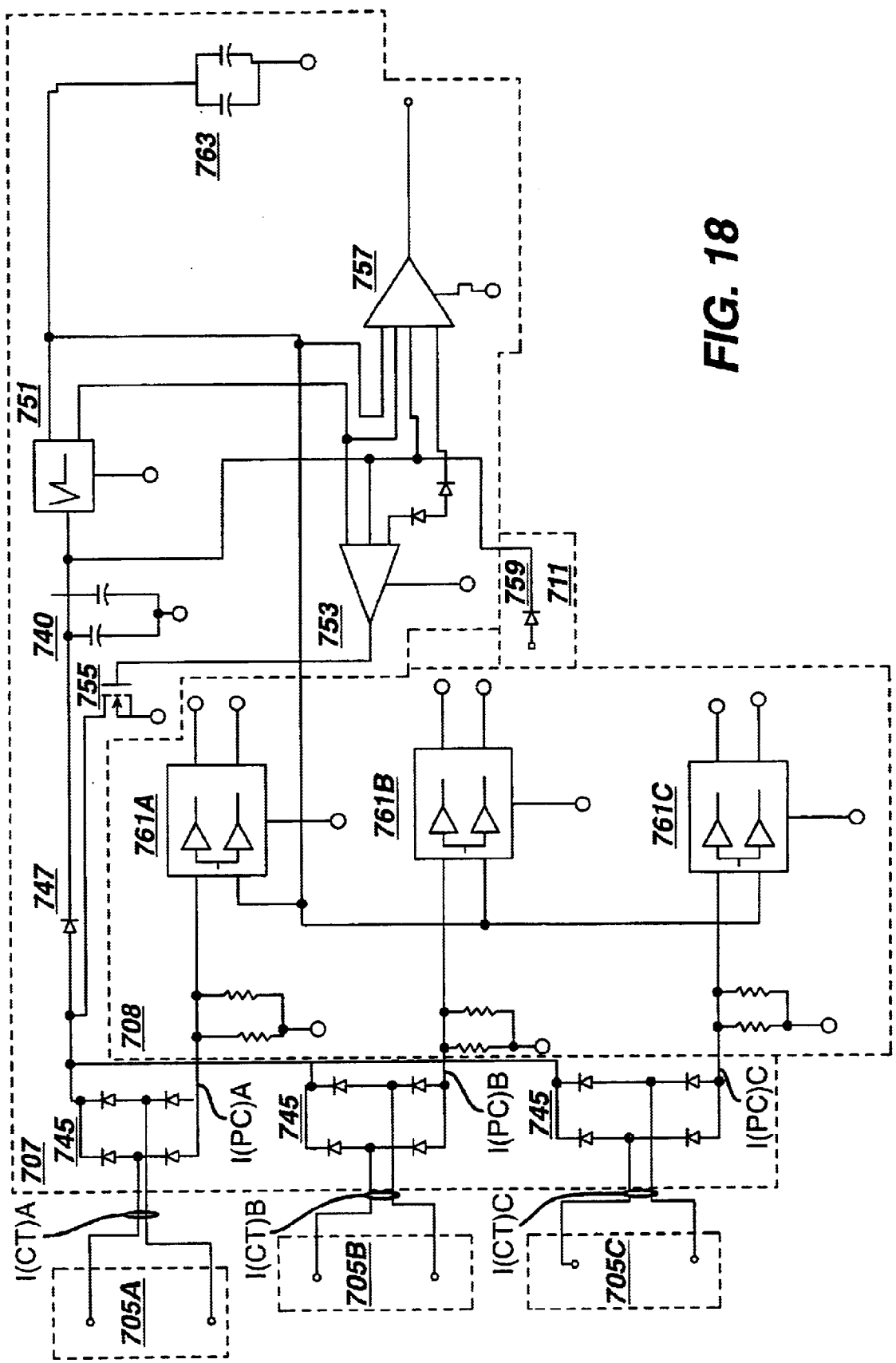
FIG. 18 is a schematic of a power supply model employed within an embodiment of a trip unit model.

Referring now to FIG. 18, an exemplary arrangement of power supply model 707 and conditioner 708 is schematically represented. Referring also to FIG. 16, power supply model 707 is generated from a plurality of component models selected from application provided library 3001 and user-modified library 3003. Also, conditioner model 708 is generated from a plurality of component models selected from application provided library 3001 and user-modified library 3003. Of course, once generated, power supply model 707 and conditioner model 708 can be stored in, for example, model library 3009. Power supply model 707 and conditioner model 708 represent structural or component level models of electronic components within a trip unit.

In the detailed embodiment, three current transformer models 705A, 705B and 705C interface with power supply model 707, corresponding with three phases of simulated current. Of course, it is understood by those skilled in the art that additional or supplemental power sources (i.e., other than current transformer models 705A, 705B and 705C) can be modeled. As described generally above with reference to FIG. 15, the variable I(CT) is fed to power supply model 707 from current transformer models 705A, 705B and 705C as I(CT)A, I(CT)B and I(CT)C, respectively. Power supply model 707 includes a set of rectifier models 745A, 745B and 745C. Rectifier models 745A, 745B and 745C can be selected form libraries 3001 or 3003 (FIG. 16), and generally represent a series of full wave rectifier bridges. Rectifier models 745A, 745B and 745C are fed variables I(CT)A, I(CT)B and I(CT)C, respectively. Each rectifier model 745A, 745B and 745C includes a high side and a low side. A set of internal variables are outputted from the high side of each rectifier model 745A, 745B and 745C and are combined for feed into additional components of power supply model 707. The combined feed is represented as oscillating between a pair of variable feeds routes. One variable feed route includes a flyback diode model 747 which allows passage of a variable representing a Very High Rail (VHR), representing an unregulated voltage. VHR is fed to a grounded parallel arrangement of capacitors including a decoupling capacitor model 748 and a filter capacitor model 749. The parallel arrangement of capacitors outputs a filtered unregulated voltage. After the capacitor arrangement of models 748, 749, voltage variable VHR is split to supply voltage to a regulator model 751, a power supply control model 753, a reset controller model 757, and to a diode model 759 within firing circuit model 711 (only diode model 759 from firing circuit model 711 is represented in FIG. 18). Referring also to FIG. 15, variable VHR is fed to diode model 759 (which is fed a corresponding current variable I(PF)). The second variable feed route comprises a grounded boost converter in the form of a MOSFET model 755. Regulator model 751 simulates provision of a reference voltage represented by a value 2.5VREF to power supply control model 753 and to reset controller model 757. Therefore, power supply control model 753 compares VREF with VHR, and signals MOSFET model 755 to switch when the regulated voltage tends to go out of regulation (i.e., drops below 2.5V or overshoots above 2.5V). Furthermore, regulator model 751 simulates provision of a regulated voltage having a value of 5 volts (represented in FIG. 18 as 5V) to a series of grounded op amp models 761a, 761b and 761c within conditioner model 708, to reset controller model 757, and through a filter model 763, which models filtering of the voltage for provision to micro controller model 709. Reset controller 757 represents the provision of a suitable current and reset voltage (RES) to micro controller model 709 (not shown in FIG. 18) during power up situations.

Variables I(PC)A, I(PC)B and I(PC)C are fed from the low side of each rectifier model 745a, 745b and 745c generally to conditioner model 708. Specifically, variables I(PC)A, I(PC)B and I(PC)C are fed to grounded parallel resistor models 765A, 765B and 765C, which generally function as low value burden resistors. A set of voltages VIN are fed to each op amp model 761A, 761B and 761C for conditioning. The conditioned signals VOUTHI and VOUTLOW are fed to micro controller 709 (not shown in FIG. 18) generally as I(CM) (as represented in FIG. 15) as IAH and IAL from op amp model 761A, IBH and IBL from op amp model 761B, and ICH and ICL from op amp model 761C.

Generally, the individual component models within power supply model 707 and conditioner model 708 (i.e., rectifier models 745A, 745B and 745C, flyback diode model 747, decoupling capacitor model 748, filter capacitor model 749, regulator model 751, power supply control model 753, reset controller model 757, MOSFET model 755, reset controller model 757, diode model 759, op amp models 761A, 761B and 761C, filter model 763, and parallel resistor models 765A, 765B and 765C) are selected from one or more libraries 3001, 3003, 3005, 3007 or 3009 represented in FIGS. 14 and 16. In the exemplary embodiment described herein, most of the component models within power supply model 707 and conditioner model 708 are selected from either library 3001 or 3003. Of course, it is understood that the component models can be selected from any library or user generated. Furthermore, upon generation, either or both the resultant power supply model 707 and conditioner model 708 can be stored in, e.g., model library 3009.

Figure 19:
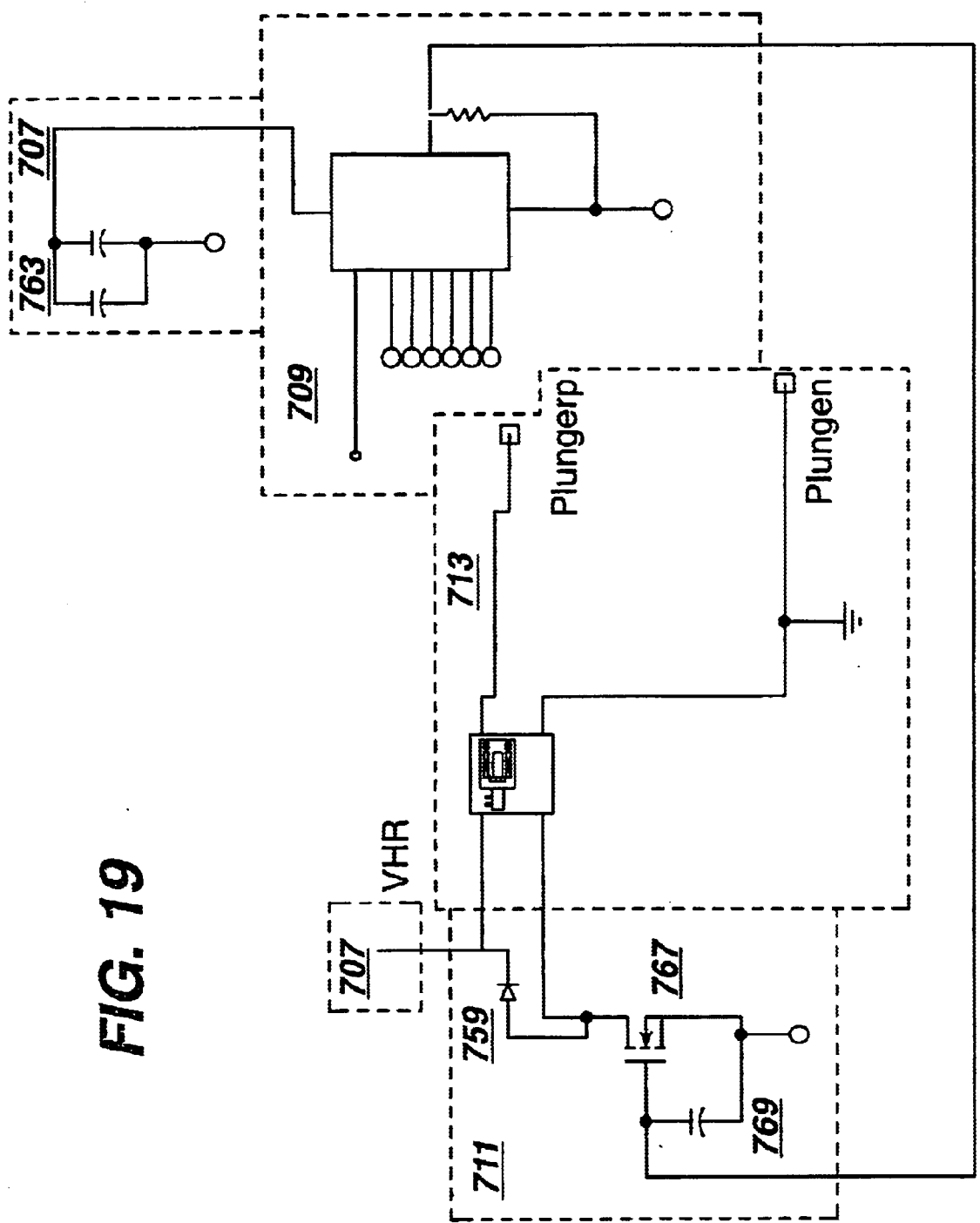
FIG. 19 a schematic of a firing circuit model, an actuator model, and a micro controller model employed within an embodiment of a trip unit model.

FIG. 19 is a schematic depicting the interaction between firing circuit model 711, micro controller model 709, and actuator model 713. Firing circuit model 711 represents passive and active elements of a low voltage power MOSFET model 767. Referring also to FIG. 18, diode model 759 is coupled to VHR for voltage, and is fed to a flux shifter model 771 within actuator model 713. The energizing signal from firing circuit model 711 to actuator model 713 is also represented in FIG. 15 as I(FA). Furthermore, also as described above with reference to FIG. 18, micro controller model 709 is coupled to conditioner model 708 via variables IAH, IAL, IBH, IBL, ICH and ICL. Upon attainment of certain set parameters, generally identified within parameter setting block 703, micro controller model 709 generates a TRIP variable provided through a decoupling capacitor model 769 to MOSFET model 767. TRIP is a signal, such that its presence activates MOSFET model 767, which in turn activates actuator model 713.

Actuator model 713 generally represents a flux shifter that operates via windings and outputs a displacement upon attainment of a signal, generally I(FA), from firing circuit model 711. The winding includes a positive term WINDP and a negative term WINDN as shown in FIG. 19. WINDP is coupled to voltage VHR from power supply model 707 (through diode model 759), and WINDN is coupled to the energy feed from firing circuit model 711, and specifically to MOSFET model 767. WINDN is generally fed when MOSFET model 767 switches, thus closing the circuit between WINDP and WINDN. The representation of the displacement X1 to (FIG. 15) of actuator model 713 is by comparison of variables PLUNGERP and PLUNGERN. PLUNGERP represents the positive translational position of a plunger (such as plunger 142 described in the Background of the Invention) modeled within actuator model 713 and PLUNGERN represents the negative translational position of the modeled plunger.

Micro controller model 709 generally represents a digital micro controller coupled to a random access memory and a read only memory. A variable VCC represents a filtered voltage provided from filter model 763. Micro controller model 709 may be externally operable via, for example, a rating plug such as a rating plug described above, or other type of control interface. Control parameters for trip unit model 701 are generally stored within micro controller model 709.

Generally, the individual component models within firing circuit model 711 (i.e., decoupling capacitor model 769, MOSFET model 767, diode model 759) are selected from one or more libraries 3001, 3003, 3005, 3007 or 3009 represented in FIGS. 14 and 16. In the exemplary embodiment described herein, most of the component models within firing circuit model 711 are selected from either library 3001 or 3003. Of course, it is understood that the component models can be selected from any library or user generated. Furthermore, upon generation, the resultant firing circuit model 711 can be stored in, e.g., model library 3009.

FIG. 20 is a portion of the user generated code employed for micro controller model 709. As shown the code is entitled "Trip Unit Control Template", and is scripted in MAST® Hardware Description Language. Of course, the code can be scripted in any appropriate language, as described above. Included within the code are the various electrical connections or variables employed within trip unit 709, variables that interface with other component models, or variables that are both employed within trip unit 709 or that interface with other component models.

Generally, micro controller model 709 can be selected from one or more libraries 3001, 3003, 3005, 3007 or 3009 represented in FIGS. 14 and 16. In the exemplary embodiment described herein, micro controller model 709 is selected from user code library 3005. Of course, it is understood that micro controller model 709 can be selected from any library or user generated. Furthermore, upon generation, the resultant micro controller model 709 can be stored in, e.g., model library 3009.

Figure 21:
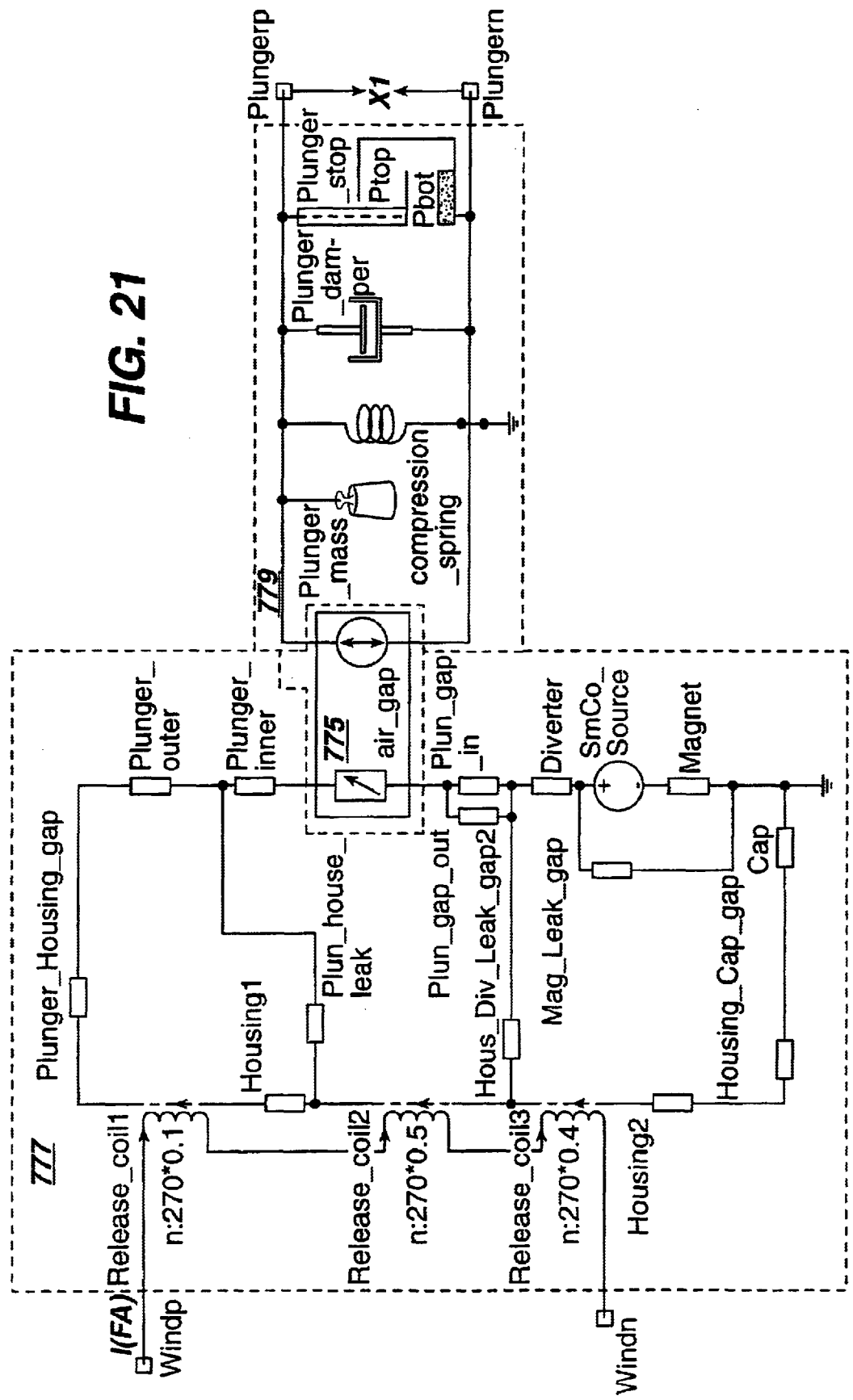
FIG. 21 is a schematic of an actuator model employed within an embodiment of a trip unit model.

FIG. 21 is a schematic of the actuator model 713, representing its electrical, magnetic, and mechanical aspects. To capture the electrical, magnetic, and mechanical aspects of the flux actuator, a magnetically coupled air-gap model 775 is tied on one end to the magnetic path of the flux within the actuator, and on the other end to the mechanical elements of the actuator. Air-gap model 775 generates a force variable FORCE derived from a magnetic flux path model 777 and a reluctance variable RELUCTANCE derived from the actuator geometry model 779. FORCE and RELUCTANCE are derived using a combination of analytic and finite element analysis. FORCE represents a variable dependant on magnetic flux path model 777 and is coupled to actuator geometry model 779, and RELUCTANCE represents a variable dependant on actuator geometry model 779 and is coupled to magnetic flux path model 777.

Actuator geometry model 779 includes a plunger mass model (PLUNGER_MASS), a spring model (COMPRESSION_SPRING which includes spring coefficient k set at 160.61 and DELTA0 at 0.02413 m, or the spring preload distance, set at 0.02413 m), a damping model (PLUNGER_DAMPER, which includes a damping coefficient d set at 0), and plunger stop model (PLUNGER_STOP, represented by a top reference position PTOP set at 0.02413 inches and a bottom reference position PBOT set at 0.00635 m). Actuator geometry 779 couples a first and a second positional variables (POS1 and POS2) with FORCE variable from air gap 775 to determine PLUNGERP and PLUNGERN, by comparison to PTOP and PBOT. Referring also to FIG. 15, displacement variable X1 is derived from comparing PLUNGERP and PLUNGERN.

Magnetic flux path model 777 is coupled to firing circuit model 711 via WINDP and WINDN (also shown in FIG. 19). The positive term WINDP is tied to the first of three distributed windings RELEASE_COIL1, which feeds the variable through the second winding RELEASE_COIL2 into the third winding RELEASE_COIL3 to the negative term WINDN. The total number of windings for each distribution is identified as n:270, wherein RELEASE_COIL1 comprises 10%, RELEASE_COIL2 comprises 50%, and RELEASE_COIL3 comprises 50%.

The factors effecting magnetic flux path model 777 are accounted for with a combination of behavioral and structural modeling of the flux. These factors include geometrical relationships between the outer diameters of the plunger (modeled herein as a plunger configured with a step having a pair of diameters) and the housing, between a magnet within the flux shifter and the housing, and between a diverter disposed between the magnet and the plunger and the housing.

A housing model HOUSING1 (generally a structural model) is compared to the diameter of the plunger PLUNGER_OUTER to determine the size of the gap PLUNGER_HOUSING_GAP. Comparison between PLUNGER_OUTER to the housing exterior diameter and PLUNGER_HOUSING_GAP determines the flux leakage PLUN_HOUS_LEAK.

A magnet source model SmCo_SOURCE models a samarium-cobalt source magnet within the flux shifter, and a reluctance model MAGNET models the internal reluctances of the magnet. A housing model is represented as a housing HOUSING2 (generally a structural model of the housing), and a cap CAP, and the gap there between HOUSING_CAP_GAP. Comparison between SmCo_SOURCE to the housing gap and HOUSING_CAP_GAP determines the flux leakage MAG_LEAK _GAP.

A diverter model DIVERTER models a diverter disposed between a magnet and a plunger and its internal reluctances. A diverter is typically provided in a flux shifter to retain a higher flux density due to the higher saturation capabilities of a diverter as compared to the magnet. Comparison between DIVERTER to the housing gap and HOUSING_CAP_GAP determines the flux leakage HOUS_DIV_LEAK_GAP2.

Generally, the individual component models within actuator model 713 including actuator geometry model 779 and magnetic flux path model 777 and their respective internal component models are selected from one or more libraries 3001, 3003, 3005, 3007 or 3009 represented in FIGS. 14 and 16. In the exemplary embodiment described herein, certain component models within actuator geometry model 779 are selected from either library 3001 or 3003. For example, the mechanical models including PLUNGER_MASS, COMPRESSION_SPRING, PLUNGER_DAMPER, PLUNGER_STOP, PLUNGERP, PLUNGERN can be selected from library 3001 or 3003. Component models within magnetic flux path model 777 are provided in a library such as 3001, modified and stored in a library such as 3003, or created and stored in a library such as 3007. These components models include RELEASE_COIL1, RELEASE_COIL2 and RELEASE_COIL3, HOUSING1, PLUNGER_OUTER and PLUNGER_INNER (which determine PLUNGER_HOUSING_GAP and PLUN_HOUS_LEAK) and SmCo_SOURCE, MAGNET, DIVERTER, HOUSING2, and CAP (which determine HOUSING_CAP_GAP, MAG_LEAK_GAP and HOUS_DIV_LEAK_GAP2). Of course, it is understood that the component models can be selected from any library in which they are available or user generated. Furthermore, upon generation, the resultant actuator geometry model 779 and magnetic flux path model 777 can be stored in, e.g., model library 3009. Likewise, the resultant actuator model 713 can be stored in model library 3009.

Trip unit model 701 described with reference to FIGS. 15 and 17–21 represents an electronic trip unit. However, as mentioned above, other types of trip units (or no trip unit at all) may be employed within circuit breakers, hence other types of models can be generated.

Figure 22:
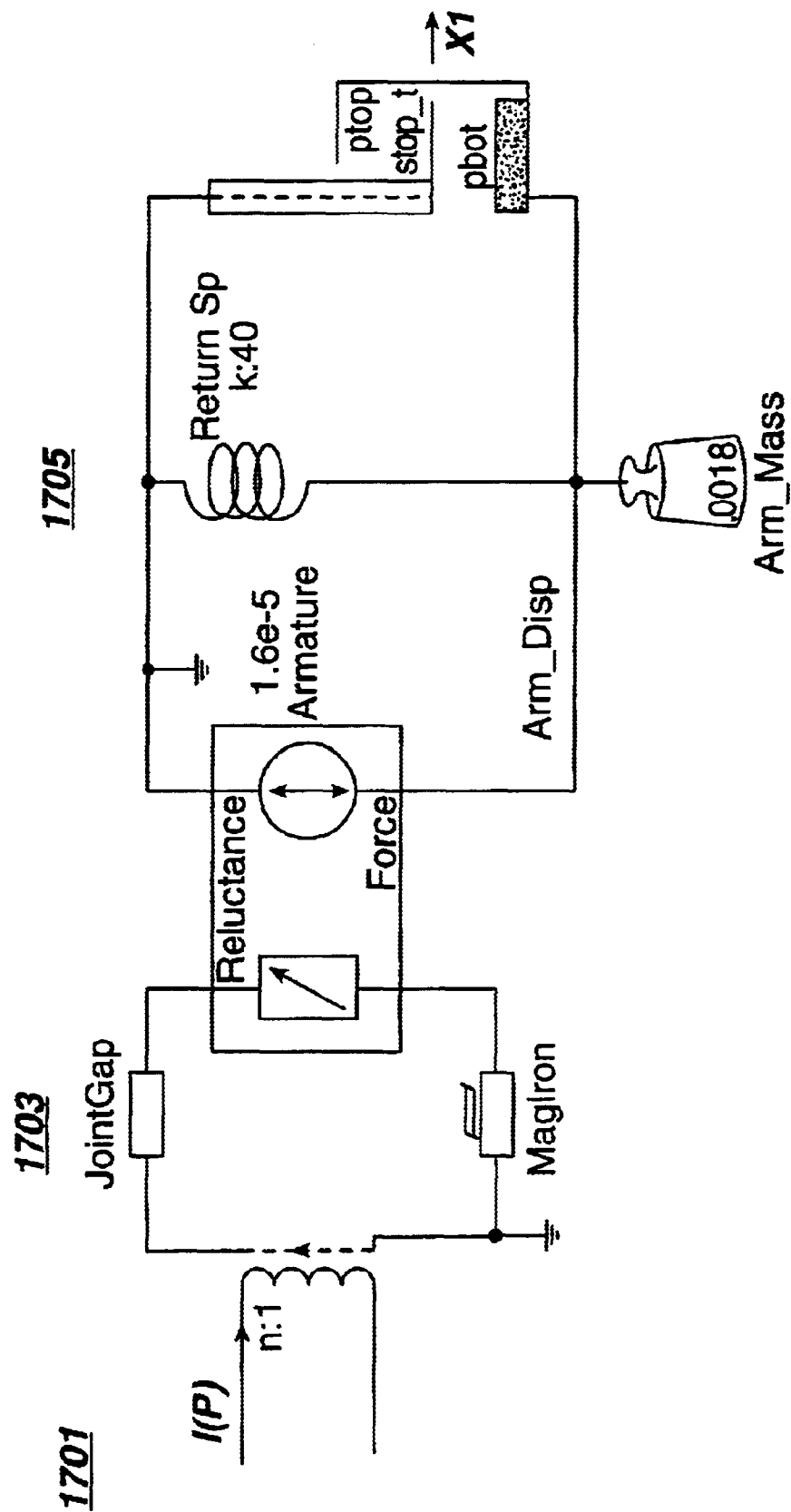
FIG. 22 is an alternative trip unit model for use within a circuit breaker model according to an embodiment of the present invention.

Referring to FIG. 22, an alternative trip unit model 1701 is provided. Trip unit model 1701 can be substituted, for example, for trip unit model 701 described above and represents a model of a magnetic trip unit having the conductor carrying the primary current passing through a ferrous core having a spring biased armature attached thereto. Trip unit model 1701 provides the displacement X1 referenced in FIG. 15.

The primary current I(P) is shown as a single winding (represented by n:1) arranged through a core model 1703 tied to an armature model 1705. Core model 1703 represents the non-linear B-H properties of the iron core (MAGIRON) and the gap between the core and the armature (JOINTGAP). Core model 1703 also takes into account the variable reluctance (RELUCTANCE) of the gap between the armature in the core. Armature model 1705 takes into account properties including the size of the air gap (ARMATURE, having a cross section of 1.6e−5 m$^2$), the armature mass (ARM_MASS, 0.0018 kg), the properties of the return spring between the armature in the core (RETURNSP, k:40), and the top and bottom stop positions of the armature (STOP_T having PTOP and PBOT). These properties are compared to the variable flux through the iron (FORCE) and provide the resultant displacement X1.

Generally, the individual component models within trip unit model 1701 including core model 1703 and armature model 1705 and their respective internal component models are selected from one or more libraries 3001, 3003, 3005, 3007 or 3009 represented in FIGS. 14 and 16. In the exemplary embodiment described herein, certain component models within trip unit model 1701 are selected from either library 3001 or 3003. For example, the mechanical models including MAGIRON, JOINTGAP, RELUCTANCE, ARMATURE, ARM_MASS, RETURNSP, STOP_T having PTOP and PBOT, and FORCE can be selected from library 3001 or 3003. Upon generation, the resultant core model 1703 and armature models 1705 can be stored in, e.g., model library 3009. Likewise, the resultant trip unit model 1701 can be stored in model library 3009.

Referring now to FIG. 23, another alternative trip unit model 1750 is provided. Trip unit model 1750 is a code listing for a response model of a trip unit. This is useful where only the power-up current and delay and pick-up current and delay are needed. Trip unit model 1750 models an electronic trip unit where a trip output is generated when the current exceeds a minimum value and reaches a maximum value. When the current reaches a threshold current (I_THRESH), a delay (TD1) corresponding to the power up delay is clocked in. When the current reaches a peak value, a second delay (TD2) is clocked in. The output of the trip unit is a logic output that swings between 0 and 1. Trip unit model 1750 can be stored, for example, in user code library 3005 or model library 3009.

Figure 24:
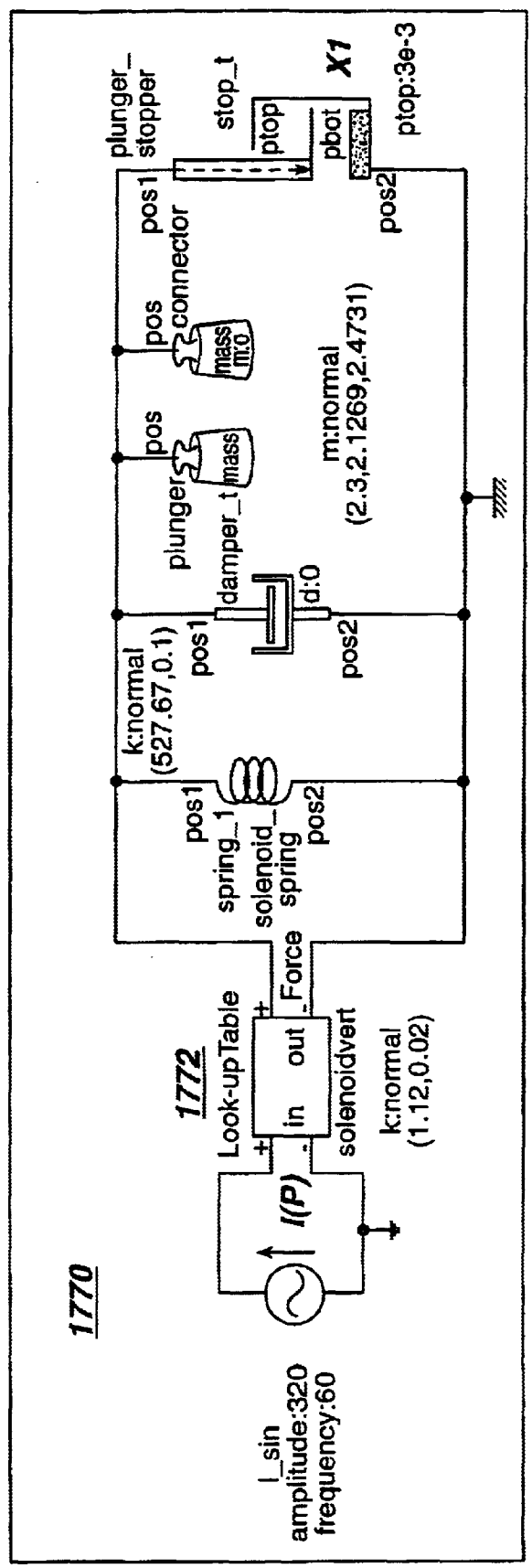
FIG. 24 is yet another alternative trip unit model for use within a circuit breaker model within an embodiment of the present invention.

FIG. 24 is yet another alternative trip unit model 1770. Trip model 1770 uses the results of a Finite Element analysis of the thermal magnetic trip unit to implement a look-up table model 1772 of a force versus current transfer function. The input to look-up table model 1772 is the solenoid current (i.e. representative of the breaker current I(P)) and the output is a force variable that represents the plunger movement (for a solenoid trip unit) or a torque (in case of a flapper unit). Across the output, the SOLENOID_SPRING model, DAMPER_T model, PLUNGER model (mass), CONNECTOR model (mass), and PLUNGER_STOPPER model are obtained from the component library (e.g., 3001) to solve for the displacement X1 (generally as a function of time and current).

Figure 25:
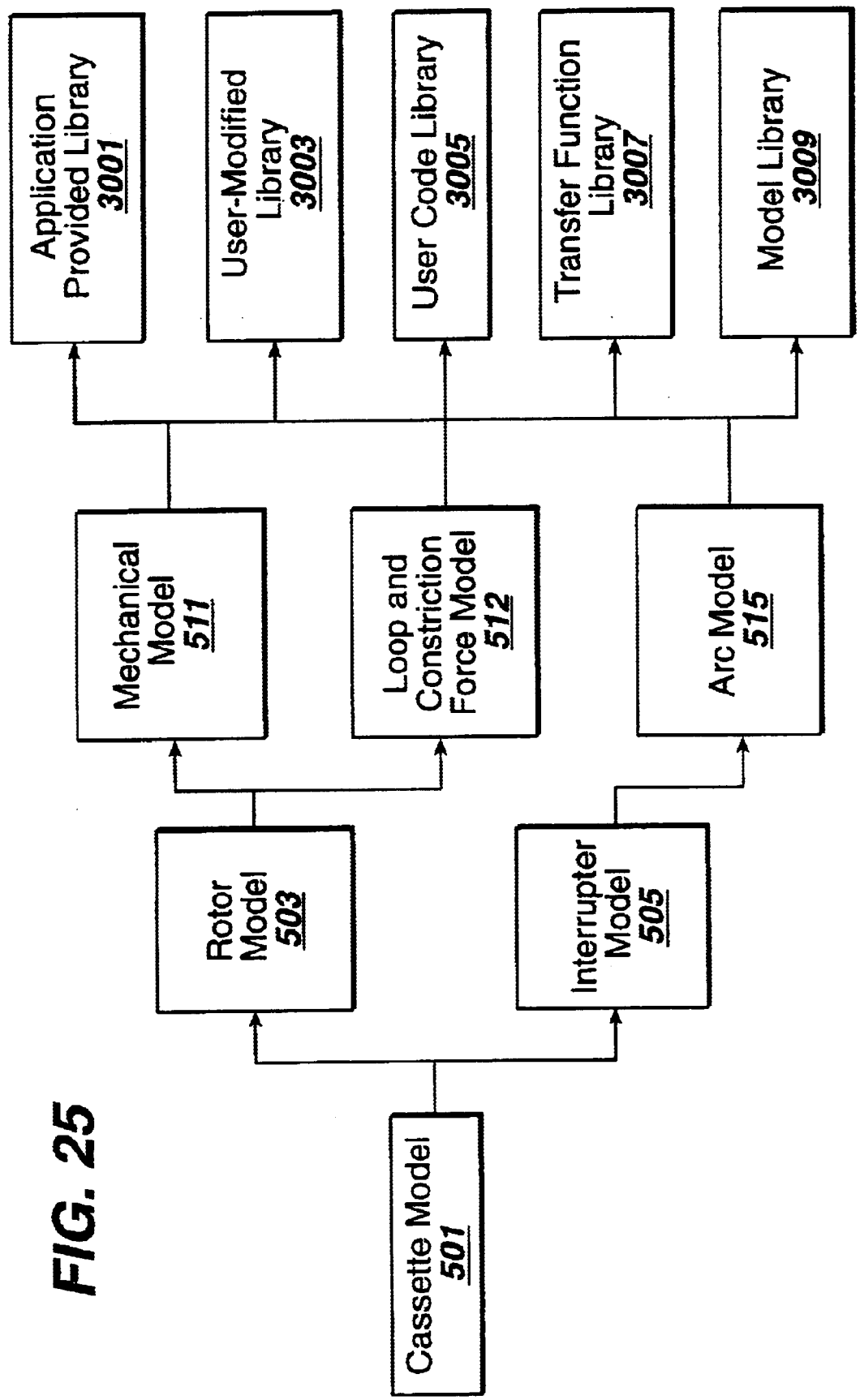
FIG. 25 is a flow diagram representing an embodiment of component selection within a cassette model.

Referring now to FIG. 25, the selection of assemblies for cassette model 501 is shown. The circuit breaker cassette, described above as cassette 58, 60, 62, and represented as cassette model 501, is affected by several variables and is set in motion via various forces. Generally, cassette model 501 is at least a model of the separable contact structure, including a means for representing a contact pressure and position. Specifically, as detailed herein, cassette model 501 comprises rotor model 503, including a means for representing a contact pressure and position, and an interrupter model 505, including an arc model 515. Referring also to FIG. 15, the primary current I(P) flows through current transformer model 705 and into rotor model 503 and interrupter model 505.

Rotor model 503 includes a mechanical model 511 and a loop and constriction force model 513. Each component model 511 and 513 can be generated from one or more other component models selected from one or more libraries 3001, 3003, 3005, 3007 and 3009. Alternatively, each component model 511 and 513 can be selected wholly from libraries one or more libraries 3001, 3003, 3005, 3007 and 3009. Interrupter model 505 includes an arc model 515. Arc model 515 can be selected directly from one or more libraries 3001, 3003, 3005, 3007 or 3009, or, alternatively, arc model 515 can be built from component models selected from one or more libraries 3001, 3003, 3005, 3007 or 3009.

During quiescent operation of a circuit breaker, each phase of current flows from source through the associated cassette to load. When the circuit breaker is opened, i.e., due to manual operation of the mechanism (as described above in the Background of the Invention), tripping action of the mechanism, or blow open forces, the current flow from the source to the load is isolated. The source to load voltage is supported across the cassette.

Tripping action of the mechanism (i.e., similar to the second type of interruption described above) trip unit model 701 (or alternatives such as 1701 or 1750) provides displacement X1 to a mechanism latch system represented by in mechanism model 601 as a latch system model 605. Typically, the trip unit model provides X1 during overload or short-circuit conditions. The mechanism represented by mechanism model 601 interacts with a portion of the rotor assembly represented by a rotor model 503 with displacement variable X3.

The mechanical elements of the rotor assembly, including the contact arm, can be modeled with elemental components, such as links, springs, and masses. Alternatively, a transfer function approach can be employed to model the rotor. FIG. 26 shows a portion of the code employed as part of mechanical model 511 that accounts for the rotor mechanism of the rotor assembly when the current I(P) acts on the contact structure (e.g., constriction and loop forces modeled as described herein below) and when displacement X3 is provided from mechanism model 601. This portion represents a rotor mechanism model 517. The transfer function expressed by the code is derived analytically. It includes mechanical features of the contact arm including the contact spring constant and free length, the slot positions, the arm radius, and the link dimensions and positions. It can be validated, for example, using a two-dimensional mechanical tool.

Generally, rotor mechanism model 517 can be selected from one or more libraries 3001, 3003, 3005, 3007 or 3009 represented in FIGS. 14 and 25. In the exemplary embodiment described herein, rotor mechanism model 517 is selected from user code library 3005 or transfer function library 3007. Of course, it is understood that rotor mechanism model 517 can be selected from any library or user generated. Furthermore, upon generation, the resultant rotor mechanism model 517 can be stored in, e.g., model library 3009.

For higher currents, e.g., 30× (30 times rated power) and above, the interruption mechanism is controlled by the contact arms, such as contact arm 100, within the rotor assembly (e.g., rotor 110). The contact arm blows open in a very short period (e.g., 2 to 3 milliseconds) due to the electromagnetic forces acting on the contact arm. For low to moderate short-circuit currents, the contact arm opens and closes, and ultimately the rotor assembly opens when the mechanism reacts to the short-circuit through the electronic trip unit.

Referring to FIG. 27, a portion of the code employed to generate loop and constriction force model 512 is provided, specifically a constriction force model 513. Referring to FIG. 28, a portion of the code employed to generate loop and constriction force model 512 is provided, specifically a loop force model 514. Loop and constriction force model 512 combines analytical and empirical aspects of the action at the contact arm. The loop forces are used to clear fault currents rapidly by applying pressure to the contact arm, which pressure opposes the contact pressure exerted generally by the contact springs within the rotor. The constriction force (e.g., modeled with constriction force model 513) is due to the non-uniformity of currents within the contacts. The loop and constriction forces are always present within breaker, and are counter-balanced by the rotor assembly, and optionally the mechanism, during quiescent operation. When faults occur, the loop and constriction forces tend to drive the movable contact from the stationery contacts, and enhance the process of opening the contacts.

Generally, loop and constriction force model 512, constriction force model 513, and loop model 514 can be selected from one or more libraries 3001, 3003, 3005, 3007 or 3009 represented in FIGS. 14 and 25. In the exemplary embodiment described herein, loop and constriction force model 512 is a combination of models generally including constriction force model 513, loop model 514 and appropriate conversion models, and the component models are selected from user code library 3005. Of course, it is understood that loop and constriction force model 512 can be selected from any library or user generated. Furthermore, upon generation, the resultant loop and constriction force model 512 can be stored in, e.g., model library 3009.

Interrupter model 505 accounts for the arc related phenomenon within cassette model 501 and includes arc model 515. When the contacts separate, an arc is generated in between the movable and separable contacts. An arc handling portion of the cassette is provided to divert and ultimately extinguish this arc. The arc extinction occurs within the cassette through a phenomenon of arc elongation and arc splitting combined with gas flow due to the ablative material.

FIG. 29 is a portion of the code employed as arc model 515 to provide the arc behavior at the contact arm. As shown the code is scripted in MAST® Hardware Description Language. Of course, the code can be scripted in any appropriate language, as described above. Included within the code are the various variables that effect the arc. To model the arc behavior within the cassette, arc model 515 combines analytical aspects, empirical aspects, experimental aspects, or a combination of analytical, empirical or experimental aspects.

Arc model 515 takes into account the effect of the arc chutes on the arc voltage. It models the arc as a variable resistor, which changes according to the rotor position. Therefore, arc model 515 uses the contact arm position fed generally from rotor model 503, and specifically mechanical model 511. When the contacts are closed, the voltage across the contacts is proportional to the contact resistances. As soon as the contacts starts to open due to the short-circuit current, the arc is drawn between the contacts, and the modules take this into account by modifying the voltage across the contacts to include the anode/cathode drop as well as the electric field across the contacts. The electric field across the contacts is related to the pressure within the arc chamber through an empirical relationship, which is in turn validated experimentally. The coefficients are determined by regression analysis.

Arc model 515 as implemented herein is broad enough to be applied to a variety of arc behaviors. For example, in the case of high voltage circuit breakers, instead of empirical relationships as used herein for a model of a low voltage circuit breaker, the arc portions will be a combination of Cassie/Meyers and analytical models.

Generally, arc model 515 can be selected from one or more libraries 3001, 3003, 3005, 3007 or 3009 represented in FIGS. 14 and 25. In the exemplary embodiment described herein, arc model 515 is selected from user code library 3005. Of course, it is understood that arc model 515 can be selected from any library or user generated. Furthermore, upon generation, the resultant arc model 515 can be stored in, e.g., model library 3009.

Figure 30:
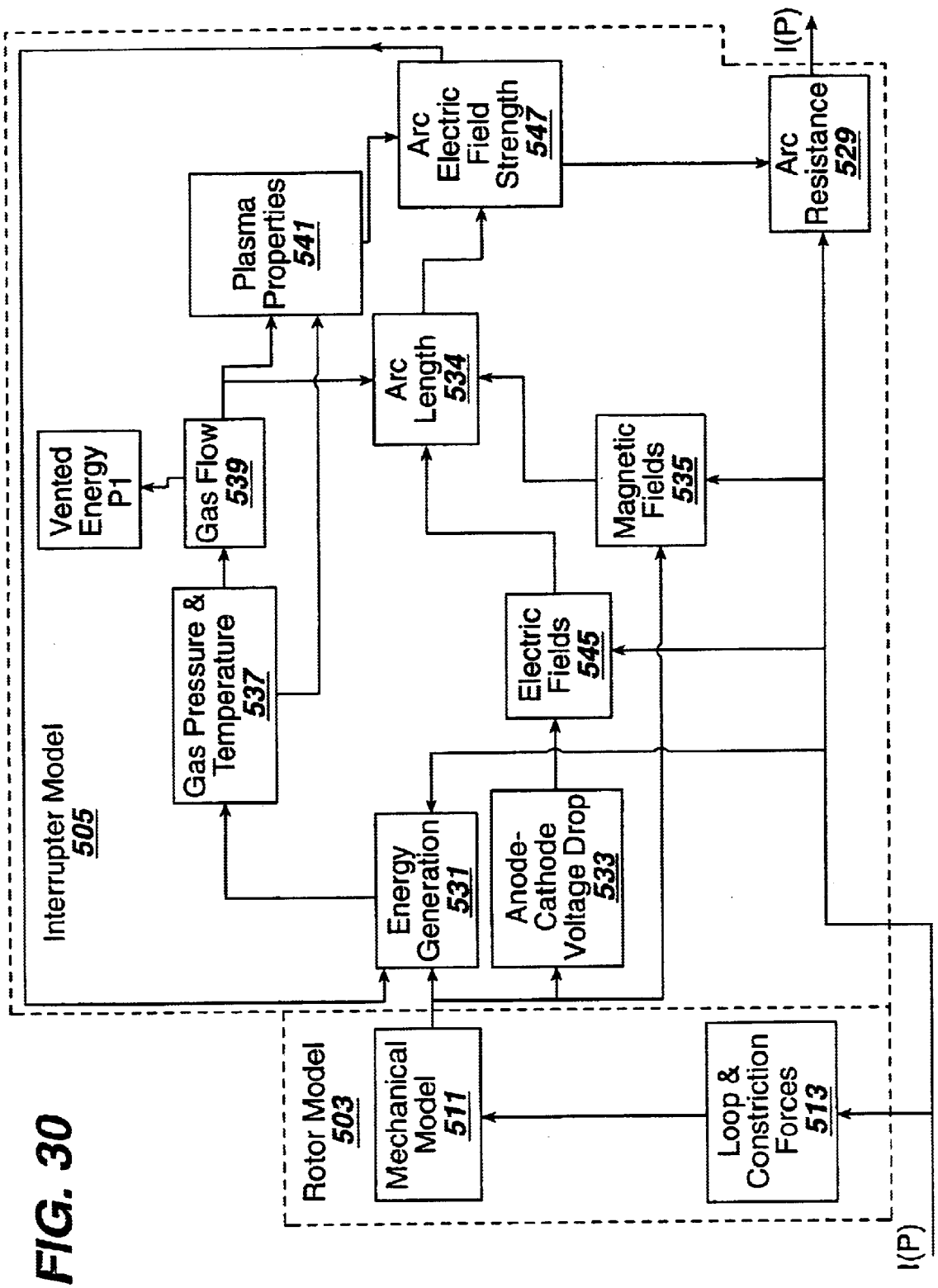
FIG. 30 is an alternative arc model for use within a cassette model within an embodiment of the present invention.

An alternative arc model that can be substituted for arc model 515 is provided in FIG. 30. This arc model includes the basic elements and physical phenomenon of the arcing dynamics and ties the rotor model 503 to the interrupter model 505 as shown. The rotor model 503 includes representations of the loop and constriction forces, for example, as described above with respect to loop and constriction force model 513. These forces are tied to the mechanical model 511. The interrupter model 505 includes the fluid effects and electrical effects, which are separately accounted for and also tied together to generate an output pressure P1 and a variable arc resistance model 529. P1 can be tied to a base model such as base model 801 to account for the structural effects of the fluid flow upon the cassette housing, the circuit breaker housing, or both, and the vent configurations in the cassette housing, the circuit breaker housing, or both.

Mechanical model 511 accounts for the angle, velocity and acceleration of the contact arm. These factors, in conjunction with properties of the contacts and primary current I(P), are used to determine the energy generation model 531, an anode-cathode voltage drop model 533 and a magnetic field model 535.

Energy generation model 531 outputs energy to a gas pressure and temperature model 537 in conjunction with any ablative material employed proximate to the contacts, which is used to determine a gas flow model 539. Gas flow model 539 outputs the vented energy in the form of variable P1. Both gas flow model 539 and gas pressure and temperature model 537 are tied to a plasma properties model 541. Gas flow model 539 is tied to an arc length model 543. Anode-cathode voltage drop model 533 and primary current I(P) are tied to an electric field model 545. Arc length model 543 is based on gas flow model 539, electric field model 545 and magnetic field model 535. Plasma properties model 541 and arc length model 543 are tied to an arc electric field strength model 547. Primary current I(P) and arc electric field strength model 547 are inputted into arc resistance model 529 to determine the variable arc resistance for use in interrupter model 505 described herein.

Generally, the alternative arc model represented in FIG. 30 can be selected from one or more libraries 3001, 3003, 3005, 3007 or 3009 represented in FIGS. 14 and 25. In the exemplary embodiment described herein, the arc model comprises a combination of component models interfaced to output a pair of variables P1 and arc resistance 529. These component models, including contact dynamics model 527, energy generation model 531, anode-cathode voltage drop model 533, magnetic field model 535, gas pressure and temperature model 537, gas flow model 539, plasma properties model 541, arc length model 543, electric field model 545, and arc electric field strength model 547 are generally selected from user code library 3005 or transfer function library 3007. Of course, it is understood that the arc model and the various components can be selected from any library or user generated. Furthermore, upon generation, the resultant arc model or any component model therein can be stored in, e.g., model library 3009.

Figure 31:
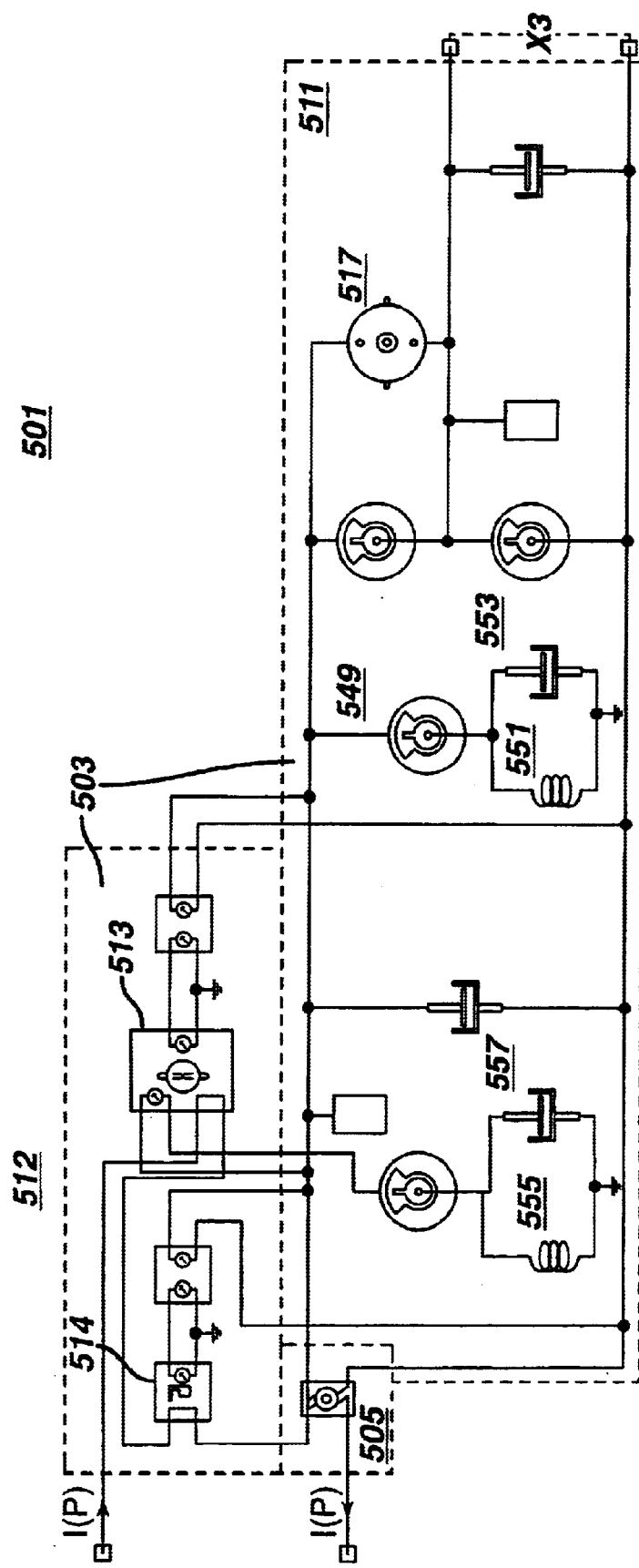
FIG. 31 is a schematic of a an interrupter model for use within a cassette model within an embodiment of the present invention.

Referring now to FIG. 31, an overall schematic of cassette model 501 is schematically represented. The primary current I(P) is tied to loop and constriction force model 512 to show how I(P) acts on rotor model 503. The angular position of the contact arm and the primary current I(P) are tied to interrupter model 505 to determine how I(P) is effected generally by arc model 515 or the alternative arc model shown with reference to FIG. 30. The displacement X3 imparted by mechanism model 601 is tied to mechanical model 511.

The loop force and constriction force are converted to angular torques and tied to mechanical model 511 at various points. Mechanical model 511 includes rotor mechanism model 517 described above. Physical parameters and variables of the cassette structure are elementally modeled. The friction acting on the rotor (e.g., the pivotal friction between the rotor and the cassette housing) is represented with a friction model DAMPING_ROTOR. The inertia of the rotor and the cross bar (e.g., such as cross bar 66 or 68) connecting the rotor to the mechanism is modeled at ROTOR_PIN_INERTIA. The rotational limits of the rotor with respect to the cassette interior are represented by a stop model ROTATIONAL_STOP_RG (i.e., rotor vis a vis mechanical ground position). The rotational position wherein the rotor imparts motion to the contact arm is represented by a stop model ROTATIONAL_STOP_AR (i.e., arm vis a vis rotor). The rotational limits of the contact arm within the cassette structure are represented by a stop 549. Stop 549 is tied to a spring model 551, which represents the structural stiffness of the cassette housing at the interface of the contact arm in the open position, and to a damping model 553 which represents the non-linear behavior when the contact arm impacts the cassette housing. The friction imparted on the contact arm (e.g., by the rotor linkages, rotor structure, air, etc.) is represented by a damping model DAMPING_ARM. The rotational position and the contact pressure is represented by a stop model ROTATIONAL_STOP_AG (i.e., arm vis a vis mechanical ground position) having an inertia represented by an inertia model CONTACT_ARM_INERTIA. ROTATIONAL_STOP_AG is tied to a spring model 555 which represents the structural stiffness of the fixed conductor and cassette housing in the closed position, and to a damping model 557 which represents the non-linear behavior when the contact arm impacts the fixed conductor.

Generally, the mechanical model 511 can be selected from one or more libraries 3001, 3003, 3005, 3007 or 3009 represented in FIGS. 14 and 25. In the exemplary embodiment described herein, mechanical model 511 comprises a combination of component models interfaced to output an angular position to arc model 515 or a suitable alternative such as that represented in FIG. 30. These component models, including DAMPING_ROTOR, ROTOR_PIN_INERTIA, ROTATIONAL_STOP_RG, ROTATIONAL_STOP_AR, stop 549, spring model 551, damping model 553, DAMPING_ARM, ROTATIONAL_STOP_AG, CONTACT_ARM_INERTIA, spring model 555 and damping model 557, are generally selected from user libraries 3001 or 3003. Rotor mechanism model 517, described above, is selected from user code library 3005. Of course, it is understood that mechanical model 511 and the various components can be selected from any library or user generated. Furthermore, upon generation, the resultant mechanical model or any component model therein can be stored in, e.g., model library 3009.

The mechanism represented by mechanism model 601 generally includes a handle, a latch system, a mechanism spring, and a series of links that interface the rotor assembly. As shown in FIG. 15, the latch system model 605 is tied to displacement variable X1 from trip unit model 701, and outputs a displacement variable X2 within mechanism model 601 to linkage model 607, which models the linkage interfacing one or more rotors.

One approach to model the operating mechanism is use a two-dimensional or a three-dimensional modeling tool that will mimic the behavior of the links and springs. Depending on the level of mechanism detail required, individual elements such as links and springs can be connected in a fashion such that the overall model mimics the mechanism behavior.

Alternatively, where link and spring behavior modeling is not necessary, a transfer function may be employed. A portion of the code representing the mechanism model 601 is provided in FIG. 32.

The transfer function generally provides the mechanism torque as a function of the angular position of the rotor. The torque to angle data can be generated using a two-dimensional modeling tool, and is presented in the form of a look-up table. The mechanism is activated through the actuator, represented by actuator model 701.

The method and apparatus for modeling circuit breakers presented herein allows for an interaction with a simulation program to study the current through a circuit breaker during an overcurrent or short-circuit condition. Additionally, the method and apparatus allows for various combinations of modeling strategies to coexist. The modeling tools are employed to build a circuit breaker model.

Figure 33:
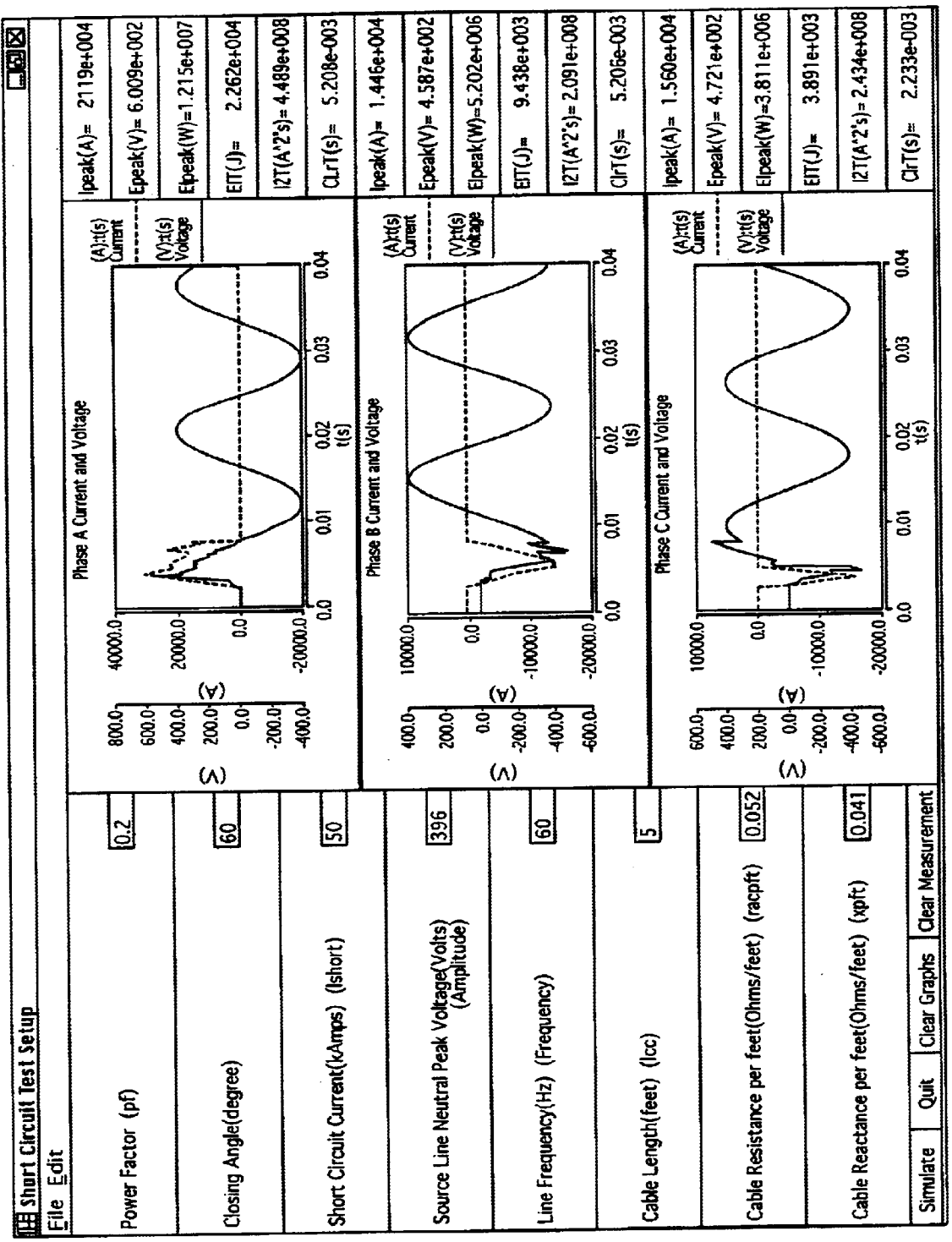
FIG. 33 is a virtual test interface of a circuit breaker model generated by an embodiment of the method and apparatus of the present invention.

Referring now to FIG. 33, a virtual interface for studying behavior of the circuit breaker is provided. The interface is developed with a code language that coexists with the language of the modeling program (e.g., Tool Command Language/Tool Kit and AIM® wherein the modeling program is Saber Designer®). The interface can allow measurement of relative quantities including, but not limited to, peak current, peak voltage, arc energy and dissipation, and clearing times. Parameters can be set as shown, including but not limited to the power factor, closing angle, short circuit current (e.g., maximum short circuit current available from the source), the peak line-neutral voltage of the source, line frequency, cable length, cable resistance per 1000 feet, and cable reactance per 1000 feet. The interface is a tool that allows designers to determine, for example, the worst case closing angle for a short-circuit withstanding current. Additional macros were implemented within the interface to perform Design of Experiment analyses on the circuit breaker model. It allows variation of a number of input factors, including but not limited to, the power factor, closing angle, and short-circuit capacity.

Figure 34:
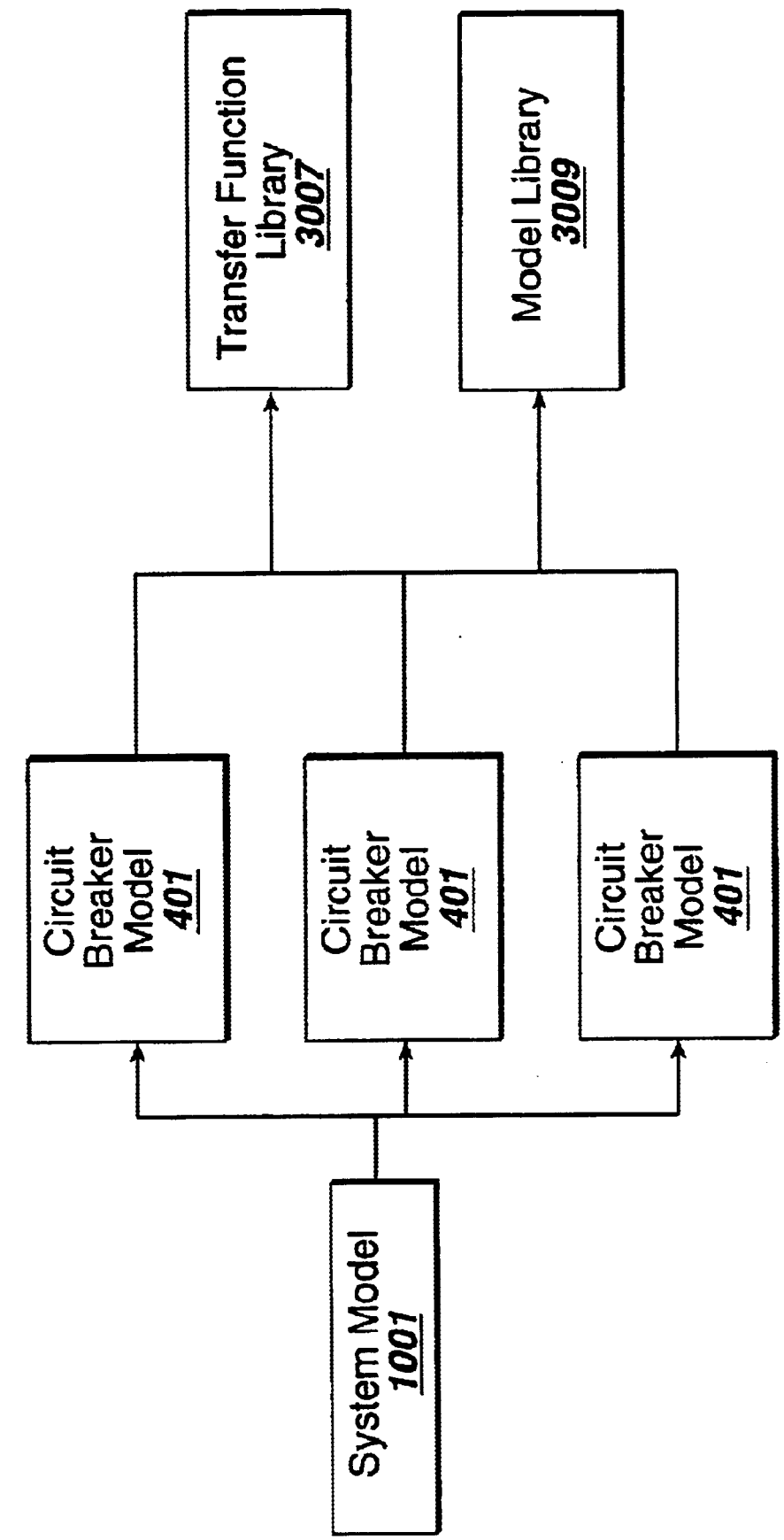
FIG. 34 is a flow diagram representing an embodiment of circuit breaker model selection within a system model.

When a circuit breaker model 401 (FIG. 15) has been generated according to the above description, that model can then be stored in a library (e.g., model library 3009). Referring now to FIG. 34, the modeling tools are employed to build a system model 1001 of a plurality of circuit breaker models 401. System model 1001 can represent a selective system such as system 40 described above with reference to FIG. 12. Although three circuit breaker models 401 are depicted as comprising system model 1001, it is understood that system model 1001 may comprise as few as one circuit breaker model, and as many circuit breaker models as required to model a particular electrical distribution system. Furthermore, while reference is made to the two-tier system 40 of FIG. 12 as an example of system 1001, it is understood that analysis of systems having additional or fewer tiers can be implemented with the analysis method and apparatus herein.

Additionally, FIG. 34 represents the selection of circuit breaker models 401 from transfer function library 3007 or model library 3009. Generally, where models have been constructed according to the modeling approach of the present invention, they can be stored ion library 3009. Additionally, the circuit breaker models can be reduced to behavioral responses and stored as one ore more transfer functions in transfer function library 3007. System model 1001 can then be implemented within a model source and a model load or loads. Such a system model can be employed, for example, to predict the behavior of an upstream circuit breaker when a downstream circuit breaker is effected by a fault condition. Each circuit breaker 401 can be built from the component level and implemented in a system model 1001 (e.g., and not stored in a library 3001, 3003, 3005, 3007 or 3009, but rather retained in RAM for other circuit breakers, sources or loads to be added).

It is understood that various types of power devices can be modeled and analyzed with the method and apparatus described herein. These power devices include, but are not limited to, circuit interruption devices such as low voltage, medium voltage, high voltage, air, or vacuum breakers for residential, commercial or industrial. Other protective devices can also be analyzed with the techniques herein, including but not limited to, contactors, relays, disconnects and switches. Furthermore, electrical distribution devices such as cables, transformers, switchboards, distribution panels, and motor control centers can be analyzed with the method and apparatus described herein. Power source devices such as transformers, generators and uninterruptible power supplies and their components can also be analyzed with the method and apparatus described herein. Additionally, the load to be protected, including ballasts, lamps and motors, can be analyzed with the method and apparatus described herein. The model or models (e.g., for the source, load, protection system and distribution system) can be tied together to model a power system for analysis.

The modularity of the modeling method and apparatus employed herein makes it easy to expand to other circuit breakers. Since each sub-assembly model of a circuit breaker model can be built independently, the user can mix and match certain sub-assembly models to make a new design of a circuit breaker. Each individual sub-assembly model may become itself a piece that the user can integrate with other sub-assembly models. Likewise, each component model can be built independently, and the user can mix and match component models to make new subassembly models.

The models (system, circuit breaker, sub-assembly and component level) can be integrated within a comprehensive library such as model library 3009. This comprehensive model library 3009 can be used by any user to build specific circuit breakers. Each model has its own arguments and parameters that can be adjusted to user specifications or design needs.

This modeling approach employed also combines electrical, electronic, digital, logical, electromagnetic, magnetic, mechanical, thermal, fluid, and/or hydraulic aspects of the circuit breaker in a single model. By combining all of these features aspects, an overall response of the breaker can be created that mimics its overall behavior during short-circuit and/or overcurrent conditions. The overall model can easily be integrated within a higher level model, such as a selectivity model (e.g., representing a system such as selectivity system 41 described above), a switching panel or customer distribution system. Another approach is to use the modeling tools to generate transfer functions representing a particular circuit breaker model (e.g., trip time curves). The resultant transfer function is then employed to produce a system level model.

Also, the modeling approach employed can be used to optimize component selection within an individual circuit breaker. For example, various parameters and arguments for the logic within the electronic trip unit are easily modified. Additionally, mechanical variations within components such as the actuator, the rotor assembly, and the mechanism are readily modeled. Furthermore, selection of current transformers has been enhanced by applying the modeling approach described herein.

Figure 35:
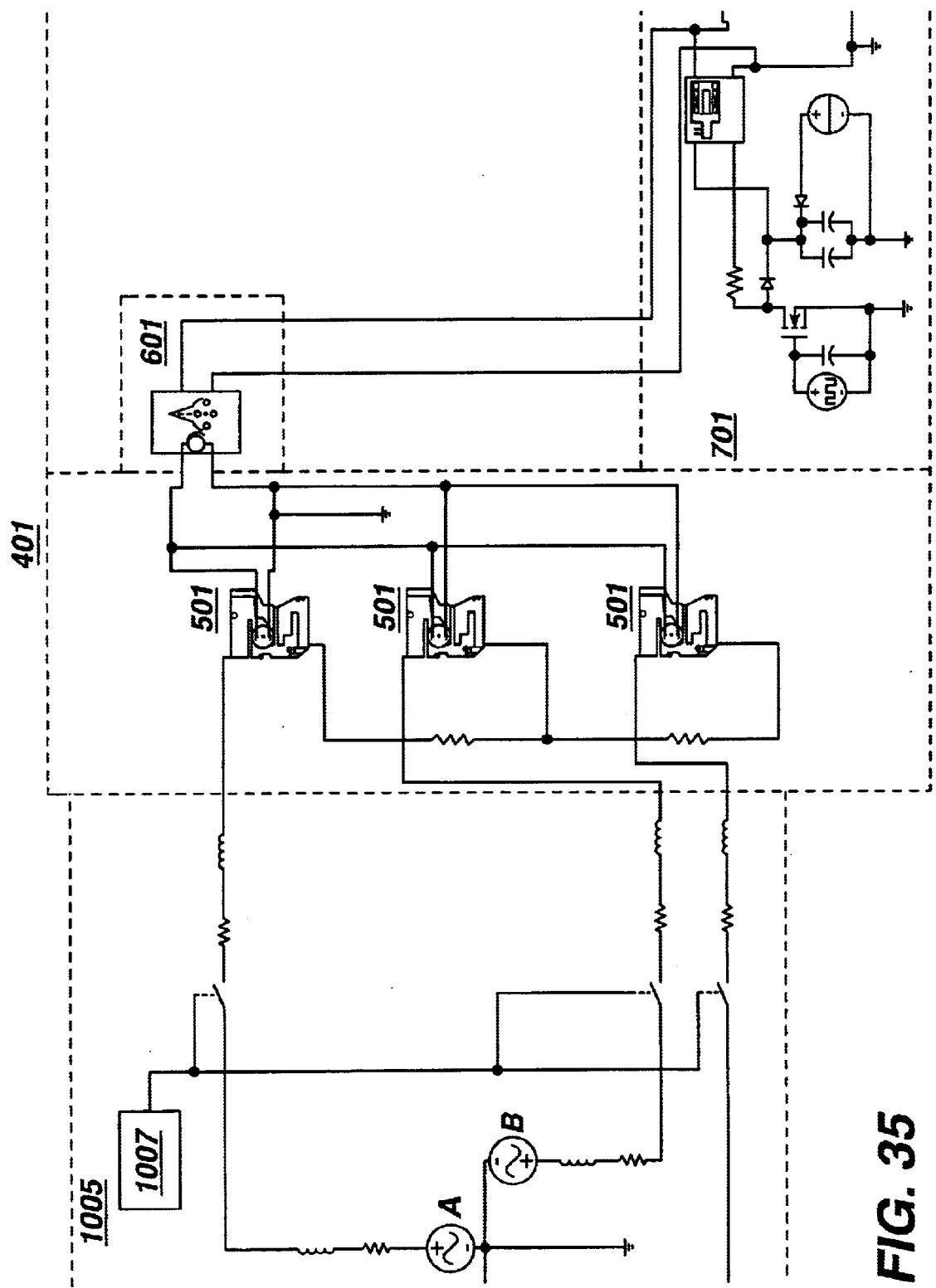
FIG. 35 is a schematic of a system of a three phase power source and three pole circuit breaker used within the analysis method and apparatus of the present invention.

Referring now to FIG. 35, a schematic of a system of a three phase power source and three pole circuit breaker used within the analysis method and apparatus of the present invention is shown. The system includes circuit breaker model 401 having three cassette models 501 (one for each phase), mechanism model 601 and trip unit model 701. As described above, models 501, 601 and 701 can be selected from any library 3001, 3003, 3005, 3007 or 3009, or can be generated when a system as in FIG. 35 is assembled. A source 1005 models the provision of three phases of power from VsineA, VsineB and VsineC. Each source has a corresponding resistance Rsa, Rsb and Rsc and a corresponding inductance Lsa, Lsb and Lsc. The resistances and inductances are determines as follows:

$$Rsa, Rsb, Rsc = ((Amplitude/sqrt(2))/(Ishort*1000)*pf;$$

and $$Lsa, Lsb, Lsc = ((Amplitude/sqrt(2))/ \\ (Ishort*1000*2*\pi*Frequency))*sqrt(1-pf^2),$$

where Amplitude, Ishort, pf and Frequency are as detailed in FIG. 33. A sequential switch driver 1007 is provided to lock on the appropriate closing angle (set as a parameter, for example, in a simulator such as that in FIG. 33) and simulate an appropriate voltage and current to circuit breaker model 401. When the closing angle is attained, a set of switch models CLS_A, CLS_B and CLS_C are closed allowing the simulated current to be fed to circuit breaker model 401. The cables between VsineA, VsineB and VsineC are accounted for with resistances Rac, Rbc and Rcc, and inductances Lac, Lbc and Lcc. The cable resistances and inductances are determines as follows:

$$Rac, Rbc, Rcc = racpft*1 \ cc*1e^{-3};$$

and $$Lac, Lbc, Lcc = xpft*1 \ cc*1e^{-3}/(2*\pi*Frequency),$$

where racpft is the cable resistance per 1000 feet, xpft is the cable reactance per 1000 feet and 1 cc is the cable length, as detailed in FIG. 33.

The circuit breaker resistance and inductance are assumed to be 20% of the cable resistance and inductance. These values are included in the cassette model.

Figure 36:
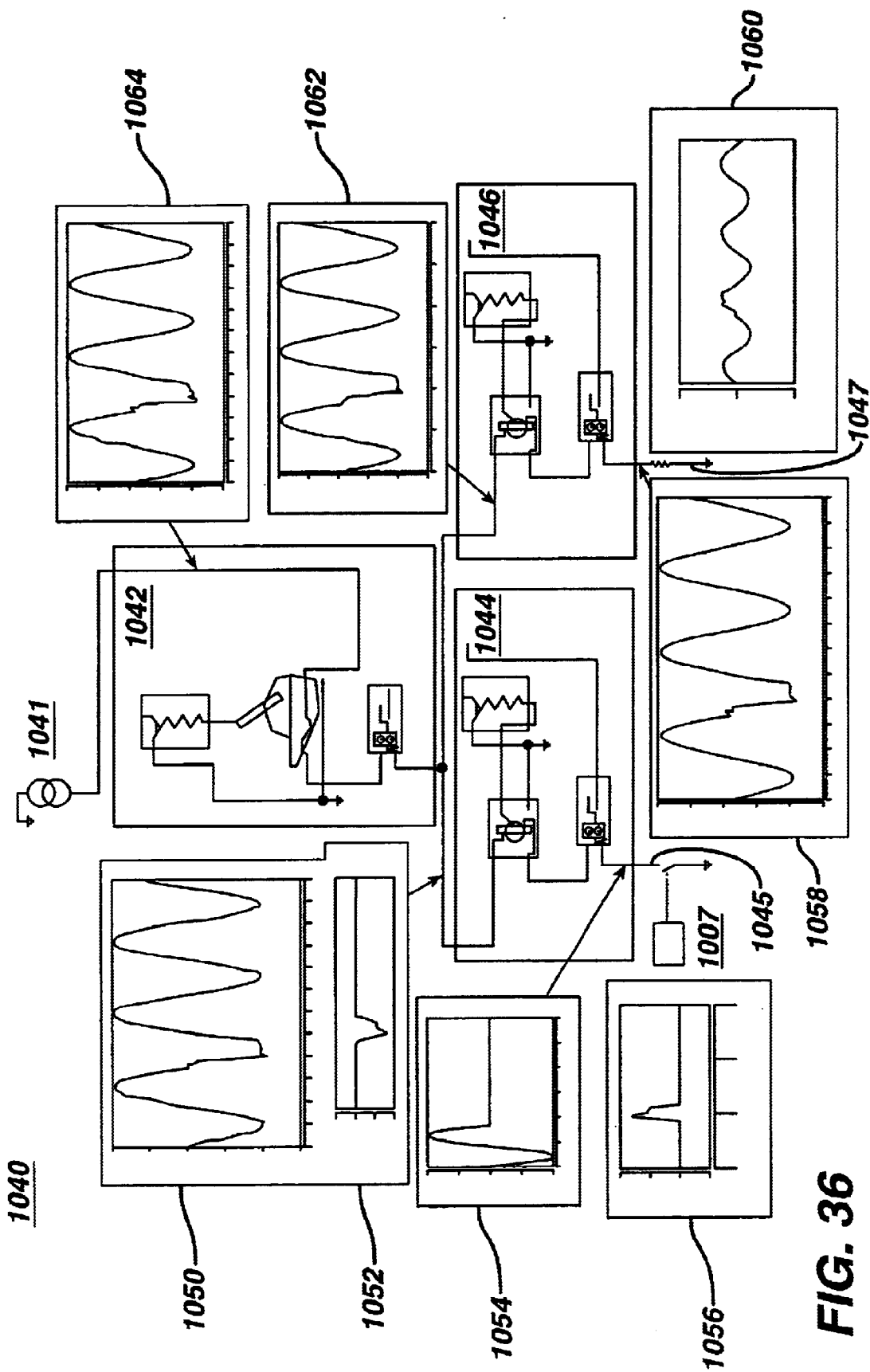
FIG. 36 is a dynamic response simulation of a system model.

Referring now to FIG. 36, a dynamic response simulation of a system model 1040 is provided. System model 1040 represents, for example, the two tier selective system described above with reference to FIG. 12. System model 1040 includes a source model 1041, an upstream device model 1042, a pair of downstream device models 1044 and 1046, and corresponding load models 1045 and 1047. Models 1042, 1044 and 1046 are generated and selected as described above. Upstream device model 1042 represents, for example, upstream device 42, and downstream device models 1044 and 1046 represent, for example, downstream devices 44 and 46, respectively. Load model 1045 is at the branch of system having the fault, and the simulated fault is provided at the desired closing angle with the assistance of sequential switch driver 1007. Therefore, load model 1045 is a switch for the present dynamic response simulation. Load model 1047 is represented as its equivalent resistance.

Power to the system is simulated with source 1041 tied to upstream device model 1042, the voltage between source 1041 and device model 1042 is represented by waveform 1064. The simulated fault is shown at waveform 1054 (voltage at the load side of device model 1044 ) and waveform 1056 (current through device model 1044). The current through device model 1042 is represented as a waveform 1052. The voltage after device model 1042 is represented as a waveform 1050. The voltage between device model 1042 and device model 1046 is represented in a waveform 1062. The voltage across load 1047 is represented in waveform 1058, and the current through device model 1046 is represented in waveform 1060.

Each of the waveforms represented in FIG. 36 are plotted over the same period of time (e.g., between t=0 and t=0.06 seconds). During the time of the fault (e.g., less than 0.005 seconds), each waveform is effected as shown. Using the analysis method and apparatus described herein, these waveforms are determined.

The present invention can be embodied in the form of computer-implemented processes and apparatuses for practicing those processes. The present invention can also be embodied in the form of computer program code containing instructions, embodied in tangible media, such as floppy diskettes, CD-ROMs, hard drives, or any other computer-readable storage medium, wherein, when the computer program code loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When the implementation is on a general-purpose microprocessor, the computer program code segments configure the microprocessor to create specific logic circuits.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A software system for analyzing an electrical system comprising:
  a solver system for generating an output from an input presented to said solver system, said input being a mathematical representation of at least a portion of said electrical system, said input presented to a model within said solver system, said model being a mathematical representation of at least a portion of said electrical system configured to substantially mimic behavior of at least one of a short-circuit and an overcurrent condition, wherein said electrical system is an electrical distribution system employing a plurality of overcurrent protection devices.

2. The software system as in claim 1, further comprising a first model being a mathematical representation of at least a portion of a circuit interruption device within said electrical system, said input presented to said first model, wherein said first model generates said output comprising a first output.

3. The software system as in claim 2, wherein said input is presented by an interface with a user.

4. The software system as in claim 2, wherein said input is presented by an interface with a simulator system.

5. The software system as in claim 4, wherein said input comprises a simulated power feed.

6. The software system as in claim 5, wherein said input further comprises a simulated fault in said simulated power feed.

7. The software system as in claim 6, wherein said simulator system generates said simulated fault at user defined parameters.

8. The software system as in claim 7, wherein said user defined parameters are selected from the group consisting of closing angle, power factor, peak voltage and maximum current.

9. The software system as in claim 8, said input being a simulated current over a simulated period of time.

10. The software system as in claim 9, wherein at least a portion of said output comprises a simulated load-side current over said simulated period of time.

11. The software system as in claim 2, further comprising:
  a database containing said first model.

12. The software system as in claim 11, further comprising:
  an assembler system for selecting said first model.

13. The software system as in claim 2, further comprising:
  an editor for generating said first model.

14. The software system as in claim 13, further comprising:
  a database for storing said first model.

15. The software system as in claim 14, further comprising:
  an assembler system for selecting said first model.

16. The software system as in claim 2, further comprising a second model being a mathematical representation of at least a portion of a circuit interruption device within said electrical system, wherein said second model receives said input, said first output, or both said input and said first output.

17. The software system as in claim 16, wherein said second model and said first model interact.

18. The software system as in claim 16, further comprising:
  a database containing said first model and said second model.

19. The software system as in claim 18, further comprising:
  an assembler system for selecting said first model and said second model.

20. The software system as in claim 19, further comprising:
  an editor for generating said first model, said second model, or both said first model and said second model.

21. The software system as in claim 20, further comprising:
  a database for storing said first model, said second model, or both said first model and said second model.

22. The software system as in claim 21, further comprising:
  an assembler system for selecting said first model, said second model, or both said first model and said second model.

23. The software system as in claim 19, wherein said second model is a portion of said first model.

24. The software system as in claim 19, wherein said input is presented by an interface with a user.

25. The software system as in claim 19, wherein said input is presented by an interface with a simulator system.

26. The software system as in claim 25, wherein said input comprises a simulated power feed.

27. The software system as in claim 26, wherein said input further comprises a simulated fault is said simulated power feed.

28. The software system as in claim 27, wherein said simulator system generates said simulated fault at user defined parameters.

29. The software system as in claim 27, wherein said user defined parameters are selected from the group consisting of closing angle, power factor, peak voltage and maximum current.

30. The software system as in claim 1, further comprising:
a first model being a mathematical representation of at least a portion of a first circuit interruption device within said electrical system; and
a second model being a mathematical representation of at least a portion of a second circuit interruption device within said electrical system,
wherein said input is presented to said first model and said second model.

31. The software system as in claim 30, wherein said solver system generates a first output from said input provided to a first model and a second output from said input provided to a second model.

32. The software system as in claim 31, wherein said solver generates said first output from said input and said second output provided to said first model.

33. The software system as in claim 31, wherein said solver generates said second output from said input and said first output provided to said second model.

34. The software system as in claim 1, further comprising a simulator for generating said input.

35. The software system as in claim 1, further comprising:
a first model being a mathematical representation of at least a portion of an upstream circuit interruption device within said electrical system; and
a second model being a mathematical representation of at least a portion of a downstream circuit interruption device within said electrical system,
said input being presented to said first model and said second model such that said solver system generates a first output from said input provided to said first model and a second output from said input provided to said second model,
wherein said solver generates said first output from said input and said second output provided to said first model and said second output from said input and said first output provided to said second model.

36. The software system as in claim 1, further comprising:
a first model being a mathematical representation of at least a portion a source within said electrical system, wherein said input is a representation of said source being activated;
a second model being a mathematical representation of at least a portion of a first circuit interruption device within said electrical system; and
a third model being a mathematical representation of at least a portion of a first load connected to said source via said first circuit interruption device within said electrical system.

37. The software system as in claim 36, further comprising:
a fourth model being a mathematical representation of at least a portion of a second circuit interruption device within said electrical system; and
a first model being a mathematical representation of at least a portion of a second load connected to said source via said second circuit interruption device within said electrical system.

38. A method of analyzing an electrical system comprising:
generating an output from an input presented to one or more models, said models being mathematical representations of at least a portion of said electrical system configured to substantially mimic behavior of at least one of a short-circuit and an overcurrent condition, said input is a mathematical representation of at least a portion of said electrical system, wherein said electrical system is an electrical distribution system employing a plurality of overcurrent protection devices.

39. The method of analyzing as in claim 38, said models including a first model being a mathematical representation of at least a portion a first circuit interruption device within said electrical system, and a second model being a mathematical representation of at least a portion a second circuit interruption device within said electrical system, said output being a first output corresponding with said first model and a second output corresponding to said second model.

40. The method of analyzing as in claim 39, wherein said second output is presented to said first model, said first output is generated from said input and said second output is presented to said first model.

41. The method of analyzing as in claim 39, wherein said first output is presented to said second model, said second output is generated from said input and said second output is presented to said second model.

42. An article of manufacture comprising:
a computer usable medium having computer readable program code means embodied therein for analyzing an electrical system, the computer readable program code means in said article of manufacture further including;
computer readable program code means for generating an output from an input, said input being a mathematical representation of at least a portion of an electrical system; and
computer readable program code means for presenting said input to one or more models to generate said output, said model being a mathematical representation of at least a portion of said electrical system configured to substantially mimic behavior of at least one of a short-circuit and an overcurrent condition, wherein said electrical system is an electrical distribution system employing a plurality of overcurrent protection devices.

43. The article of manufacture as in claim 42, wherein said model is a mathematical representation of at least a portion of a circuit interruption device within said electrical system.

44. The article of manufacture as in claim 43, further comprising:
computer readable program code means for generating said input presented to said model.

45. The article of manufacture as in claim 44, wherein said computer readable program code means for generating said input is a simulator.

46. A computer program product comprising:
a computer usable medium having computer readable program code means embodied therein for analyzing an electrical system, said computer program product having:
computer readable program code means for generating an output from an input, said input being a mathematical representation of at least a portion of said electrical system;
computer readable program code means for presenting said input to one or more models to generate said output, said model being a mathematical representation of at least a portion of a circuit interruption device within said electrical system configured to substantially mimic behavior of at least one of a short-circuit and an overcurrent condition;

computer readable program code means for generating said at least one input presented to said model, wherein said electrical system is an electrical distribution system employing a plurality of protection devices.

47. A program storage device readable by a machine, tangibly embodying a program of instructions executable by the machine to perform method steps for analyzing an electrical system, said method steps comprising:

generating an output from an input presented to one or more models, said models being mathematical representations of at least a portion of said electrical system, said input being a mathematical representation of at least a portion of said electrical system, said models including a first model being a mathematical representation of at least a portion of a first circuit interruption device within said electrical system, and a second model being a mathematical representation of at least a portion a second circuit interruption device within said electrical system, said models configured to substantially mimic behavior of at least one of a short-circuit and an overcurrent condition, said output being a first output corresponding with said first model and a second output corresponding to said second model, wherein said electrical system is an electrical distribution system employing a plurality of overcurrent protection devices.

* * * * *